United States Patent
Kimura et al.

(10) Patent No.: US 9,471,740 B2
(45) Date of Patent: Oct. 18, 2016

(54) SUPPORT APPARATUS AND DESIGN SUPPORT METHOD

(71) Applicant: FUJITSU LIMITED, Kawasaki-shi, Kanagawa (JP)

(72) Inventors: Yusuke Kimura, Kawasaki (JP); Tomo Kaniwa, Kawasaki (JP); Eiichi Konno, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/615,465

(22) Filed: Feb. 6, 2015

(65) Prior Publication Data

US 2015/0294059 A1    Oct. 15, 2015

(30) Foreign Application Priority Data

Apr. 10, 2014 (JP) .................................. 2014-081359

(51) Int. Cl.
*G06F 17/50* (2006.01)

(52) U.S. Cl.
CPC ....... *G06F 17/5077* (2013.01); *G06F 17/5081* (2013.01)

(58) Field of Classification Search
USPC .................................................. 716/122, 139
See application file for complete search history.

(56) References Cited

U.S. PATENT DOCUMENTS

| | | | | |
|---|---|---|---|---|
| 2005/0235243 A1* | 10/2005 | Hachiya | ............. | G06F 17/5077 716/126 |
| 2008/0301617 A1* | 12/2008 | Hamazaki | ......... | H01L 23/49838 716/126 |
| 2009/0019404 A1* | 1/2009 | Sadakane | ............ | G06F 17/5077 716/103 |
| 2009/0125862 A1* | 5/2009 | Nishio | ................ | G06F 17/5077 716/137 |
| 2010/0235804 A1 | 9/2010 | Ohtsuka et al. | | |
| 2011/0231810 A1 | 9/2011 | Tanisho et al. | | |

FOREIGN PATENT DOCUMENTS

| | | |
|---|---|---|
| JP | 2005-267302 | 9/2005 |
| JP | 2010-211753 | 9/2010 |
| JP | 2011-198143 | 10/2011 |

\* cited by examiner

*Primary Examiner* — Brian Ngo
(74) *Attorney, Agent, or Firm* — Fujitsu Patent Center

(57) ABSTRACT

A non-transitory computer-readable recording medium having stored therein a program for causing a computer to execute a process is provided. The process includes calculating and outputting difficulty degrees on an index basis when a change instruction to change an arrangement of parts is received with respect to parts and wirings on a substrate in a design diagram, the difficulty degrees being related to the wiring between the parts after the change according to the change instruction; and calculating and outputting difficulty degrees on an index basis when a change instruction to change the wiring between the parts is received, the difficulty degrees being related to the wiring between the parts after the change according to the change instruction.

13 Claims, 57 Drawing Sheets

FIG.7

| WIRING DIFFICULTY DEGREE | ・INITIAL WIRING DIFFICULTY DEGREE<br>・CHANGED WIRING DIFFICULTY DEGREE<br>・CALCULATION RESULT OF WIRING DIFFICULTY DEGREE CALCULATION PROCESS PART<br>・UNWIRED WIRING SECTION ENLARGEMENT NUMBER |
|---|---|

FIG.8

| INDEX | USAGE | |
|---|---|---|
| | ARRANGEMENT DESIGNING | WIRING DESIGNING |
| WIRING DISTANCE | ・WIRING DIFFICULTY DEGREE CALCULATION | — |
| CONSTRAINT | ・DETERMINATION WHETHER WIRING IS POSSIBLE OR NOT<br>・WIRING DIFFICULTY DEGREE CALCULATION | — |
| WIRING TWIST | ・WIRING DIFFICULTY DEGREE CALCULATION | — |
| ROUTE KEEPING | ・DETERMINATION WHETHER WIRING IS POSSIBLE OR NOT<br>・WIRING DIFFICULTY DEGREE CALCULATION | ・DETERMINATION WHETHER WIRING IS POSSIBLE OR NOT<br>・WIRING DIFFICULTY DEGREE CALCULATION |

FIG.9
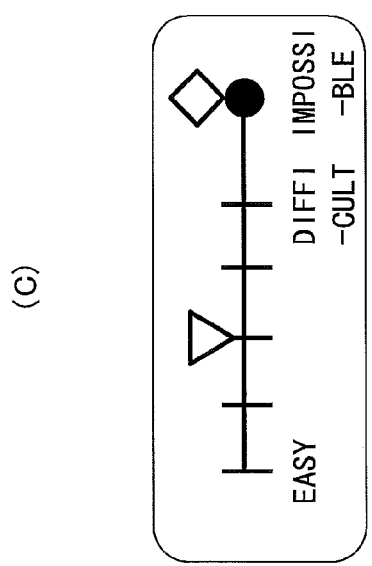
(A)
INITIAL WIRING DIFFICULTY DEGREE
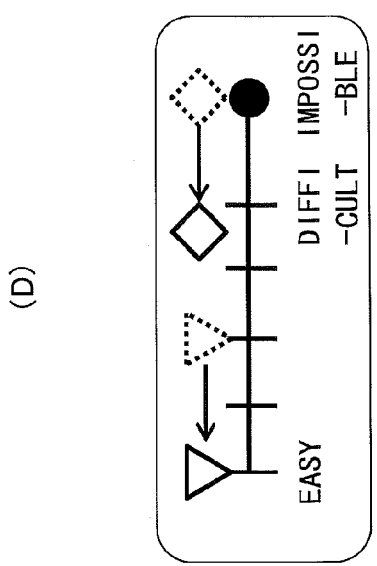
(C)
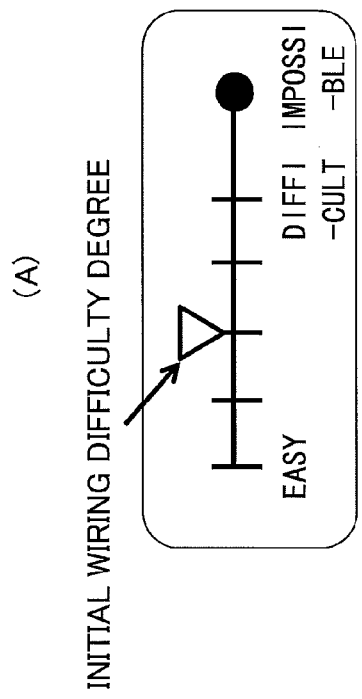
(B)
CHANGED WIRING DIFFICULTY DEGREE
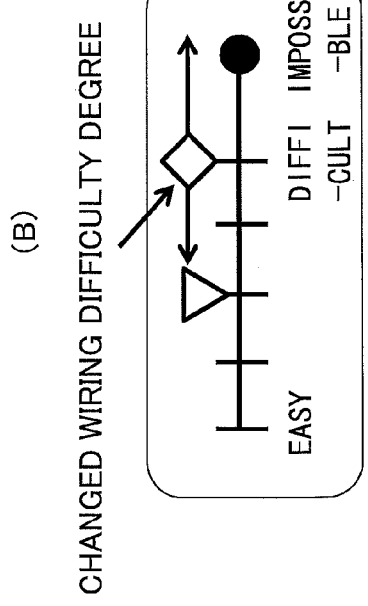
(D)

FIG.11

| TOTAL WIRING DIFFICULTY DEGREE POINT | COLOR |
|---|---|
| 0 ~ 30 | BLUE |
| 31 ~ 70 | YELLOW |
| 71 ~ 100 | RED |
| IMPOSSIBLE | BLACK |

FIG.12

| DIFFICULTY DEGREE LEVEL RELATED TO WIRING DISTANCE | DIFFICULTY DEGREE REFERENCE |
|---|---|
| 0 | $D \leq d1$ |
| 1 | $d1 < D \leq d2$ |
| 2 | $D2 < D$ |

FIG.13

| DIFFICULTY DEGREE LEVEL RELATED TO CONSTRAINT | DIFFICULTY DEGREE REFERENCE |
|---|---|
| 0 | $d3 \leq D \leq d4$ |
| 1 | D>90% OF d3 |
| 2 | D>80% OF d3 |
| IMPOSSIBLE | D>d4 |

FIG.14

| DIFFICULTY DEGREE LEVEL RELATED TO WIRING TWIST | DIFFICULTY DEGREE REFERENCE |
|---|---|
| 0 | NO INTERCHANGE |
| 1 | NUMBER OF INTERCHANGES≦60% OF TOTAL WIRING TWIST NUMBER |
| 2 | NUMBER OF INTERCHANGES>60% OF TOTAL WIRING TWIST NUMBER |

FIG.15

| DIFFICULTY DEGREE LEVEL RELATED TO ROUTE KEEPING | DIFFICULTY DEGREE REFERENCE |
|---|---|
| 0 | UNWIRED SECTION ENLARGEMENT WIRING NUMBER<3 |
| 1 | 2<UNWIRED SECTION ENLARGEMENT WIRING NUMBER≦5 |
| 2 | 5<UNWIRED SECTION ENLARGEMENT WIRING NUMBER≦10 |
| IMPOSSIBLE | 10<UNWIRED SECTION ENLARGEMENT WIRING NUMBER |

FIG.16

| WIRING DIFFICULTY DEGREE | LEVEL WIDTH |
|---|---|
| WIRING DISTANCE | 0 ~ 2 |
| WIRING TWIST | 0 ~ 2 |
| CONSTRAINT | 0 ~ 2, IMPOSSIBLE |
| ROUTE KEEPING | 0 ~ 2, IMPOSSIBLE |

FIG.55
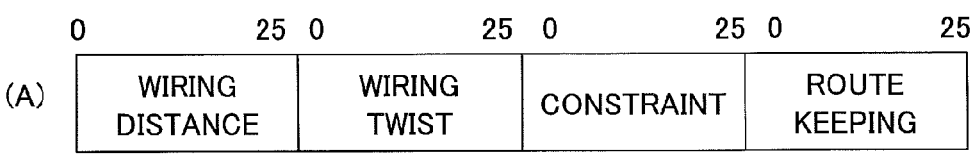
(A)
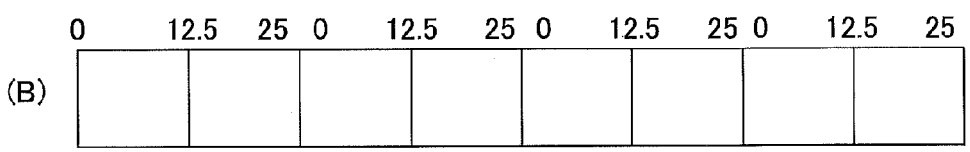
(B)
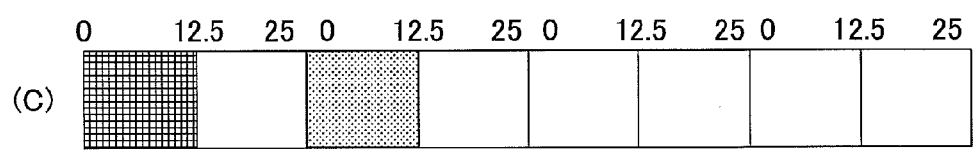
(C)
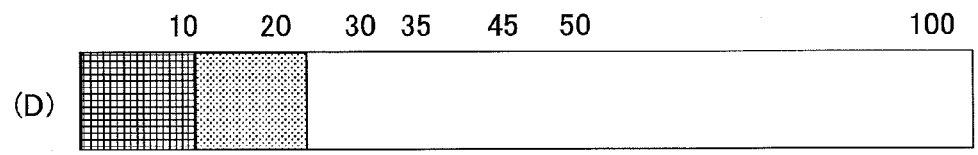
(D)

FIG.58

| SEPARATE WIRING DIFFICULTY DEGREE POINT | COLOR |
|---|---|
| 0 ~ 12.4 | BLUE |
| 12.5 ~ 24.9 | YELLOW |
| 25 ~ | RED |
| IMPOSSIBLE | ● BLACK |

SUPPORT APPARATUS AND DESIGN SUPPORT METHOD

CROSS-REFERENCE TO RELATED APPLICATIONS

This present application is based upon and claims the benefit of priority of the prior Japanese Patent Application No. 2014-081359, filed on Apr. 10, 2014, the entire contents of which are incorporated herein by reference.

FIELD

The disclosure is related to a non-transitory computer-readable recording medium, a design support method and a design support apparatus.

BACKGROUND

Japanese Laid-open Patent Publication No. 2011-198143 (referred to as "Patent Document 1", hereinafter) discloses a design support program that carries out wiring verification for a tentative wiring area, and if there is an unwired net determined as a result of the wiring verification, the tentative wiring area is enlarged to set a new tentative wiring area.

Japanese Laid-open Patent Publication No. 2010-211753 (referred to as "Patent Document 2", hereinafter) discloses a support method that defines for at least each pin of an integrated circuit package, between horizontal pins, between vertical pins, and between diagonal pins, wiring bottleneck places to give a wiring capacity to each of the bottleneck places. The method disclosed in Patent Document 2 generates two nodes, which are an entrance node and an exit node, for each bottleneck place, and generates directed branches from the entrance node to the exit node in the respective bottleneck places, etc.

However, according to the configuration disclosed in Patent Document 1, there is a problem that a designer cannot obtain quantitative information about how a change in a part arrangement design or a wiring design on a substrate affects wirings around the changed portion if the change is performed. This also holds true for the configuration disclosed in Patent Document 2.

SUMMARY

According to one aspect of the disclosure, a non-transitory computer-readable recording medium having stored therein a program for causing a computer to execute a process is provided, the process comprising:
calculating and outputting difficulty degrees on an index basis when a change instruction to change an arrangement of parts is received with respect to parts and wirings on a substrate in a design diagram, the difficulty degrees being related to the wiring between the parts after the change according to the change instruction; and
calculating and outputting difficulty degrees on an index basis when a change instruction to change the wiring between the parts is received, the difficulty degrees being related to the wiring between the parts after the change according to the change instruction.

The object and advantages of the embodiment will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIG. 7 is a diagram illustrating an example of data construction of a wiring difficulty degree.

FIG. 8 is a table illustrating indexes of the wiring difficulty degree.

FIG. 9 is a diagram illustrating models of the wiring difficulty degree.

FIG. 11 is a diagram illustrating an example of total wiring difficulty degree level widths.

FIG. 12 is a diagram illustrating an example of a difficulty degree level related to a wiring length.

FIG. 13 is a diagram illustrating an example of a difficulty degree level related to constraints.

FIG. 14 is a diagram illustrating an example of a difficulty degree level related to a wiring twist.

FIG. 15 is a diagram illustrating an example of a difficulty degree level related to route keeping.

FIG. 16 is a diagram illustrating an example of a level width of a wiring difficulty degree.

FIG. 55 is a diagram for explaining an example of a way of managing the wiring difficulty degrees.

FIG. 58 is a diagram illustrating an example of a separate wiring difficulty degree level width.

DESCRIPTION OF EMBODIMENTS

In the following, embodiments will be described with reference to the accompanying drawings.

Figure 1:
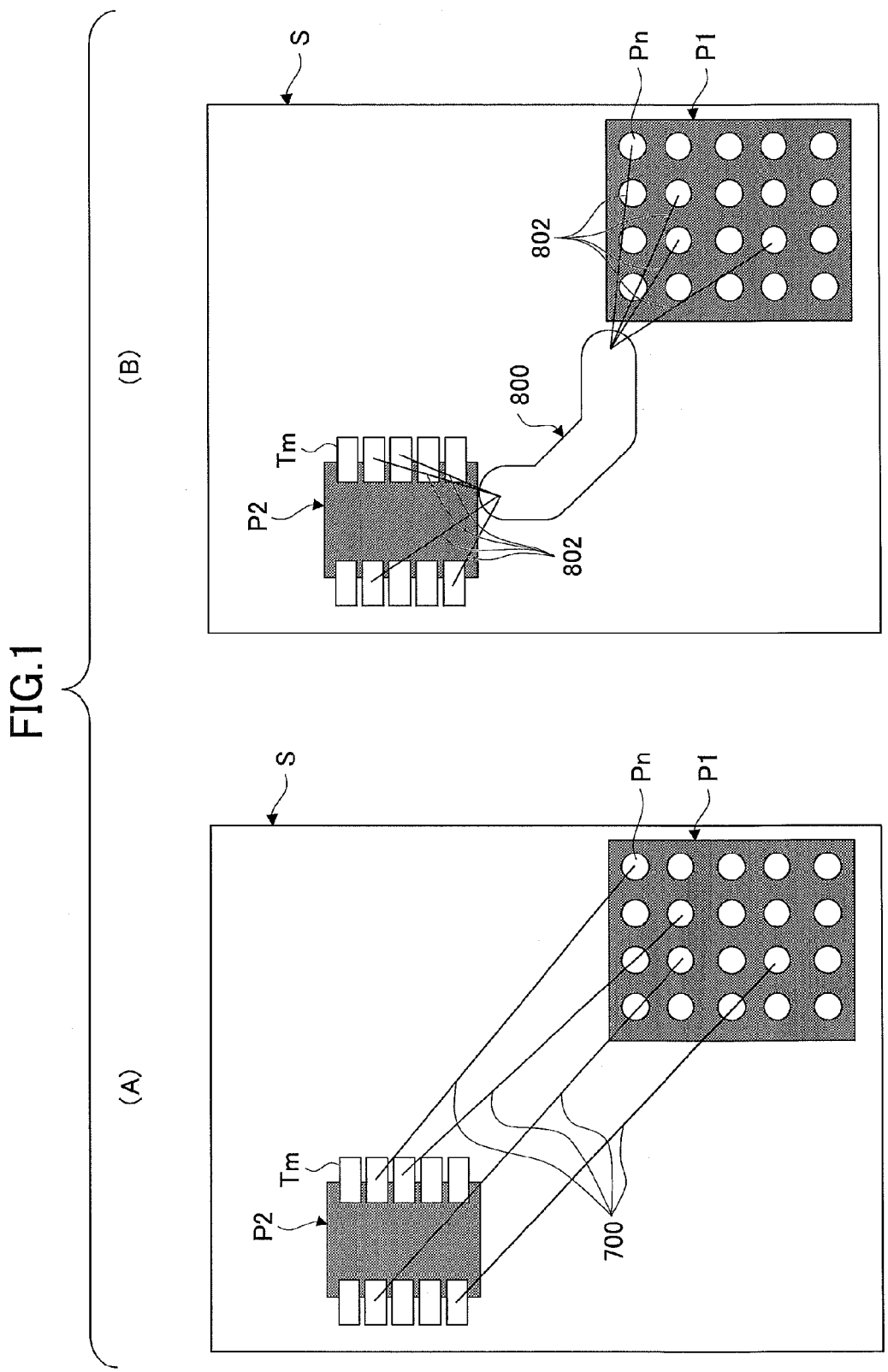
FIG. 1 is a diagram illustrating an example of a ratsnest and a bus global route.

FIG. 1 is a diagram illustrating an example of a ratsnest and a bus global route, in which (A) illustrates an example of the ratsnest and (B) illustrates an example of a bus global route.

A layout designing of a print board is performed by repeating two types of works mainly. A first type of the work is arranging a part. A second type of the work is designing a wiring between terminals of parts. There are two types of supplemental functions for the layout designing in general. A first type of the function is displaying a wiring supplemental line that represents a connection (section in which the wiring designing is required) between the terminals of the parts. The wiring supplemental line is called as "a ratsnest". A second type of the function is displaying a bus global route (also called as "a bus route wiring") that collectively manages the ratsnests. The bus global route includes signal information and wiring route information.

As illustrated in FIG. 1 (A), ratsnests 700 are formed by lines connecting between two parts P1 and P2 on a substrate S. The ratsnests 700 are formed between terminals Pn of the part P1 and terminals Tm of the part P2 that are to be connected.

As illustrated in FIG. 1 (B), a bus global route 800 represents a group that organizes the ratsnests 700. The bus global route 800 is generated (set) when a designer instructs the ratsnests 700 to be organized. The bus global route 800 is formed for the group of the ratsnests 700 between the two parts P1 and P2, as illustrated in FIG. 1 (B). The bus global route 800 may include lines 802 at the opposite ends thereof, as illustrated in FIG. 1 (B). The lines 802 are formed from the respective ends of the bus global route 800 to the corresponding terminals Pn and Tm of the parts P1 and P2 that are to be connected.

Figure 2:
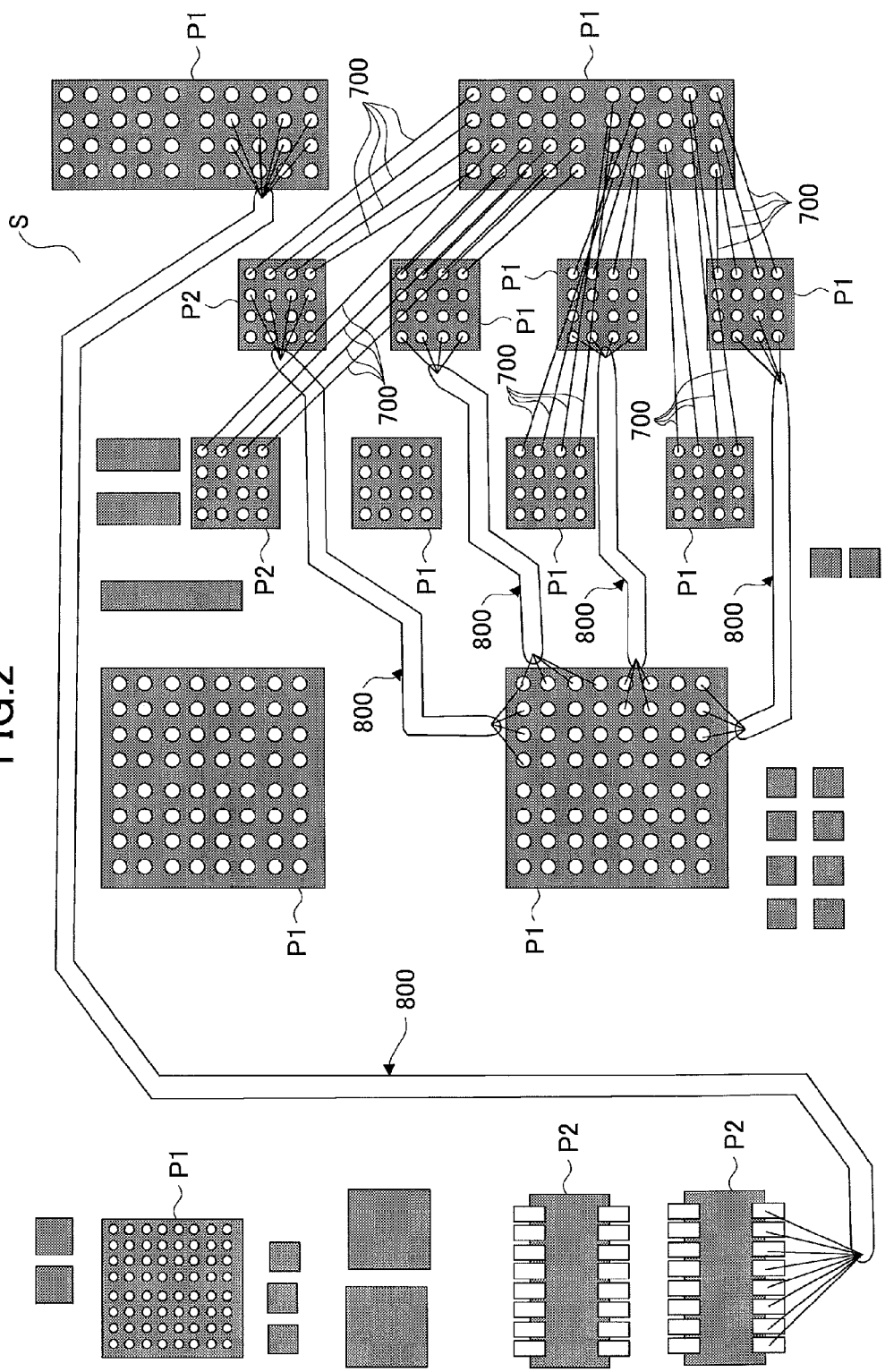
FIG. 2 is a diagram illustrating more ratsnests and bus global routes.

The designer performs layout designing using the two supplemental functions while confirming a number of wirings, a crowding level and wiring routes. FIG. 2 is a diagram illustrating more ratsnests and bus global routes. It is noted that, in FIG. 2, an outline of the substrate S is not illustrated. According to actual designing, as illustrated in FIG. 2, there are many parts P1, P2, etc., arranged on the substrate S, and thus more ratsnests 700 and bus global routes 800 are displayed accordingly.

Figure 3:
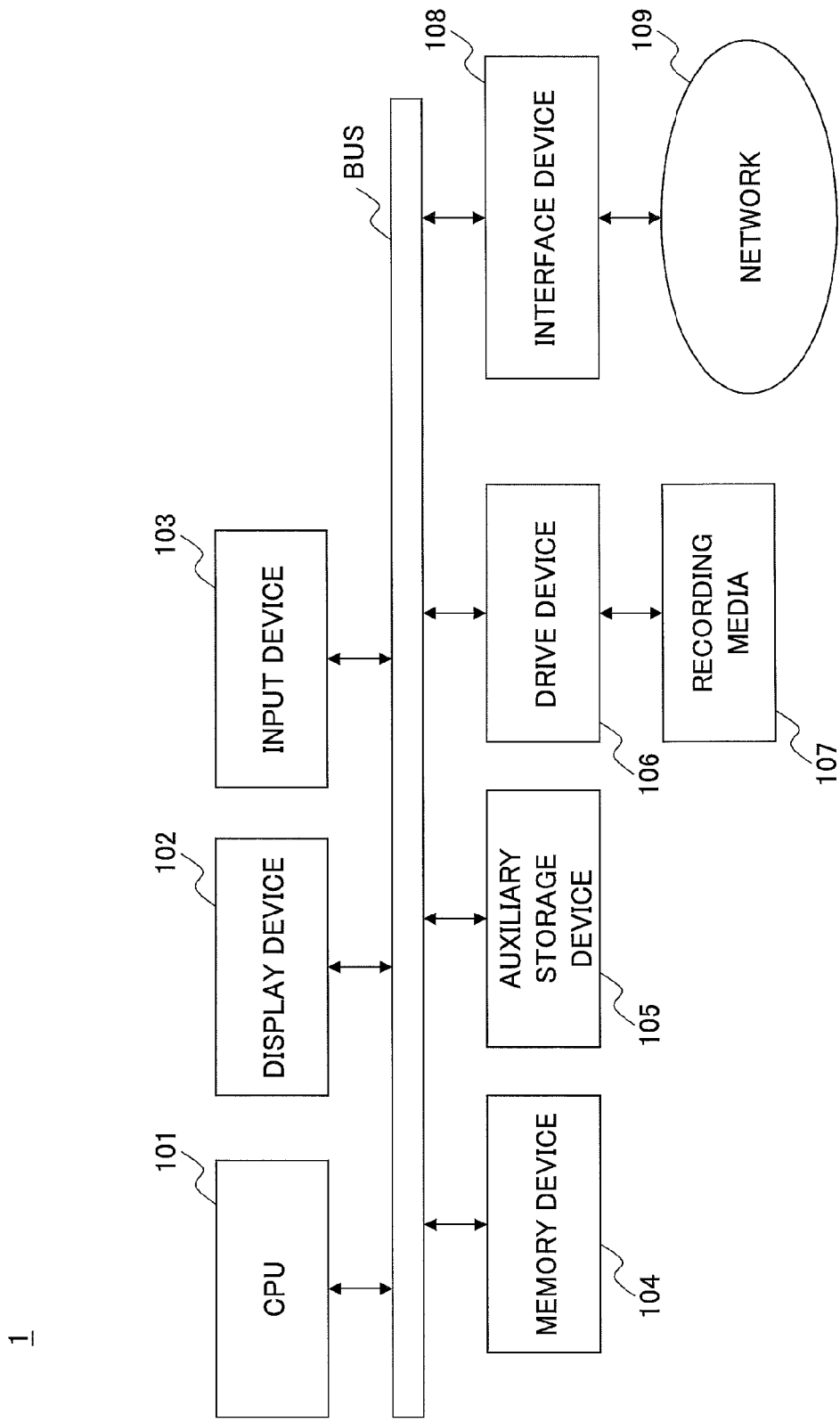
FIG. 3 is a diagram illustrating an example of a hardware configuration of a design support apparatus.

FIG. 3 is a diagram illustrating an example of a hardware configuration of a design support apparatus 1. The design support apparatus 1 includes a processor. For example, the design support apparatus 1 includes a CPU (Central Processing Unit) 101, a memory device 104, a display device 102, an auxiliary storage device 105, an input device 103, and a drive device 106 that are connected to each other via buses. Further, the design support apparatus 1 includes recording media 107 and an interface device 108. Programs that implement processes described hereinafter may be downloaded via a network 109, or supplied by the recording media 107 such as a CD-ROM, etc. The programs are executable when they are installed in the auxiliary storage device 105 after they are stored in the recording media 107. The auxiliary storage device 105 has a function of storing various items of data required by the programs when the programs are executed. The memory device 104 has a function of storing the program when the instruction to launch the program is provided from the input device 103. The CPU 101 executes the stored programs. The interface device 108 is utilized for a network connection. The display device 102 is such as a CRT (Cathode-Ray Tube) display, a liquid crystal display, etc. The input device 103 is formed by a keyboard, a mouse, etc., for inputs to the programs, etc.

Figure 4:
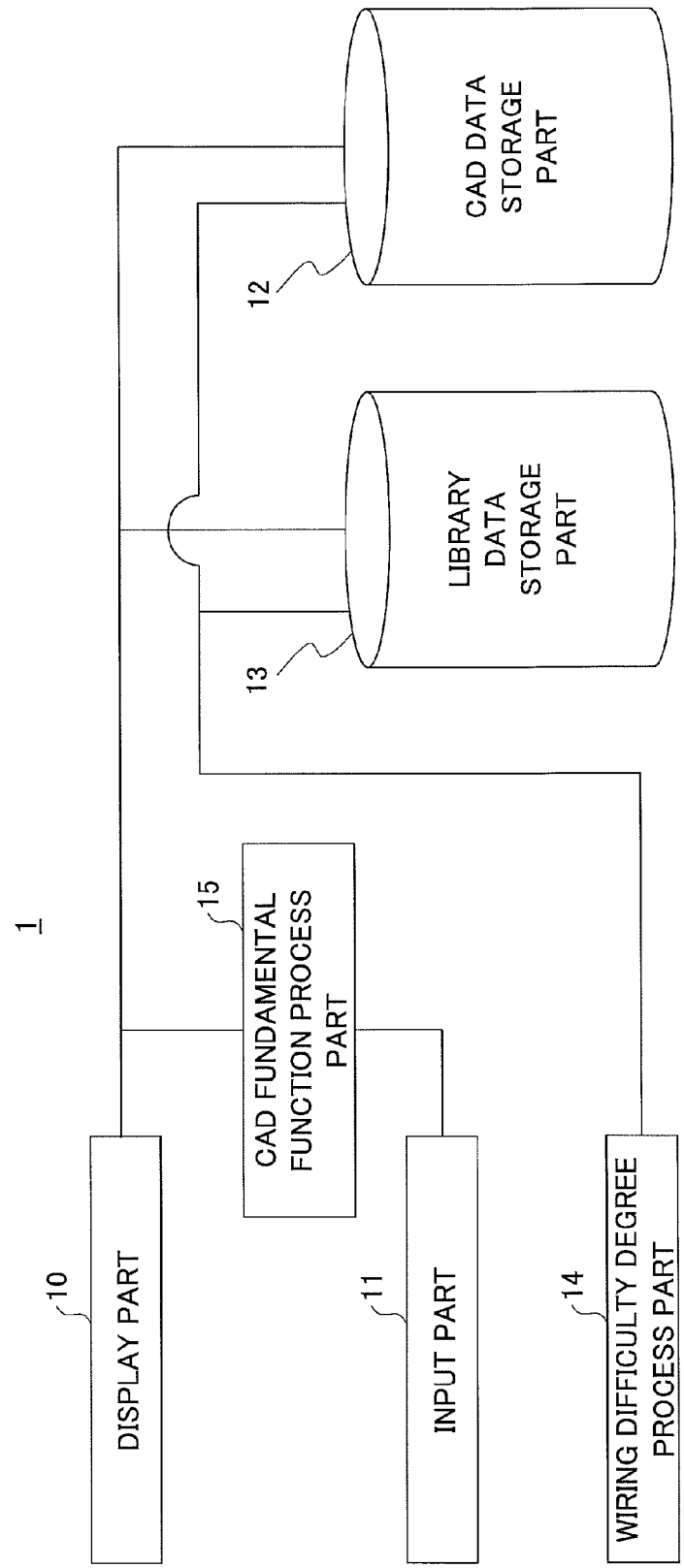
FIG. 4 is a diagram illustrating an example of a functional configuration of a design support apparatus.

FIG. 4 is a diagram illustrating an example of a hardware configuration of the design support apparatus 1.

The design support apparatus 1 includes a display part 10, an input part 11, a wiring difficulty degree process part 14, a library data storage part 13, a CAD (Computer-Aided Design) data storage part 12, and a CAD fundamental function process part 15. The display part 10 displays diagrams, wiring difficulty degrees, etc., during the designing. The input part processes the instructions, etc., for the programs input by the designer via the input device 103. The wiring difficulty degree process part 14 performs a wiring difficulty degree process in calculating the wiring difficulty degrees. The library data storage part 13 stores library data in libraries. The CAD data storage part 12 stores CAD data required for the CAD designing. The CAD fundamental function process part 15 performs a process for reflecting the instruction of the layout design input from the input part on the drive device 12. Functions of the process parts and the storage parts are described hereinafter.

Figure 5:
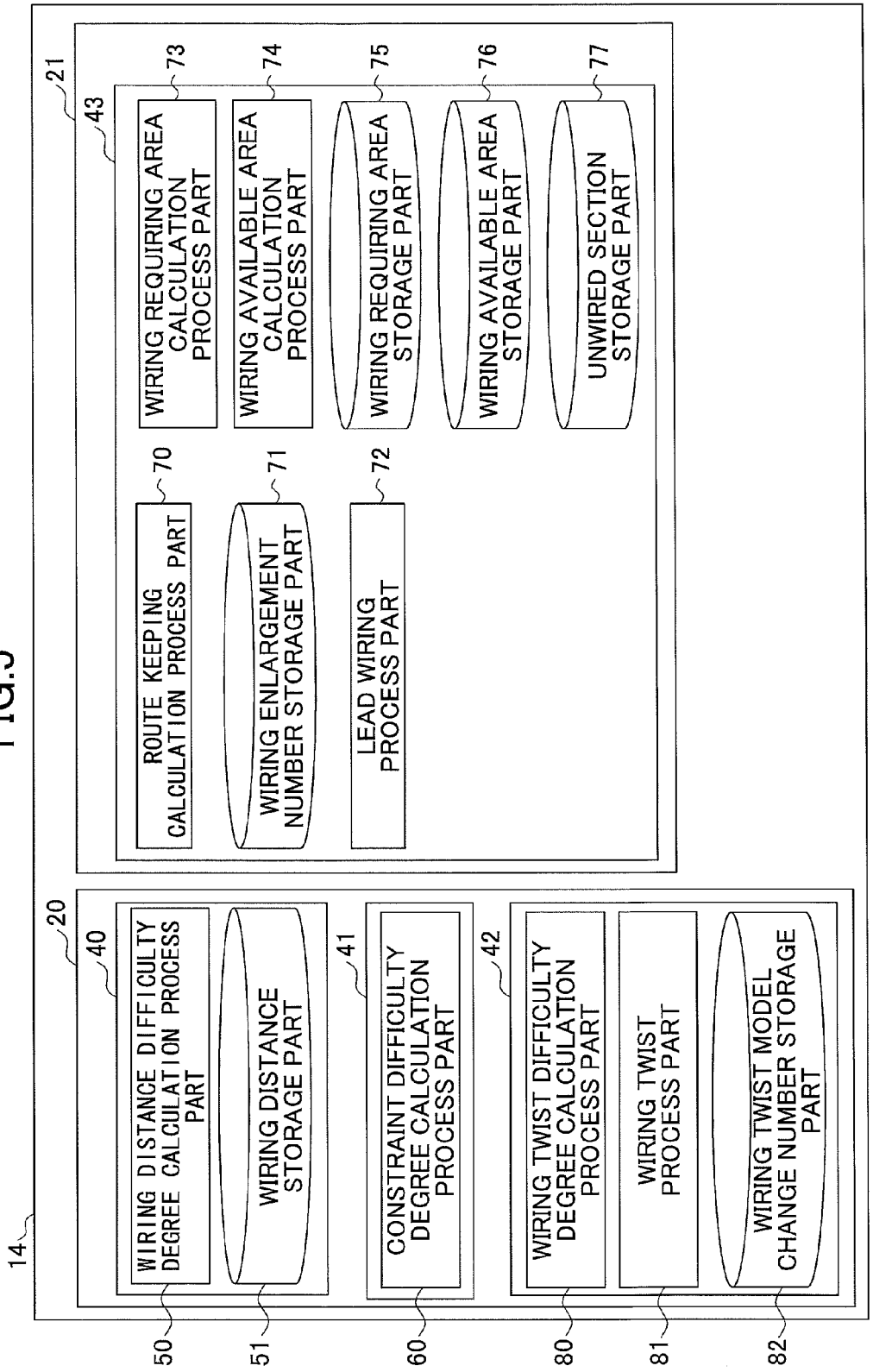
FIG. 5 is a diagram illustrating an example of a functional configuration of a wiring difficulty process part.

FIG. 5 is a diagram illustrating an example of a functional configuration of the wiring difficulty degree process part 14 The wiring difficulty degree process part 14 includes an initial difficulty degree calculation process part 20 and a changed difficulty degree calculation process part 21.

The initial difficulty degree calculation process part 20 includes a wiring distance difficulty degree process part 40, a constraint difficulty degree process part 41, and a wiring twist difficulty degree process part 42.

The wiring distance difficulty degree process part 40 includes a wiring distance difficulty degree calculation process part 50 and a wiring distance storage part 51. The wiring distance storage part 51 stores a wiring distance calculated by the wiring distance difficulty degree calculation process part 50.

The constraint difficulty degree process part 41 includes a constraint difficulty degree calculation process part 60.

The wiring twist difficulty degree process part 42 includes a wiring twist difficulty degree calculation process part 80, a wiring twist process part 81, and a wiring twist model change number storage part 82.

The changed difficulty degree calculation process part 21 includes a route keeping difficulty degree process part 43.

The route keeping difficulty degree process part 43 includes a route keeping calculation process part 70, a wiring enlargement number storage part 71, a lead wiring process part 72, a wiring requiring area calculation process part 73, a wiring available area calculation process part 74, and a wiring requiring area storage part 75. Further, the route keeping difficulty degree process part 43 includes a wiring available area storage part 76 and a unwired section storage part 77. The respective process parts are implemented when the programs installed in the auxiliary storage device 105 illustrated in FIG. 4 are executed by the CPU 101. The respective part includes buffer areas for temporarily storing variants and data used for the processes. Functions of the process parts and the storage parts are described hereinafter.

Figure 6:
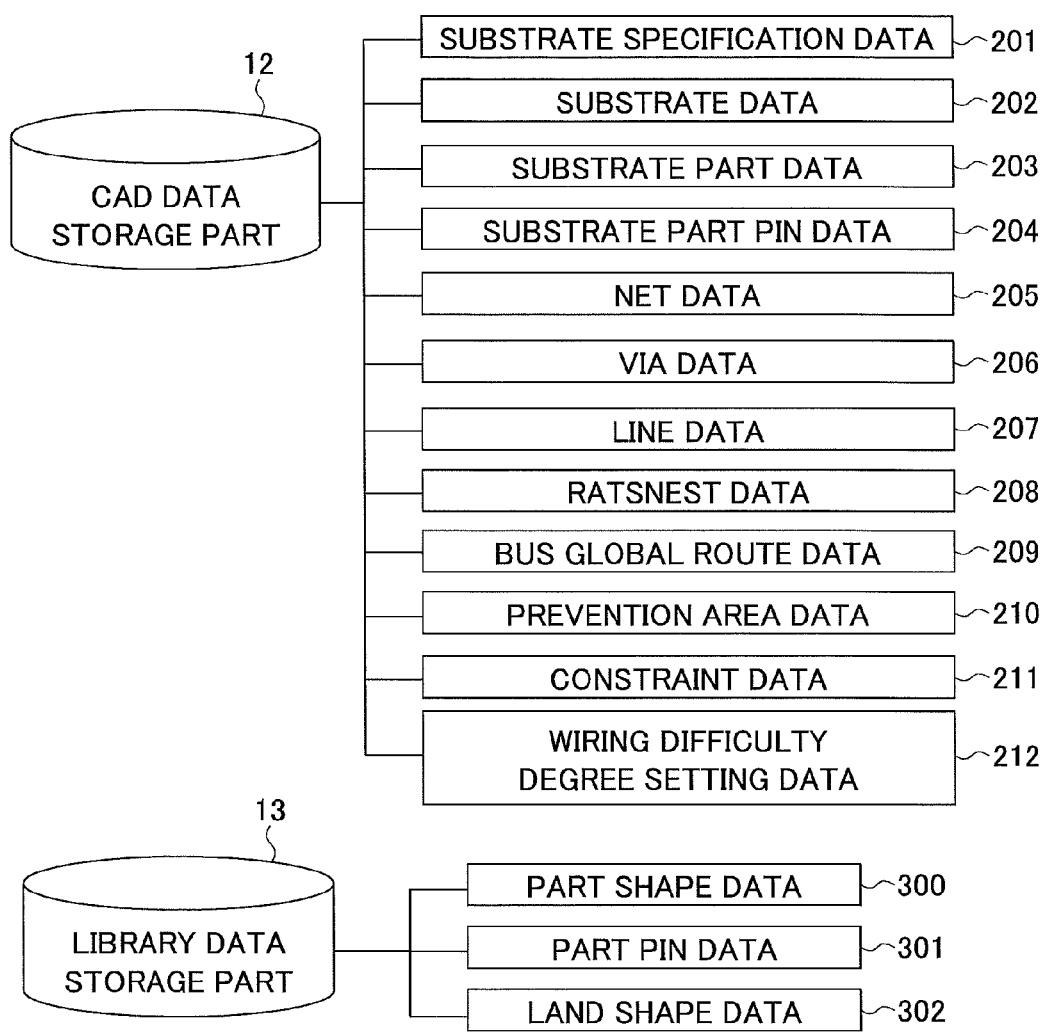
FIG. 6 is a diagram illustrating an example of data construction in a CAD data storage part and a library data storage part.

FIG. 6 is a diagram illustrating an example of data construction in the CAD data storage part 12 and the library data storage part 13.

The CAD data storage part 12 includes a substrate specification data 201, a substrate data 202, a substrate part data 203, a substrate part pin data 204, a net data 205, a via data 206, a line data 207, and a ratsnest data 208. Further, the CAD data storage part 12 includes a bus global route data 209, a prevention area data 210, a constraint data 211, and a wiring difficulty degree setting data 212.

The substrate specification data 201 includes a substrate name, a design rule (a line width and a clearance), etc. The substrate data 202 includes a number of layers, an outline shape, and a thickness of the substrate. The substrate part data 203 includes a name (part name), a part library name, a mounting side and location coordinates of the part installed on the substrate. The part library name is associated with a part shape data 300 in the library data storage part 13. The substrate part pin data 204 includes a part name, a part pin name, a net number, coordinates, and a layer number. The part pin name is associated with a part pin data 301 in the library data storage part 13. The net number indicates a net to which the respective pins belong. The net data 205 includes a net number and a net name. The net number is a number unique to each net. The net represents a wiring between the connected parts. The unit of the net may be arbitrary. For example, a relationship may be such that one net may not be connected to another net. The via data 206 includes a net number to which a via belongs, coordinates and a layer number. The line data 207 includes a net number to which a wiring belongs, coordinates of the wiring (coordinates of a start point and an end point), a wiring width and a layer number. The data included in the line data 207 is related to a designed wiring that has already been designed. The ratsnest data 208 includes ratsnest names, coordinates of the ratsnest (coordinates of start points and end points), layer numbers, and the wiring difficulty degrees. The ratsnest data 208 for respective ratsnests used for the layout design is stored in the CAD data storage part 12. The data related to the respective ratsnests in the ratsnest data 208 is identified uniquely such that unique data is stored on a ratsnest basis. The bus global route data 209 includes a bus global route number, a bus global route name, ratsnests in a bus global route, a coordinate group, a layer number, a net number group and the wiring difficulty degrees. The prevention area data 210 includes a coordinate group (respective coordinates that form a prevention area, for example) and a layer number. The constraint data 211 includes a constraint name and a constraint content of an object. The wiring difficulty degree setting data 212 includes wiring twist difficulty degree level setting data, constraint difficulty degree level setting data and a wiring distance difficulty degree level setting data. The setting data is described hereinafter. Further, details of the wiring difficulty degree are described hereinafter. The calculation region instruction of the wiring difficulty degrees may be specified by a coordinate 1, a coordinate 2, . . . and a coordinate N. The calculation target list of the wiring difficulty degrees is specified by the ratsnest name and the bus global route name.

The library data storage part 13 includes the part shape data 300, the part pin data 301 and a land shape data 302. The part shape data 300 includes a part shape and a part height. The part pin data 301 includes a part pin name, a signal class and coordinates. The land shape data 302 includes a land shape name and a land shape.

FIG. 7 is a diagram illustrating an example of data construction of the wiring difficulty degree.

The wiring difficulty degree is changed according to the progress of the layout design. For this reason, the wiring difficulty degree includes an initial wiring difficulty degree and a changed wiring difficulty degree. The initial wiring difficulty degree represents a wiring difficulty degree determined at the time of the arrangement designing of the part. The wiring difficulty degree may be changed after the calculation of the initial wiring difficulty degree, and the changed wiring difficulty degree represents the wiring difficulty degree after the change. Typically, the wiring difficulty degree changes in the following three cases. The first case is where an instruction to change the arrangement design is generated. The second case is where an instruction of a setting change of the wiring difficulty degree is generated. The third case is where a setting change of the bus global route is generated. The instruction of the setting change of the wiring difficulty degree includes specifying the area in which the wiring difficulty degree is calculated and specifying the target for which the wiring difficulty degree is to be calculated. An example of the setting change of the wiring difficulty degree is described hereinafter. The instruction of the setting change of the bus global route includes changing the location of the bus global route. In the three cases described above, the changed wiring difficulty degree is calculated. The changed wiring difficulty degree represents an influence on the unwired section during the edition of the wiring design.

The wiring difficulty degrees are calculated for the unwired ratsnest and the unwired bus global route to be stored in the ratsnest data 208 and the bus global route data 209, respectively. The initial wiring difficulty degree includes a difficulty degree related to a wiring twist, a difficulty degree related to a constraint, and a difficulty degree related to a wiring distance. However, the difficulty degree related to the wiring twist is calculated with respect to only the bus global route. The changed wiring difficulty degree includes a difficulty degree related to route keeping. The wiring difficulty degree may additionally include the calculation result of the wiring difficulty degree calculation process part and an unwired wiring section enlargement number. These are also described hereinafter.

The initial wiring difficulty degree is a value that is calculated by combining three indexes described hereinafter that are determined separately. The first index is a "wiring distance". The second index is a "constraint". The third index is a "wiring twist". The respective indexes have respective quantified values referred to as "difficulty degree" separately. Details of the indexes are described hereinafter. The changed wiring difficulty degree is determined in terms of a "route keeping". The route keeping also has a quantified value referred to as "difficulty degree". Details of the "route keeping" are described hereinafter. The "constraint" and the "route keeping" have values of "OK/NOT" to determine whether the arrangement designing can be performed. Then, the resultant wiring difficulty degree is obtained as a result of the calculation by combining the three indexes of the initial wiring difficulty degree and the changed wiring difficulty degree.

FIG. 8 is a table illustrating indexes of the wiring difficulty degree. At the time of the arrangement designing, the difficulty degree related to the wiring distance, the difficulty degree related to the constraint and the difficulty degree related to the wiring twist are calculated. The difficulty degree related to the constraint includes a determination result of whether the wiring is possible or not. The route keeping difficulty degree is calculated at the time of the change in the arrangement design and the change in the wiring design. The route keeping difficulty degree includes a determination result of whether the wiring is possible or not.

FIG. 9 is a diagram illustrating models of the wiring difficulty degree. In FIG. 9, (A) illustrates the initial wiring difficulty degree, (B) illustrates the changed wiring difficulty degree, (C) illustrates a case where the wiring difficulty degree is a disable state, and (C) illustrates the change in the wiring difficulty degree. In FIG. 9 (A), a left end of a lateral axis of a model figure indicates "easy", and a right end indicates "impossible". The model figure is set such that the wiring difficulty degree becomes more difficult as a position on the lateral axis goes to the right side. Fifth scale from the left end indicates "difficult". The position that is moved from the location "difficult" by one scale in the right direction has placed a black circle that represents "impossible". The wiring difficulty degree is explained based on this model. For example, the initial wiring difficulty degree is calculated. The value of the initial wiring difficulty degree corresponds to a position indicated by a reversed triangle mark at two scales right from the left end in the model in FIG. 9 (A). Then, the changed wiring difficulty degree is calculated. The changed wiring difficulty degree is indicated by a rhombus in FIG. 9 (B). The range in which the changed wiring difficulty degree is from the third scale to the sixth scale with respect to the initial wiring difficulty degree in the model. A state illustrated in FIG. 9 (C) is formed when the difficulty degree of "route keeping" or "constraint" is determined as "impossible". According to FIG. 9 (C), the designer recognizes that the wiring designing is not possible, and thus can take a necessary step such as changing the wiring designing. The wiring difficulty degree can be made easier by changing the initial wiring difficulty degree if the wiring design, which is being edited, cannot be changed. FIG. 9 (D) is an example in which the wiring difficulty degree is decreased by changing the initial wiring difficulty degree. In this way, the designer can prevent a case where the layout design become impossible. Further, the designer can recognize the difficulty of the wiring in the layout design which is being performed.

Figure 10:
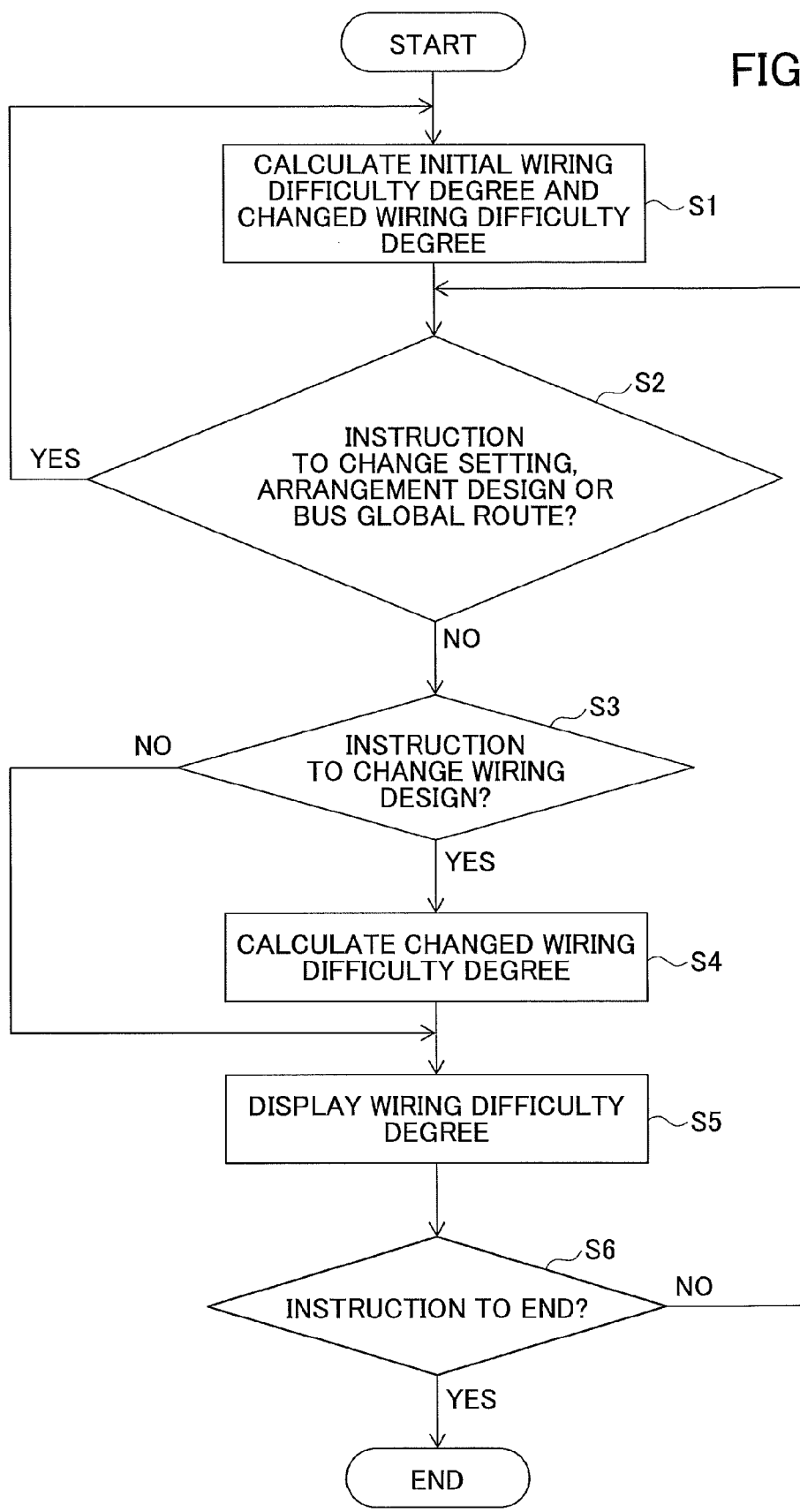
FIG. 10 is a flowchart illustrating an example of a process as a whole executed by the design support apparatus.

FIG. 10 is a flowchart illustrating an example of the process as a whole executed by the design support apparatus 1.

In the following, as an example, the wiring difficulty degrees related to the bus global route and the ratsnest are displayed with colors (not illustrated). Specifically, the wiring difficulty degrees are expressed by the colors, blue, yellow, red and black. The wiring difficulty degree with a blue color represents a state in which the wiring difficulty degree is not affected by another arrangement wiring designing. The wiring difficulty degree with a yellow color represents a state in which the wiring difficulty degree is affected by another arrangement wiring designing. Further, the wiring difficulty degree with a red color represents a state in which the wiring difficulty degree is greatly affected by another arrangement wiring designing. The wiring difficulty degree with a black color represents a state in which the wiring is impossible. If the wiring difficulty degree of the ratsnest or the bus global route is not set yet, it is displayed with a white color. An example of the total wiring difficulty degree width for determining the wiring difficulty degrees is illustrated in FIG. 11. An example of a way of calculating the total wiring difficulty degree is described hereinafter. The setting data of the wiring difficulty degrees for determining the wiring difficulty degree levels of the respective wiring difficulty degrees is as illustrated in FIGS. 12 through 16. Such setting data is input to the input part 11 and stored in the wiring difficulty degree setting data 212 of the CAD data storage part 12.

In step S1, the wiring difficulty degree process part 14 calculates the initial wiring difficulty degree or the changed wiring difficulty degree. A way of calculating the initial wiring difficulty degree or the changed wiring difficulty degree is described hereinafter.

In step S2, the wiring difficulty degree process part 14 determines whether the instruction to change the setting of the wiring difficulty degree calculation, the instruction to change the arrangement design, or the instruction to change the bus global route is input. Changing the setting of the wiring difficulty degree calculation includes changing the setting of the colors in displaying the wiring difficulty degrees, the setting of a number of steps or a reference value (see FIG. 12, for example) in calculating the wiring difficulty degree, etc. Changing the arrangement design may include newly arranging a part, deleting the part that has been arranged, changing a location of the part that has been arranged, etc. Changing the bus global route includes newly setting the bus global route, changing contents of the bus global route that has been set, etc. If the instruction to change the setting of the wiring difficulty degree calculation, the instruction to change the arrangement design, or the instruction to change the bus global route is input, the process routine goes to step S1 accordingly. If there is no input, the process routine goes to step S3.

In step S3, the wiring difficulty degree process part 14 determines whether the instruction to change the wiring design is input. The instruction to change the wiring design may include the instruction to newly arrange a wiring, the instruction to delete the wiring design, etc. If the instruction to change the wiring design is input, the process routine goes to step S4, otherwise the process routine goes to step S5.

In step S4, the wiring difficulty degree process part 14 calculates the changed wiring difficulty degree. When the changed wiring difficulty degree is calculated, the process goes to step S5. This process is described hereinafter.

In step S5, the display part 10 displays the wiring difficulty degree calculated by the wiring difficulty degree process part 14. When the changed wiring difficulty degree is displayed, the process goes to step S6.

In step S6, the wiring difficulty degree process part 14 determines whether the instruction to end the program is input. If the instruction to end the program is input, the process ends, otherwise the process goes to step S2.

Figure 17:
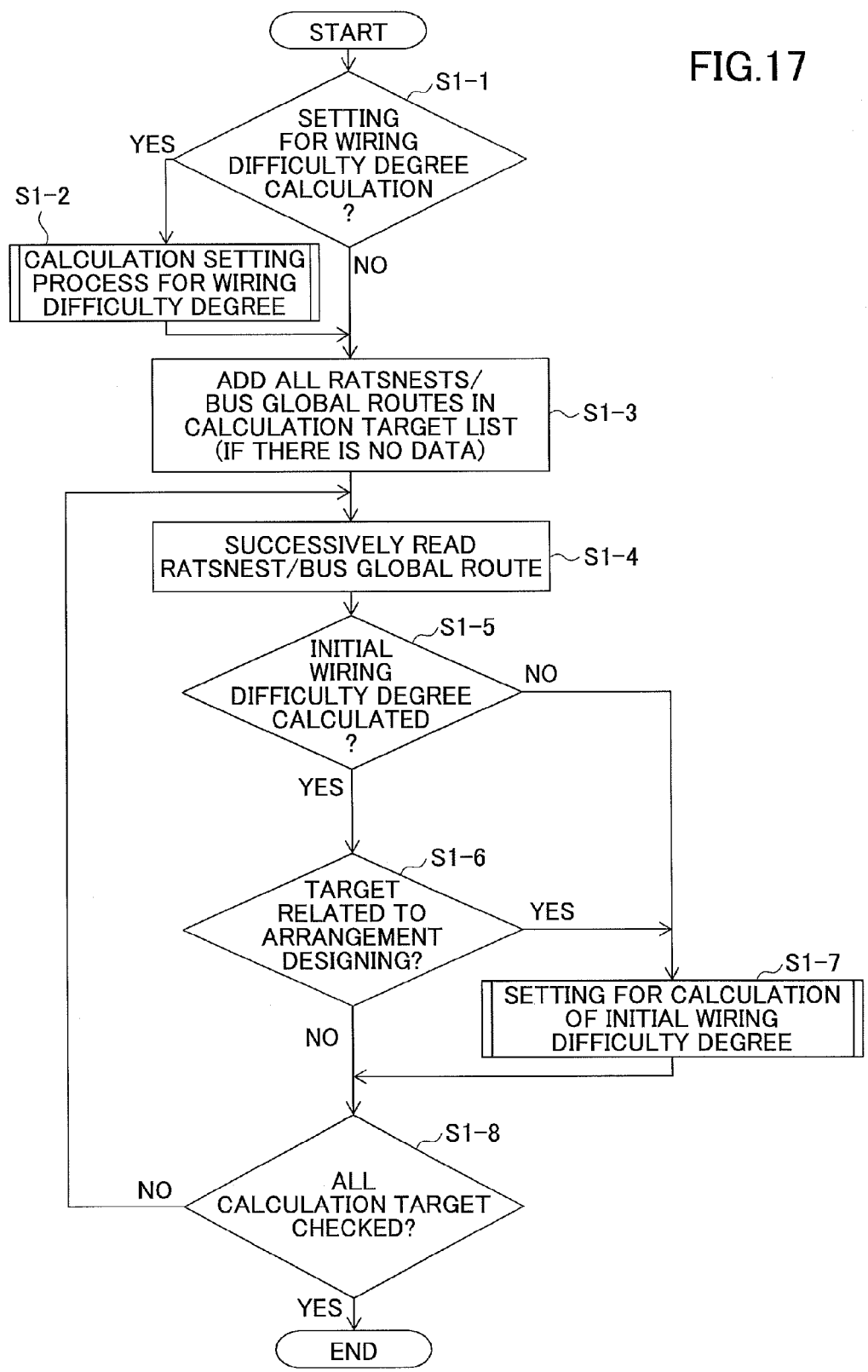
FIG. 17 is a flowchart illustrating an example of a process of step S1 in FIG. 10.

FIG. 17 is a flowchart illustrating an example of the process of step S1 in FIG. 10.

In step S1-1, the wiring difficulty degree process part 14 determines whether there is a setting of the wiring difficulty degree calculation. Whether there is a setting of the wiring difficulty degree calculation may be determined by reading the calculation region of the wiring difficulty degree of the wiring difficulty degree setting data 212 of the CAD data storage part 12. If there is a setting of the wiring difficulty degree calculation, the process routine goes to step S1-2, otherwise the process routine goes to step S1-3.

In step S1-2, the wiring difficulty degree process part 14 performs a calculation setting process of the wiring difficulty degree. An example of the calculation setting process of the wiring difficulty degree is described hereinafter.

In step S1-3, the wiring difficulty degree process part 14 reads all the ratsnest data 208 and all the bus global route data 209 in the CAD data storage part 12 to add them in the calculation target list of the wiring difficulty degree, if there is no data in the calculation target list of the wiring difficulty degree.

In step S1-4, the wiring difficulty degree process part 14 successively reads the ratsnests and the bus global routes in the calculation list.

In step S1-5, the wiring difficulty degree process part 14 determines whether the initial wiring difficulty degree of the ratsnest or the bus global route read in step S1-4 has been calculated. If the initial wiring difficulty degree has been calculated, the process routine goes to step S1-6, otherwise the process routine goes to step S1-7.

In step S1-6, the wiring difficulty degree process part 14 determines whether the target for which the wiring difficulty degree to be calculated is related to the arrangement design. If the target is related to the arrangement design, the process routine goes to step S1-7, otherwise the process routine goes to step S1-8.

In step S1-7, the wiring difficulty degree process part 14 performs the calculation process of the wiring difficulty degree.

In step S1-8, the wiring difficulty degree process part 14 determines whether all the ratsnests and all the bus global routes listed in the calculation list of the wiring difficulty degree have been checked. If all the ratsnests and all the bus global routes listed in the calculation list of the wiring difficulty degree have been checked, the process routine directly ends, otherwise the process routine returns to step S1-4. In this way, the processes of step S1-5 through step S1-7 are applied to all the ratsnests and all the bus global routes listed in the calculation list of the wiring difficulty degree.

Figure 18:
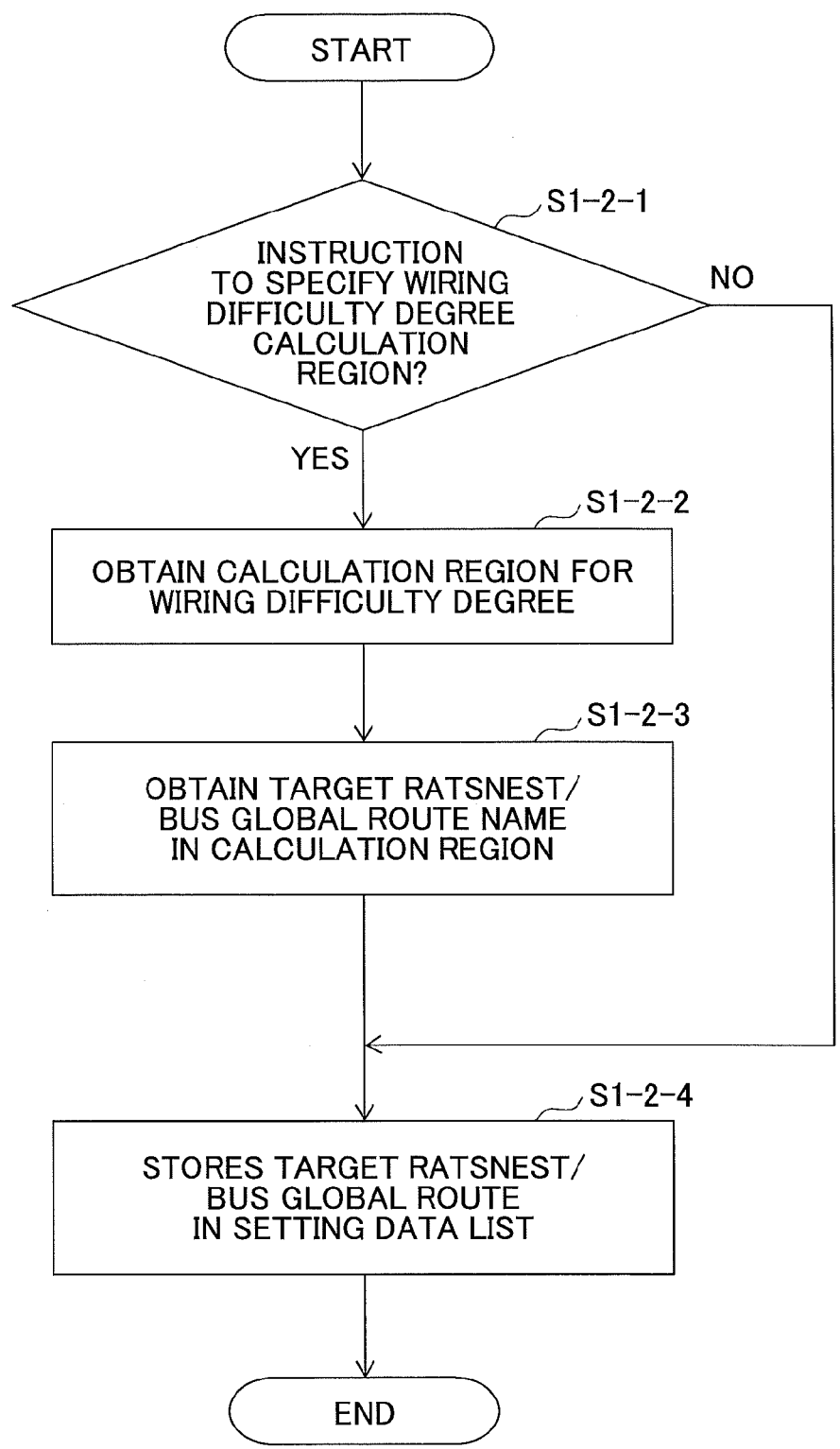
FIG. 18 is a flowchart illustrating an example of a process of step S1-2 in FIG. 17.

FIG. 18 is a flowchart illustrating an example of the process of step S1-2 (the calculation setting process of the wiring difficulty degree) in FIG. 17.

In step S1-2-1, the wiring difficulty degree process part 14 determines whether the calculation region of the wiring difficulty degree has been specified. If the calculation region of the wiring difficulty degree has been specified, the process routine goes to step S1-2-2, otherwise the process routine goes to step S1-2-4.

In step S1-2-2, the wiring difficulty degree process part 14 refers to the calculation region of the wiring difficulty degree of the wiring difficulty degree setting data 212 in the CAD data storage part 12 to obtain the calculation region of the wiring difficulty degree.

In step S1-2-3, the wiring difficulty degree process part 14 obtains the ratsnest name and the bus global route name included in the calculation region.

In step S1-2-4, the wiring difficulty degree process part 14 stores, in a setting data list of the wiring difficulty degree, the targets of the ratsnest and the bus global route included in the wiring difficulty degree calculation region.

Figure 19:
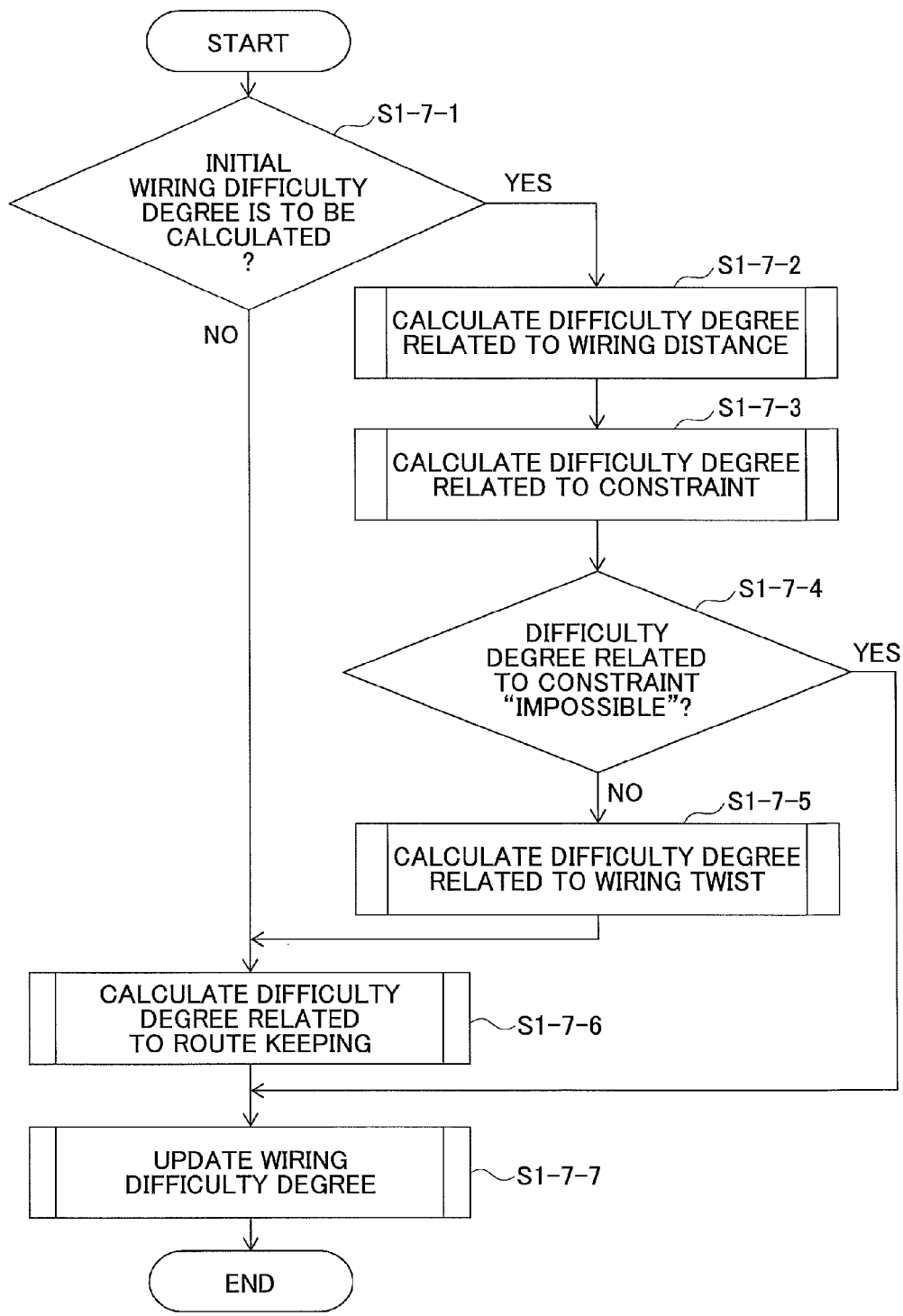
FIG. 19 is a flowchart illustrating an example of a process of step S1-7 in FIG. 17.

FIG. 19 is a flowchart illustrating an example of the process of step S1-7 (the calculation process of the wiring difficulty degree) in FIG. 17.

In step S1-7-1, the wiring difficulty degree process part 14 determines whether the setting is such that the initial value of the wiring difficulty degree is to be calculated. If the setting is such that the initial value of the wiring difficulty degree is to be calculated, the process routine goes to step S1-7-2, otherwise the process routine goes to step S1-7-6.

In step S1-7-2, the wiring difficulty degree process part 14 calculates the difficulty degree related to the wiring distance. A way of calculating the difficulty degree related to the wiring distance is described hereinafter.

In step S1-7-3, the wiring difficulty degree process part 14 calculates the difficulty degree related to the constraint. A way of calculating the difficulty degree related to the constraint is described hereinafter.

In step S1-7-4, the wiring difficulty degree process part 14 determines whether the difficulty degree related to the constraint is "impossible". If the difficulty degree related to the constraint is "impossible", the process routine goes to step S1-7-7, otherwise the process routine goes to step S1-7-5.

In step S1-7-5, the wiring difficulty degree process part 14 calculates the difficulty degree related to the wiring twist. A way of calculating the difficulty degree related to the wiring twist is described hereinafter.

In step S1-7-6, the wiring difficulty degree process part 14 calculates the difficulty degree related to the route keeping. A way of calculating the difficulty degree related to the route keeping is described hereinafter.

In step S1-7-7, the wiring difficulty degree process part 14 performs an updating process of the wiring difficulty degree. An example of the updating process of the wiring difficulty degree is described hereinafter.

Figure 20:
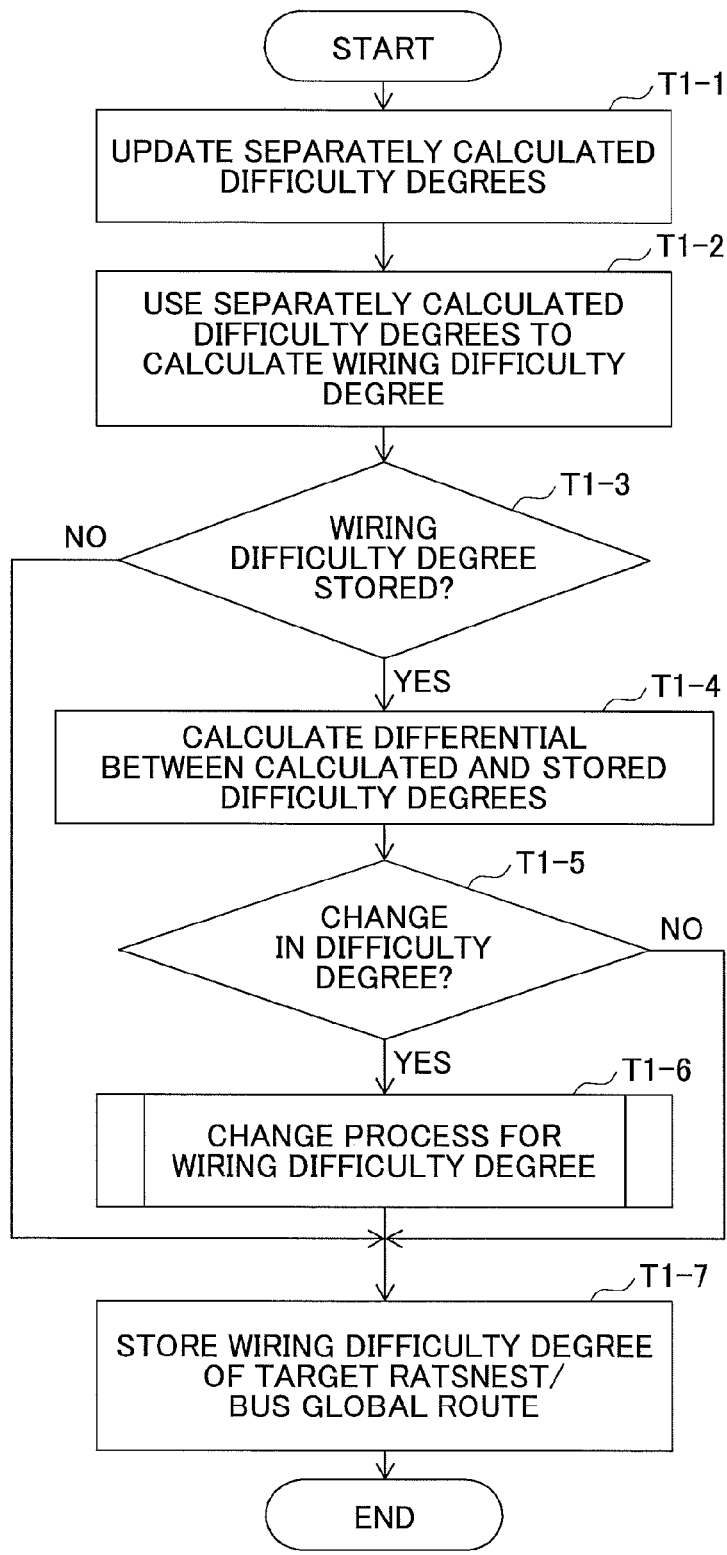
FIG. 20 is a flowchart illustrating an example of a process of step S1-7-7 in FIG. 19.

FIG. 20 is a flowchart illustrating an example of the process of step S1-7-7 (the updating process of the wiring difficulty degree) in FIG. 19.

In step T1-1, the wiring difficulty degree process part 14 executes the updating process of the wiring difficulty degrees that are separately calculated.

In step T1-2, the wiring difficulty degree process part 14 calculates the wiring difficulty degree using the respective wiring difficulty degrees that are separately calculated.

In step T1-3, the wiring difficulty degree process part 14 determines whether there is any wiring difficulty degree stored in step T1-1. For example, the wiring difficulty degree process part 14 may determine whether there is any stored wiring difficulty degree by reading the calculation process result of the wiring difficulty degree of the bus global route data 209 in the CAD data storage part 12. If there is any stored wiring difficulty degree, the process routine goes to step T1-4, otherwise the process routine goes to step T1-7.

In step T1-4, the wiring difficulty degree process part 14 calculates a differential between the calculated wiring difficulty degree and the stored wiring difficulty degree.

Step T1-5, the wiring difficulty degree process part 14 determines whether there is any change in the wiring difficulty degree. If there is any change in the wiring difficulty degree, the process routine goes to step T1-6, otherwise the process routine goes to step T1-7.

In step T1-6, the wiring difficulty degree process part 14 performs a change process of the wiring difficulty degree.

In step T1-7, the wiring difficulty degree process part 14 updates the calculation process result of the wiring difficulty degree of the bus global route data 209 in the CAD data storage part 12.

Figure 21:
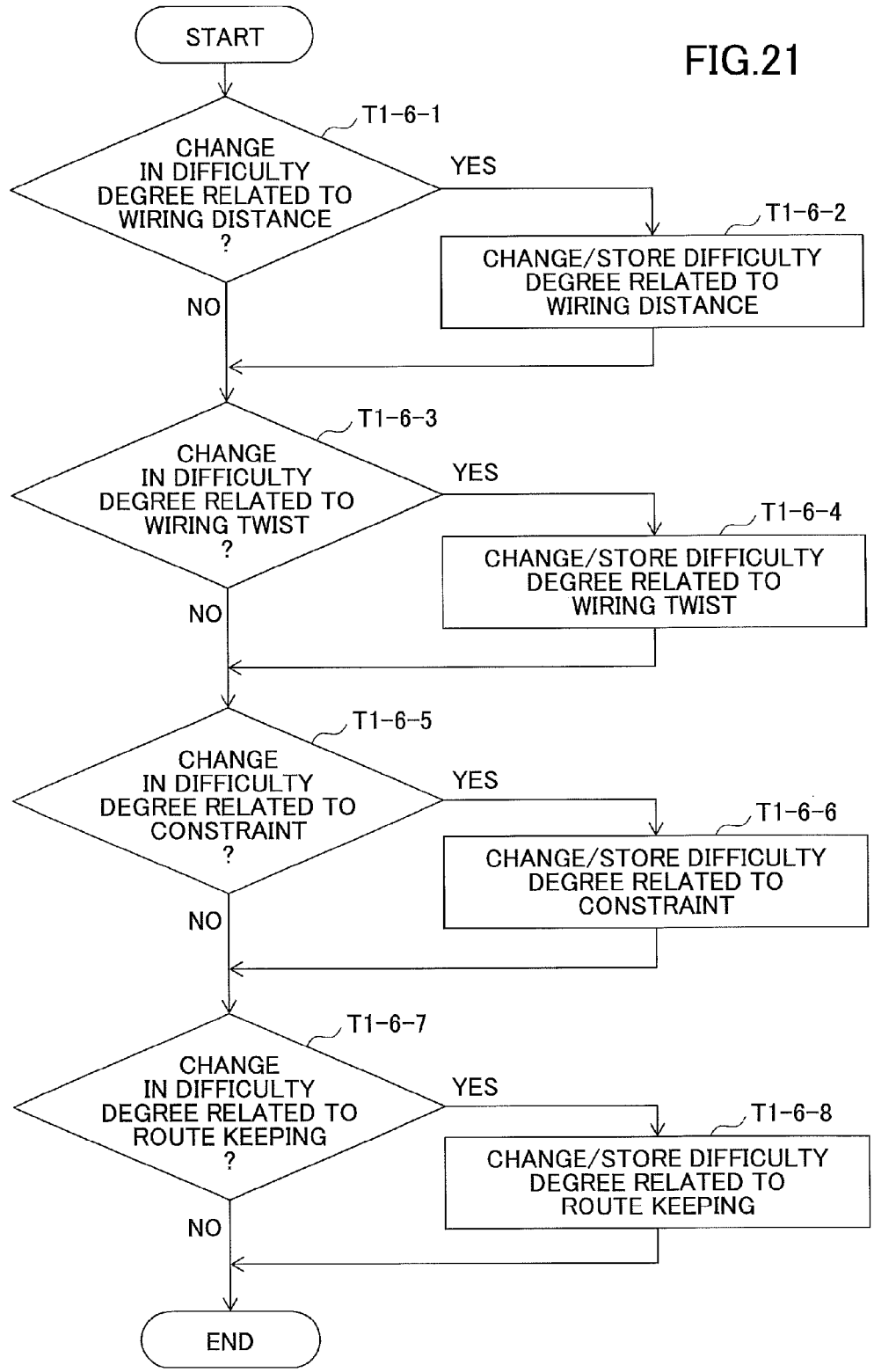
FIG. 21 is a flowchart illustrating an example of a process of step T1-1 in FIG. 20.

FIG. 21 is a flowchart illustrating an example of the process of step T1-6 in FIG. 20.

In step T1-6-1, the wiring difficulty degree process part 14 determines whether there is any change in the wiring difficulty degree related to the wiring distance. It is noted that, if this calculation is performed for the first time, the wiring difficulty degree process part 14 determines that there is a change (the same holds true in the following). If there is any change in the wiring difficulty degree related to the wiring distance, the process routine goes to step T1-6-2, otherwise the process routine goes to step T1-6-3.

In step T1-6-2, the wiring difficulty degree process part 14 updates, with the changed value, the wiring difficulty degree related to the wiring distance of the bus global route data 209 in the CAD data storage part 12.

Step T1-6-3, the wiring difficulty degree process part 14 determines whether there is any change in the wiring difficulty degree related to the wiring twist. If there is any change in the wiring difficulty degree related to the wiring twist, the process routine goes to step T1-6-4, otherwise the process routine goes to step T1-6-5.

In step T1-6-4, the wiring difficulty degree process part 14 updates, with the changed value, the wiring difficulty degree related to the wiring twist of the bus global route data 209 in the CAD data storage part 12.

In step T1-6-5, the wiring difficulty degree process part 14 determines whether there is any change in the wiring difficulty degree related to the constraint. If there is any change in the wiring difficulty degree related to the constraint, the process routine goes to step T1-6-6, otherwise the process routine goes to step T1-6-7.

In step T1-6-6, the wiring difficulty degree process part 14 updates, with the changed value, the wiring difficulty degree related to the constraint of the bus global route data 209 in the CAD data storage part 12.

In step T1-6-7, the wiring difficulty degree process part 14 determines whether there is any change in the wiring difficulty degree related to the route keeping. If there is any change in the wiring difficulty degree related to the route keeping, the process routine goes to step T1-6-8, otherwise the process routine in FIG. 21 ends.

In step T1-6-8, the wiring difficulty degree process part 14 updates, with the changed value, the wiring difficulty degree related to the route keeping of the bus global route data 209 in the CAD data storage part 12.

Figure 22:
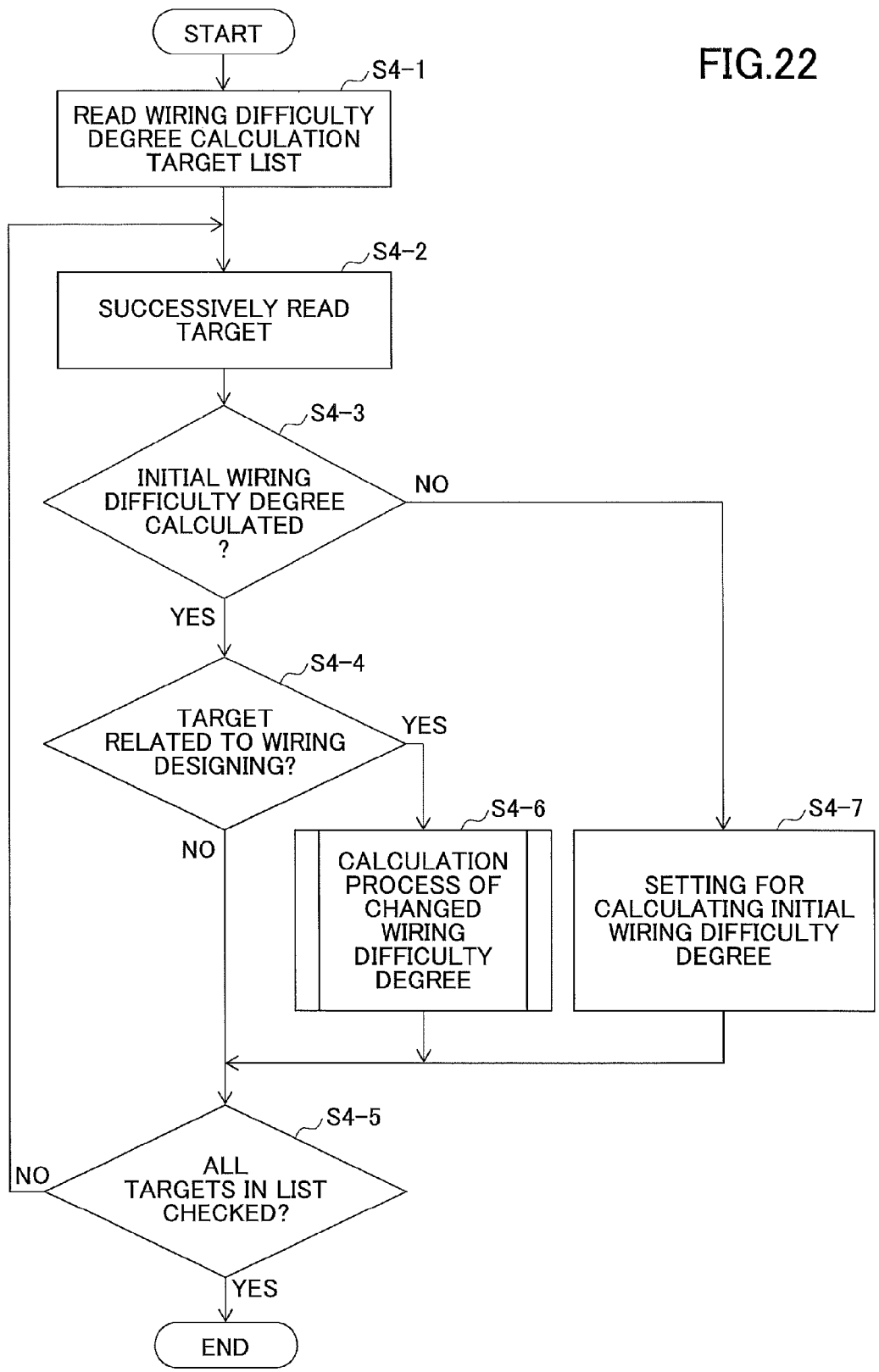
FIG. 22 is a flowchart illustrating an example of a process of step S4 in FIG. 10.

FIG. 22 is a flowchart illustrating an example of the process of step S4 in FIG. 10.

In step S4-1, the wiring difficulty degree process part 14 reads the list (the calculation target list of the wiring difficulty degree of the wiring difficulty degree setting data 212 in the CAD data storage part 12) generated in step S1-3.

In step S4-2, the wiring difficulty degree process part 14 successively reads the calculation target in the read calculation target list of the wiring difficulty degree to calculate the wiring difficulty degrees.

In step S4-3, the wiring difficulty degree process part 14 determines whether the initial wiring difficulty degree has been calculated. If the initial wiring difficulty degree has been calculated, the process routine goes to step S4-4, otherwise the process routine goes to step S4-7.

In step S4-4, the wiring difficulty degree process part 14 determines whether the target for which the wiring difficulty degree to be calculated is related to the wiring design. If the target is related to the wiring design, the process routine goes to step S4-6, otherwise the process routine goes to step S4-5.

In step S4-5, the wiring difficulty degree process part 14 determines whether all the targets in the calculation target list for which the wiring difficulty degree is to be calculated have been checked. If all the targets in the calculation target list have been checked, the process routine directly ends, otherwise the process routine returns to step S4-1.

In step S4-6, the wiring difficulty degree process part 14 calculates the changed wiring difficulty degree. This process is described hereinafter.

In step S4-7, the wiring difficulty degree process part 14 sets the setting such that the initial value of the wiring difficulty degree is to be calculated.

Figure 23:
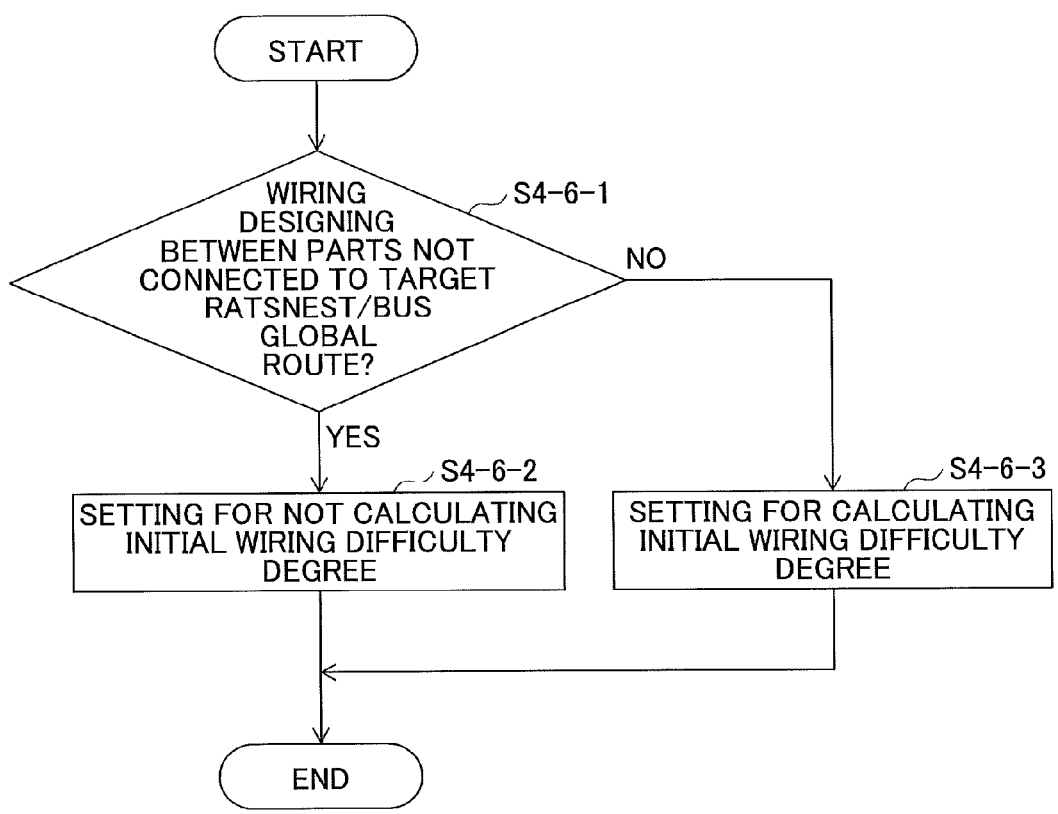
FIG. 23 is a flowchart illustrating an example of a process of step S4-6 in FIG. 22.

FIG. 23 is a flowchart illustrating an example of the process of step S4-6 in FIG. 22.

Figure 24:
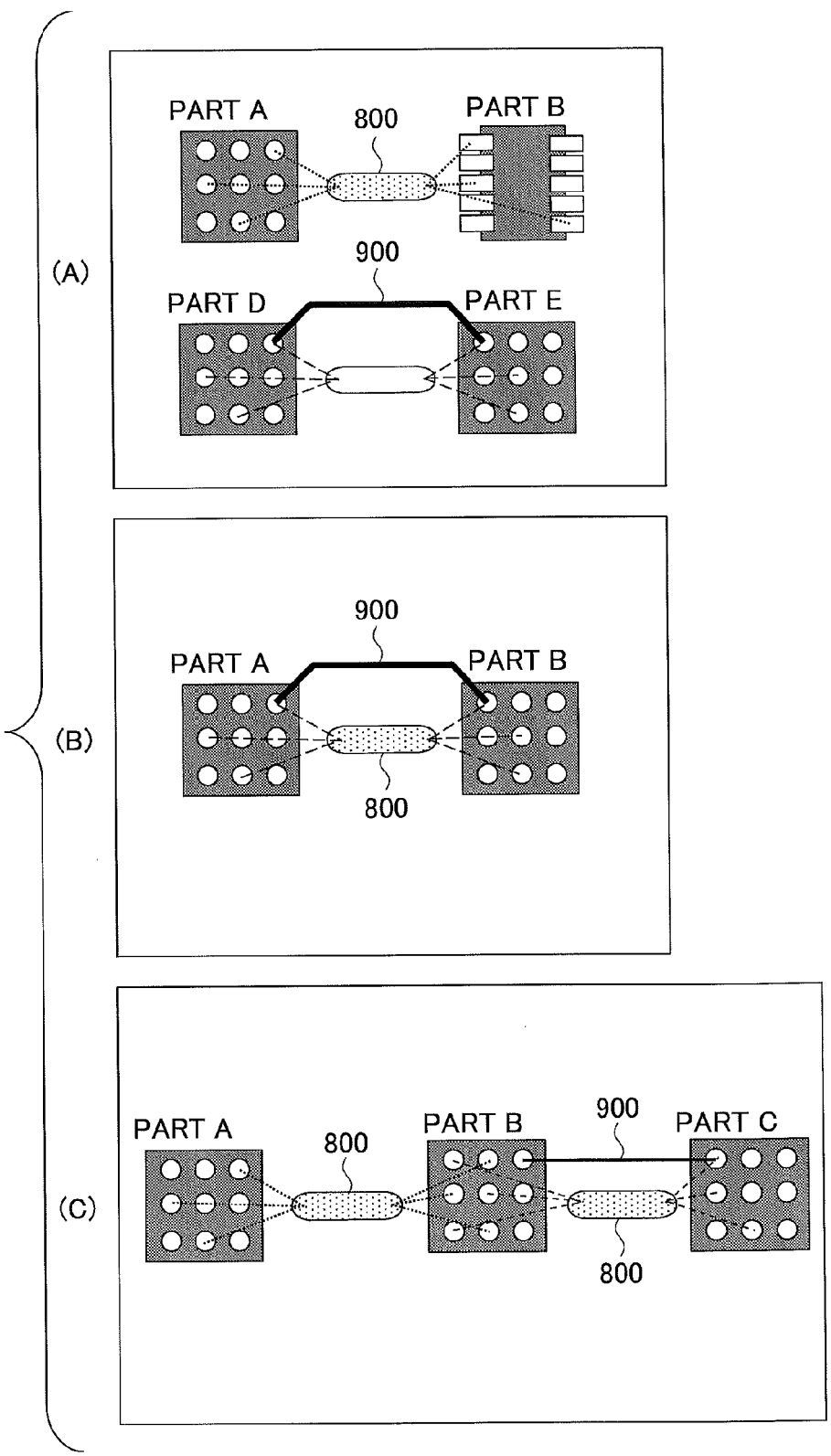
FIG. 24 is a diagram for explaining an example in which wiring designing affects other unwired wiring sections.

In step S4-6-1, the wiring difficulty degree process part 14 determines whether the wiring is designed between the parts between which the target ratsnest and the bus global route are not connected. FIG. 24 (A) illustrates an example of a case where the wiring is designed between the parts between which the target ratsnest and the bus global route are not connected. In the example illustrated in FIG. 24 (A), the target bus global route 800 is connected between the part A and the part B, and the wiring is designed between the part D and the part E (see the wiring 900). FIG. 24 (B) illustrates an example of a case where the wiring is designed between the parts between which the target ratsnest and the bus global route are connected. In the example illustrated in FIG. 24 (B), the target bus global route 800 is connected between the part A and the part B, and the wiring is designed between the part A and the part B (see the wiring 900). FIG. 24 (C) illustrates an example of a case where the wiring is designed between the parts between which the target ratsnest and the bus global route are connected. In the example illustrated in FIG. 24 (C), the target bus global route 800 is connected between the part A and the part B, and the wiring is designed between the part B and the part C (see the wiring 900).

In step S4-6-1, if the wiring is designed between the parts between which the target ratsnest and the bus global route are not connected, the process routine goes to step S4-6-2, otherwise the process routine goes to step S4-6-3.

In step S4-6-2, the wiring difficulty degree process part 14 does not calculate the initial wiring difficulty degree, and calculates the difficulty degree related to the route keeping.

In step S4-6-3, the wiring difficulty degree process part 14 calculates the initial wiring difficulty degree.

Figure 25:
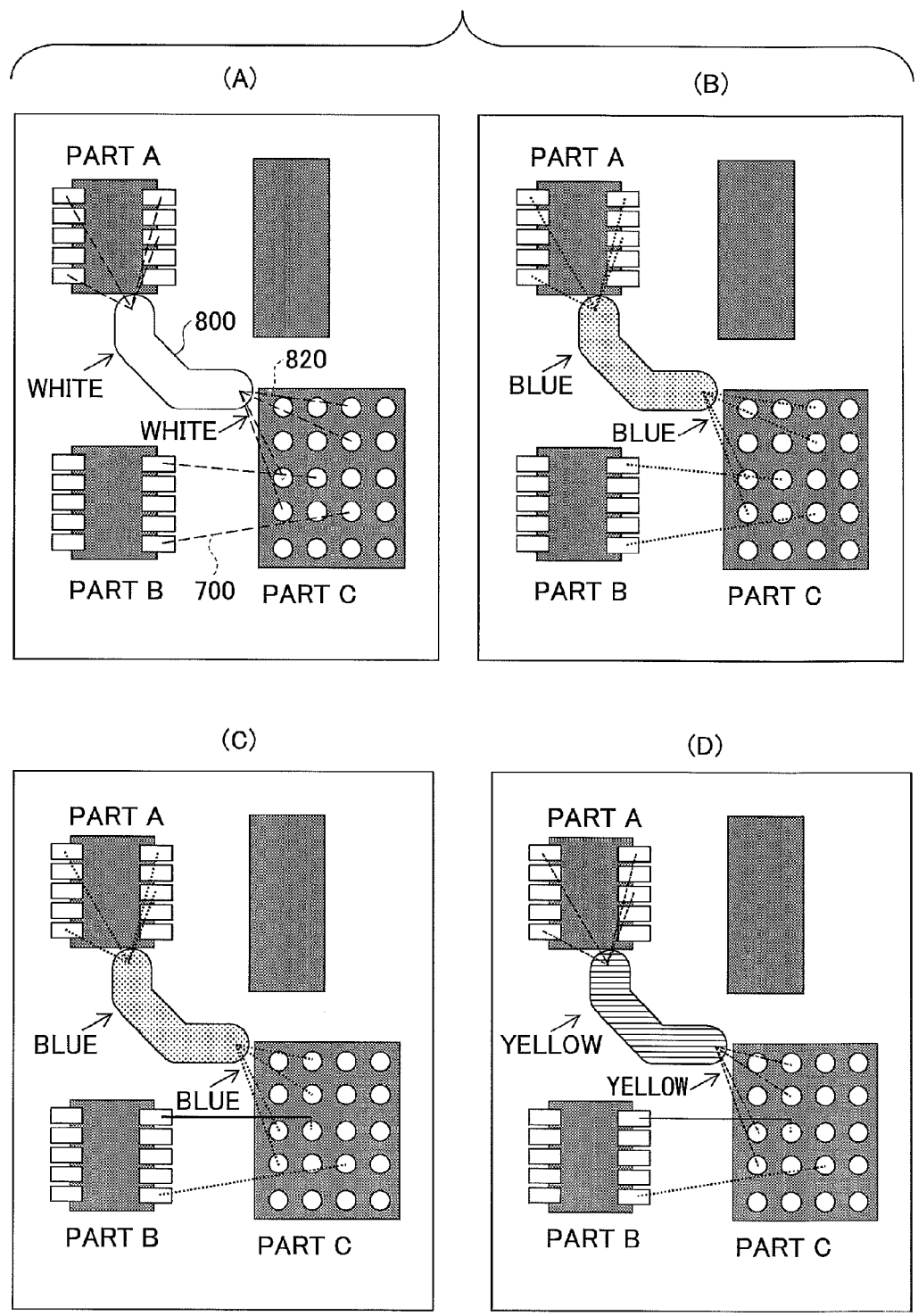
FIG. 25 is a diagram for explaining an example of a change manner of the wiring difficulty degree due to the wiring designing.
Figure 26:
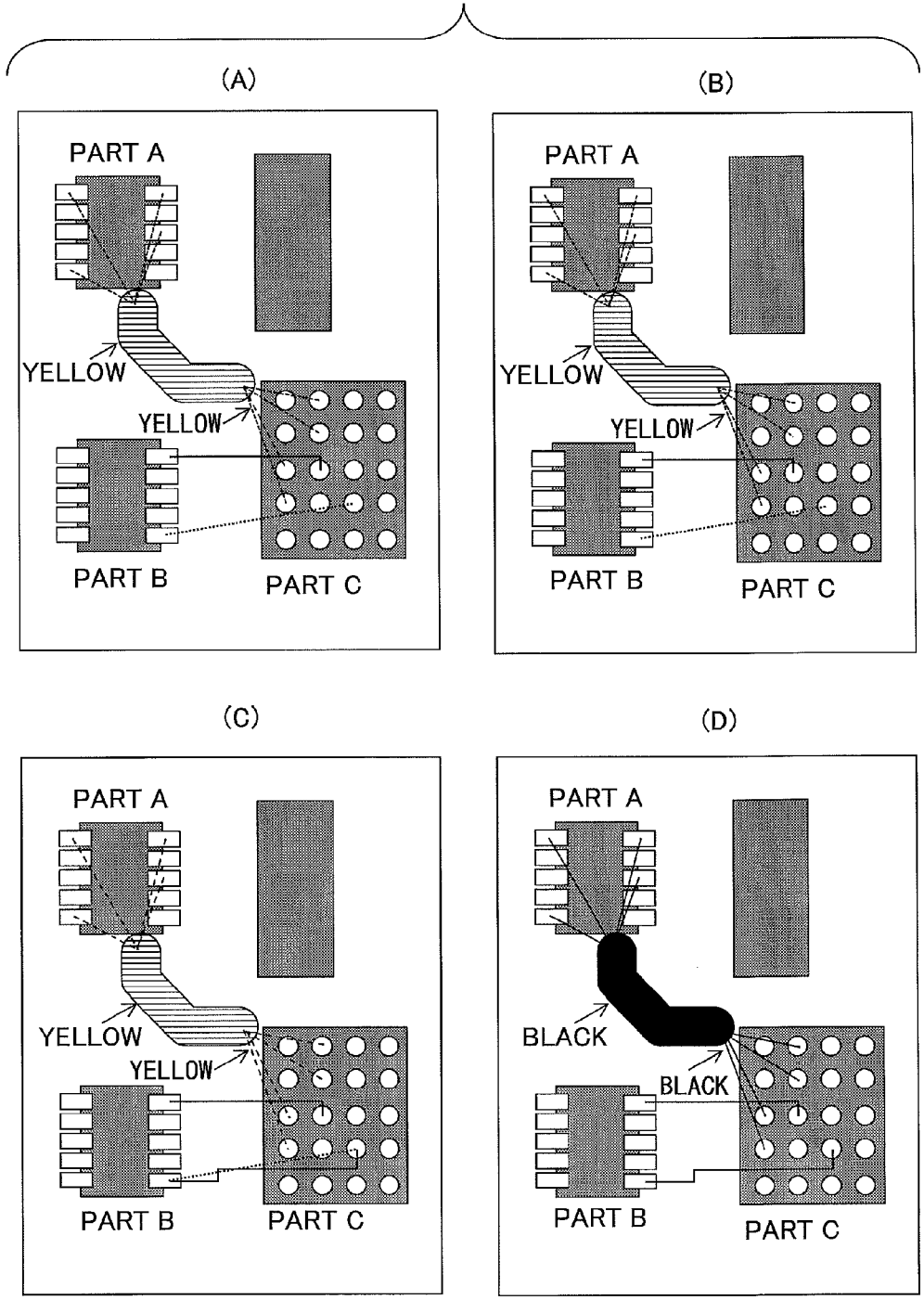
FIG. 26 is a diagram for explaining an example of a change manner of the wiring difficulty degree due to the wiring designing.
Figure 27:
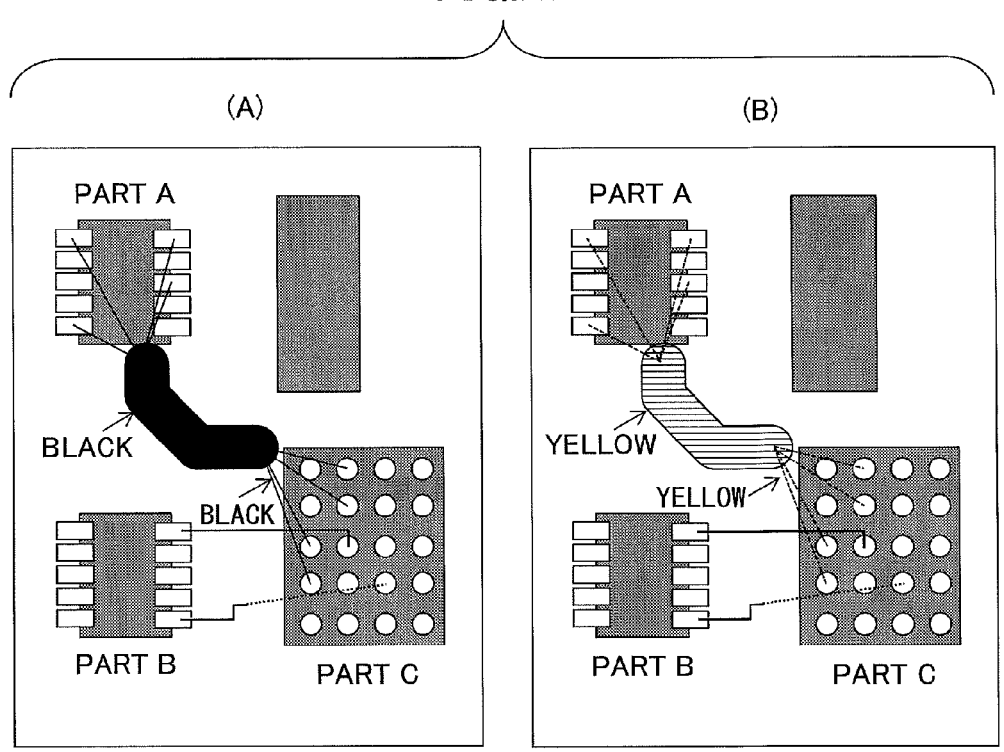
FIG. 27 is a diagram for explaining an example of a change manner of the wiring difficulty degree due to the wiring designing.

FIGS. 25 through 27 are diagrams illustrating examples of a way of displaying the wiring difficulty degree in course of the wiring designing. It is noted that, in FIGS. 25 through 27, the wiring difficulty degree is expressed by the respective colors of blue, yellow, red and black; however, these colors are indicated by the text, such as "blue", because the drawings are not colored. The text and arrows for indicating the colors are not actually displayed. This also holds true for the corresponding following drawings.

In the example illustrated in FIG. 25 (A), the wiring is designed between the part A and the part C, and the wiring is designed between the part B and the part C. In the example illustrated in FIG. 25 (A), the bus global route 800 is set between the part A and the part C, and the ratsnests 700 are displayed between the part B and the part C. The color of the bus global route 800 set between the part A and the part C is white because the wiring difficulty degree thereof is not calculated. It is noted that, in the example illustrated in FIG. 25 (A), it is determined that the wiring difficulty degree of the bus global route 800 set between the part A and the part C is not calculated in step S1 in FIG. 10.

FIG. 25 (B) illustrates a state after the value of the initial wiring difficulty degree has been calculated. In this example, the wiring difficulty degree of the bus global route 800 is not high, which causes the bus global route 800 to be displayed with a blue color. The designer can understand that the target bus global route 800 is not affected by other wirings when the designer sees the color of the bus global route 800 changes to a blue color.

In the example illustrated in FIG. 25 (C), a state is illustrated which is entered from the state illustrated in FIG. 25 (B) when the wiring designing of the ratsnest connected from the upper part terminal of the part B to the part terminal of the part C is performed. When such a wiring designing is performed, it is determined in step S3 in FIG. 10 that there is the instruction to change the wiring design. Then, the process routine goes to step S4 in FIG. 10 in which the changed difficulty degree calculation process part 21 calculates the wiring difficulty degree. In this example, the wiring designing from the part terminal of the part B to the part terminal of the part C illustrated in FIG. 25 (C) causes the differential of the wiring difficulty degree to be extracted. This result causes the process routine to go to step S5 in which the display part 10 outputs such a display as illustrated in FIG. 25 (D) such that the wiring difficulty degree can be distinguished.

FIG. 25 (D) illustrates an example of a way of displaying the wiring difficulty degree changed due to the wiring designing illustrated in FIG. 25 (C). In this example, the color of the bus global route is changed from blue to yellow. The designer can understand that the wiring designing illustrated in FIG. 25 (C) affects the bus global route when the designer sees the change in the color.

FIG. 26 (A) illustrates a state which is entered from the state illustrated in FIG. 25 (D) when the wiring designing of the ratsnest connected from the part terminal of the part B to the part terminal of the part C is completed. When such a wiring designing is performed, it is determined in step S3 in FIG. 10 that there is the instruction to change the wiring design. Then, the process routine goes to step S4 in FIG. 10 in which the changed difficulty degree calculation process part 21 calculates the route keeping difficulty degree (step S1-7-6 in FIG. 19). In step S1-7-7 in FIG. 19, only the route keeping difficulty degree is changed. In this example, it is assumed that it is determined that the influence of the change in the route keeping difficulty degree is not substantial, and thus the wiring difficulty degree is not changed. In this case, the color of the bus global route is not changed such that the display part 10 displays the bus global route with a yellow color (see FIG. 26 (B)).

FIG. 26 (B) illustrates an example of a way of displaying the wiring difficulty degree changed due to the wiring designing illustrated in FIG. 26 (A). The designer can understand that the wiring designing for connecting to the part terminal of the part C does not affect the surrounding unwired ratsnests and the unwired surrounding bus global route when the designer sees the unchanged color.

FIG. 26 (C) illustrates a state which is entered from the state illustrated in FIG. 26 (B) when the wiring designing of the ratsnest connected from the lower part terminal of the part B to the part terminal of the part C is performed. When such a wiring designing is performed, it is determined in step S3 in FIG. 10 that there is the instruction to change the wiring design. Then, the process routine goes to step S4 in FIG. 10 in which the changed difficulty degree calculation process part 21 calculates the route keeping wiring difficulty degree (step S1-7-6 in FIG. 19). In the example, it is assumed that it is determined in step S1-7-6 that the route keeping difficulty degree is "impossible" In this case, the display part 10 displays the color of the bus global route with a black color (see FIG. 26 (D)). In other words, there is a change in the wiring difficulty degree that causes the color of the bus global route to change from yellow to black. The designer can understand that the wiring design from the lower part terminal of the part B to the part terminal of the part C greatly affects the bus global route between the part A and the part B when the designer recognizes that the color of the wiring difficulty degree changes from yellow to black. As a result of this, the designer deletes a part of the wiring design from the lower part terminal of the part B to the part terminal of the part C as illustrated in FIG. 27 (A). Such a change or deletion of the wiring design causes the process routine to go to step S4 in FIG. 10 in which the changed difficulty degree calculation process part 21 calculates the changed wiring difficulty degree. The deletion of the part of the wiring design from the part B to the part C causes the wiring difficulty degree to decrease. The change in the wiring difficulty degree causes the display 10 to perform the process of step S5. In this case, as illustrated in FIG. 27 (B), the color of the bus global route from the part A to the part B changes from black to yellow. The designer can understand that the influence of the wiring design from the lower portion of the part B to the part C is decreased when the designer sees the changed color of the wiring difficulty degree of the bus global route.

In this way, according to the embodiment, the designer can visually understand how the wiring designing, which is being performed, affects other surrounding unwired ratsnests and bus global routes. In other words, the designer can quantitatively understand the influence on the unwired sections. The designer can recognize in advance how the wiring designing affects the unwired sections, which can reduce the probability that the designer has to manually reverse the layout design. The risk that a great change in the wiring arrangement may be required later in course of the layout designing can be reduced. Because the manually reversing operations are reduced, it can be predicted that the wiring designing time can be greatly reduced. As a result of this, time and effort for the layout designing can be reduced.

Next, the calculation of the wiring difficulty degree is explained in detail.

Figure 28:
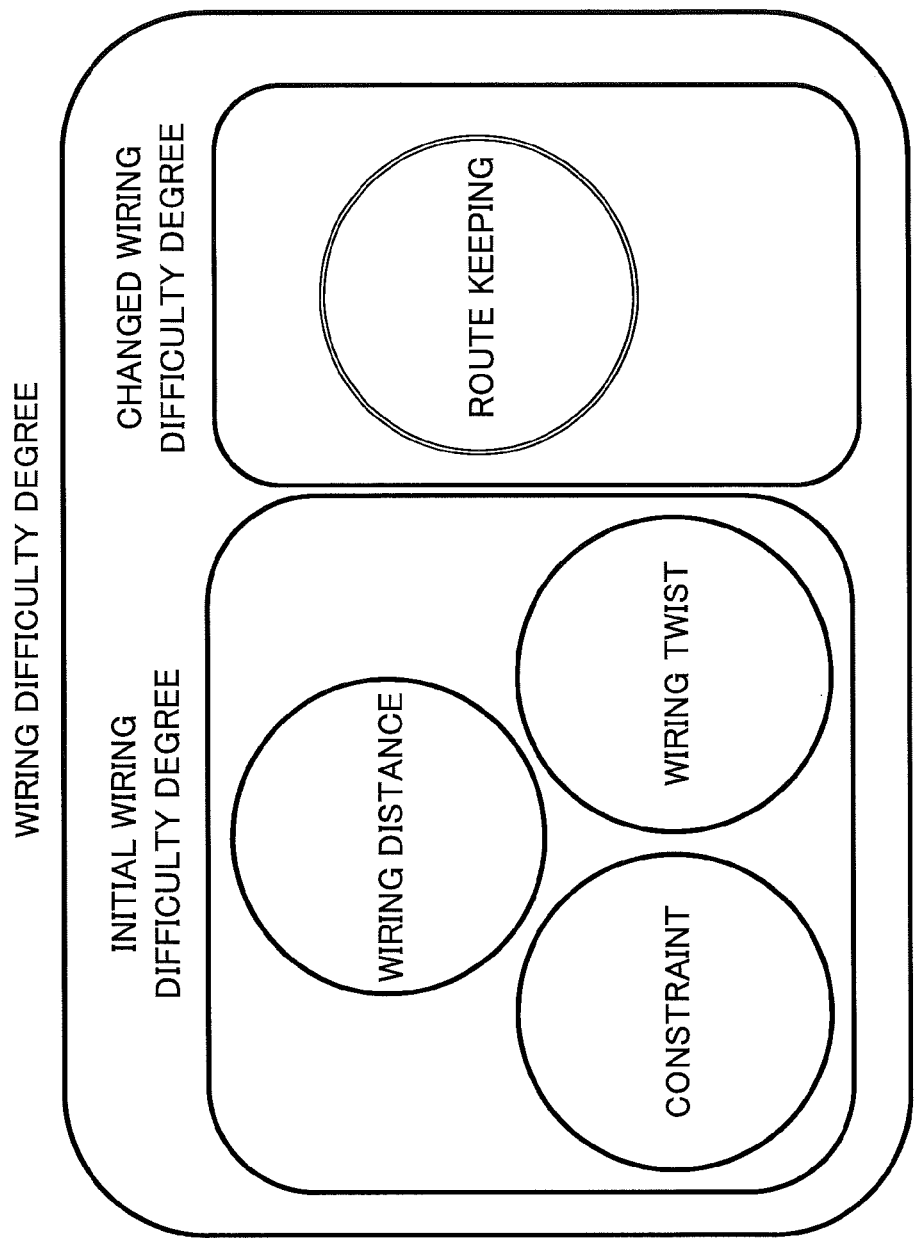
FIG. 28 is a diagram for explaining the wiring difficulty degree.

FIG. 28 is a diagram for explaining the wiring difficulty degree. The wiring difficulty degree includes the initial wiring difficulty degree and the changed wiring difficulty degree. There are three types of indexes for the initial wiring difficulty degree. The first index is a "wiring distance". The second index is a "constraint". The third index is a "wiring twist". The index for the changed wiring difficulty degree is a "route keeping". The respective wiring difficulty degrees are independent but are related to each other.

The difficulty degree related to the wiring distance is calculated for the bus global route and the ratsnest. Similarly, the difficulty degree related to the constraint is calculated for the bus global route and the ratsnest. The difficulty degree related to the wiring twist is calculated for only the bus global route. Further, the difficulty degree related to the route keeping is calculated for the bus global route and the ratsnest.

The wiring distance is measured between the terminals. The difficulty degree related to the wiring distance is calculated based on the distance between the terminals to be wired. With respect to the bus global route, the longest wiring distance or a representative wiring distance within the bus global route may be used. In general, the difficulty degree related to the wiring distance may be calculated such that the difficulty degree related to the wiring distance becomes lower as the wiring distance becomes shorter.

The constraint is related to the wiring designing. However, the constraint does not include a wiring width and a wiring clearance that are fundamental conditions. The constraint may be related to a wiring length, a length equalization, a parallel spacing, a wiring priority, an element connection order, etc. The constraint is set in the constraint data 211 in the CAD data storage part 12. It is noted that, under the constraint related to the wiring length, it is necessary to perform the wiring designing with a specified wiring length. The constraint related to the wiring length can be defined by the wiring length or a delayed time, and may have a margin. The constraint may be varied according to characteristics of the wiring (high-speed signal level to be handled with in the net, for example), types of the parts to be connected, etc.

The wiring twist may correspond to a number of the ratsnests in the bus global route that cannot be simply connected (i.e., some efforts are required for the connection) between the specified terminals for connecting the parts.

The route keeping represents whether the wiring route set by the designer can be kept. The difficulty degree related to the route keeping represents a degree of an influence the other wiring designing has on the target unwired section.

Figure 29:
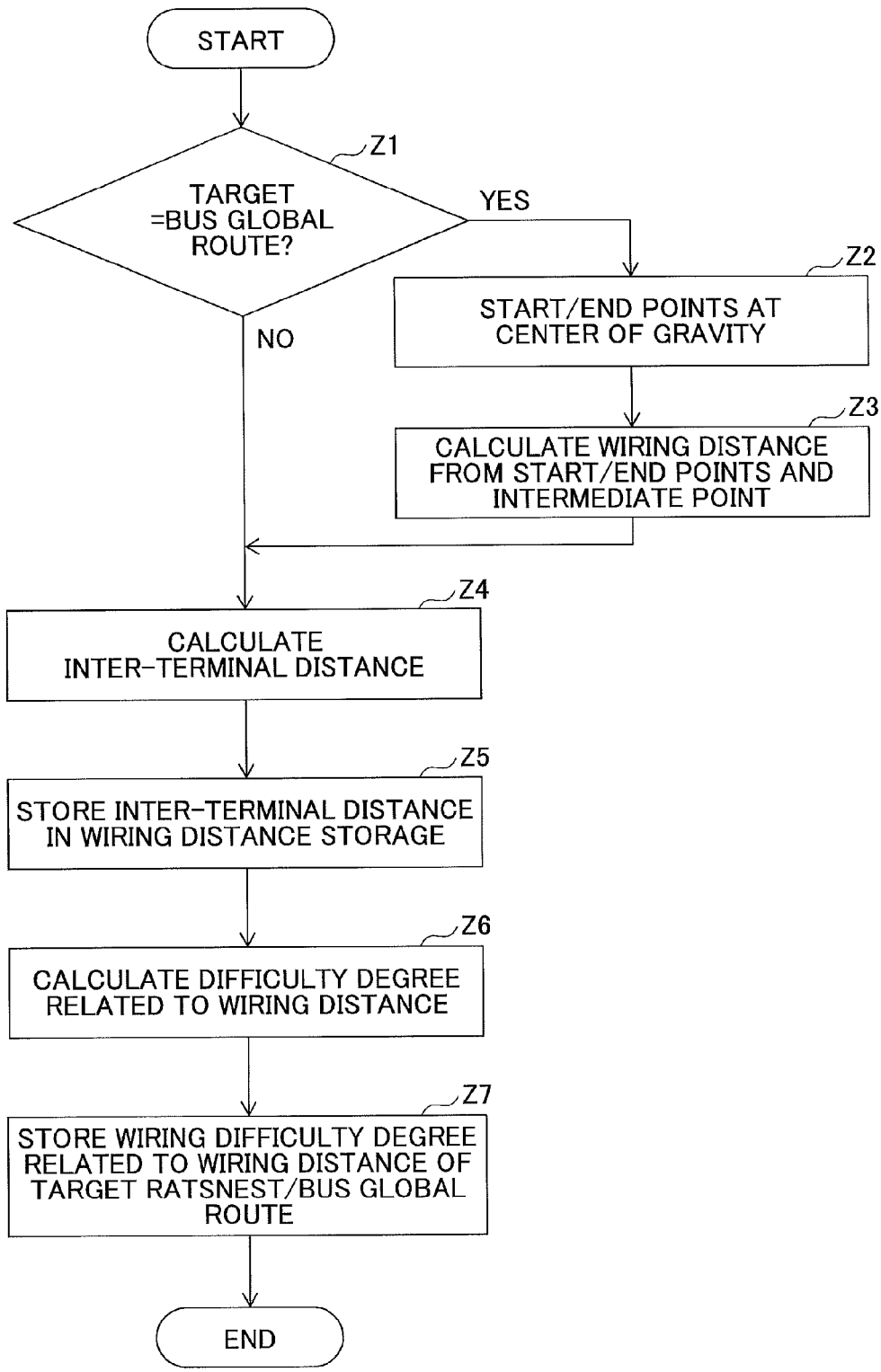
FIG. 29 is a flowchart illustrating an example of a process of a wiring distance difficulty degree process part.

FIG. 29 is a flowchart illustrating an example of the process of the wiring distance difficulty degree process part 40 (the process of step S1-7-2 in FIG. 19).

In step Z1, the wiring distance difficulty degree process part 40 determines whether the target for which the difficulty degree is to be calculated is the bus global route. If the target for which the difficulty degree is to be calculated is the bus global route, the process routine goes to step Z2, otherwise (i.e., if the target is the ratsnest) the process routine goes to step Z4.

In step Z2, the wiring distance difficulty degree process part 40 calculates the centers of gravity of the terminal groups of the bus global route to define the respective centers of gravity as a start point and an end point.

In step Z3, the wiring distance difficulty degree process part 40 calculates the wiring distance based on the start point, the end point and an intermediate point.

In step Z4, the wiring difficulty degree process part 40 calculates an inter-terminal distance.

In step Z5, the wiring difficulty degree process part 40 stores the inter-terminal distance in the wiring distance storage part 51.

Figure 30:
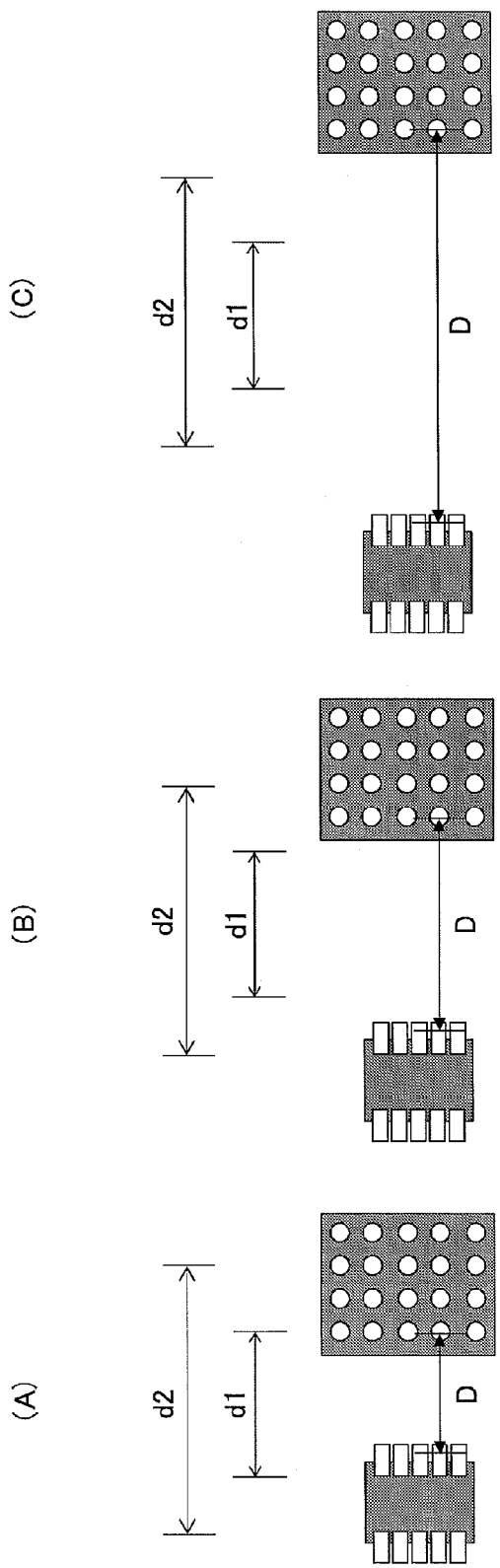
FIG. 30 is a diagram for explaining a case where a distance between terminals is determined along a straight line.

In step Z6, the wiring difficulty degree process part 40 calculates the difficulty degree related to the wiring distance based on the inter-terminal distance. For example, in the case of using a reference illustrated in FIG. 12, if the inter-terminal distance D is less than or equal to a predetermined value d1 (see FIG. 30 (A)), the wiring distance difficulty degree process part 40 determines the difficulty degree related to the wiring distance to be "0". If the inter-terminal distance D is greater than a predetermined value d1 and less than or equal to a predetermined value d2 (see FIG. 30 (B)), the wiring distance difficulty degree process part 40 determines the difficulty degree related to the wiring distance to be "1". If the inter-terminal distance D is greater than the predetermined value d2 (see FIG. 30 (C)), the wiring distance difficulty degree process part 40 determines the difficulty degree related to the wiring distance to be "2". The predetermined value d1 may be an ideal wiring distance set by the designer. The predetermined value d2 may be an upper limit of a permissible wiring distance set by the designer. The predetermined values d1 and d2 may be default values. It is noted that, in the example, the difficulty degree related to the wiring distance is set in three steps; however, it is not limited to the three steps, and thus it may be set in two steps or more than three steps.

In step Z7, the wiring distance difficulty degree process part 40 stores the calculated difficulty degree related to the wiring distance (the difficulty degree with respect to the ratsnest or the bus global route) in the CAD data storage part 12.

Figure 31:
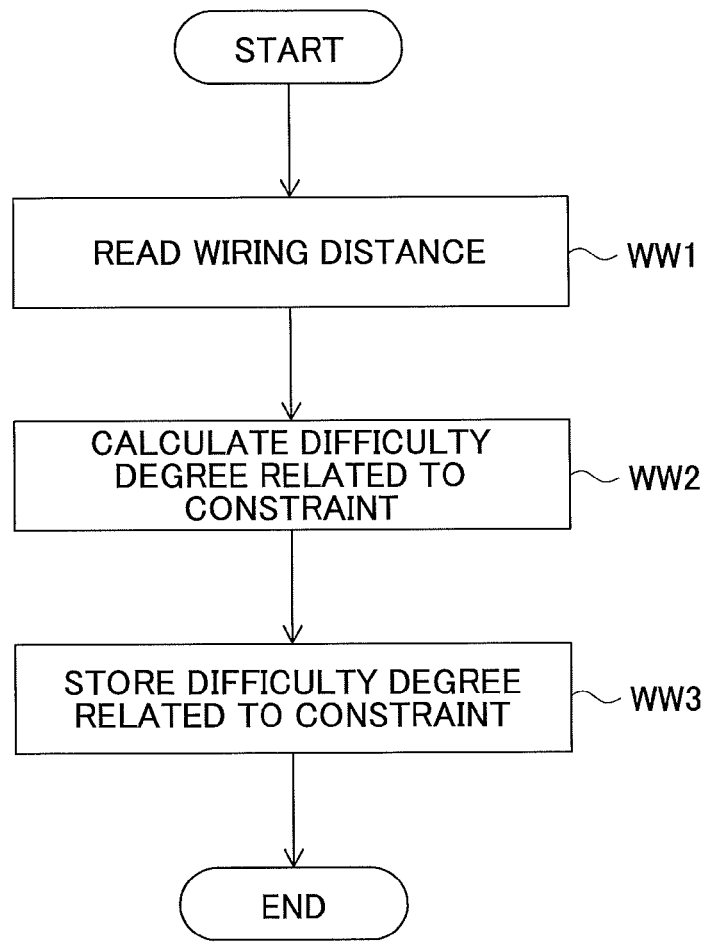
FIG. 31 is a flowchart illustrating an example of a process of a constraint difficulty degree process part.

FIG. 31 is a flowchart illustrating an example of the process of the constraint difficulty degree process part 41 (the process of step S1-7-3 in FIG. 19).

In step WW1, the constraint difficulty degree process part 41 reads the wiring distance from the wiring distance storage part 51 of the wiring distance difficulty degree process part 40 of the initial difficulty degree calculation process part 20. It is noted that the wiring distance to be used corresponds to the wiring distance that is calculated in calculating the difficulty degree related to the wiring distance in step S1-7-2. For this reason, the calculation of the difficulty degree related to the wiring distance in step S1-7-2 is performed prior to the calculation of the difficulty degree related to the constraint in step S1-7-3 (see FIG. 19).

Figure 32:
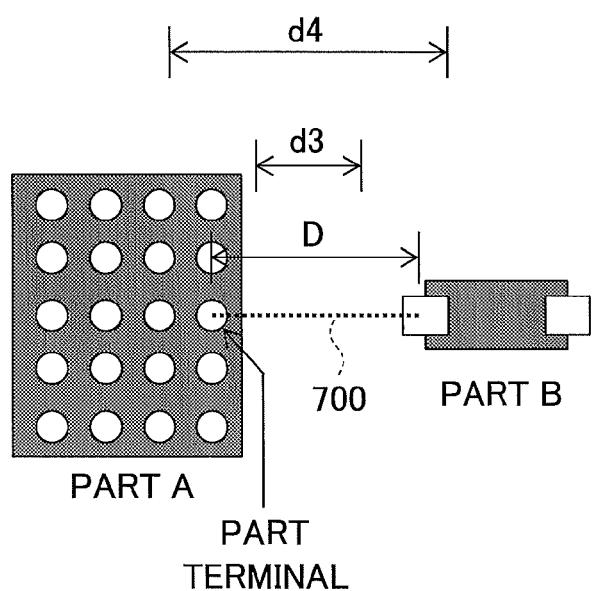
FIG. 32 is a diagram for explaining an example of a way of calculating a difficulty degree related to a constraint.

In step WW2, the wiring difficulty degree process part 41 calculates the difficulty degree related to the constraint based on the wiring distance. For example, in FIG. 32, an example is illustrated in which a lower limit value d3 and an upper limit value d4 are set with respect to the wiring length from the part terminal of the part A to the part terminal of the part B (a damping resistor, in this example). The lower limit of the wiring length represents the minimum value of the specified wiring length and the upper limit of the wiring length represents the maximum value of the specified wiring length. It is noted that the reference for the difficulty degree related to the constraint is not freely set by the designer, unlike the reference for the difficulty degree related to the wiring distance. In the example, the constraint difficulty degree process part 41 uses the straight distance from the part terminal of the part A to the part terminal of the part B to calculate the difficulty degree related to the constraint. Specifically, in the case of using the reference illustrated in FIG. 13, if the wiring distance D is greater than or equal to d3 and less than or equal to d4, the constraint difficulty degree process part 41 determines the difficulty degree related to the constraint to be "0". When the wiring distance D is shorter than d3 by less than or equal to 10% of d3, the constraint difficulty degree process part 41 determines the difficulty degree related to the constraint to be "1". When the wiring distance D is shorter than d3 by less than or equal to 20% of d3, the constraint difficulty degree process part 41 determines the difficulty degree related to the constraint to be "2". When the wiring distance D is greater than d4, the constraint difficulty degree process part 41 determines the difficulty degree related to the constraint to be "impossible". It is noted that, in the example, the difficulty degree related to the constraint is set in four steps; however, it is not limited to the four steps, and thus it may be set in three steps or more than four steps.

In step WW3, the constraint difficulty degree process part 41 stores the calculated difficulty degree related to the constraint (the difficulty degree with respect to the ratsnest or the bus global route) in the CAD data storage part 12.

Figure 33:
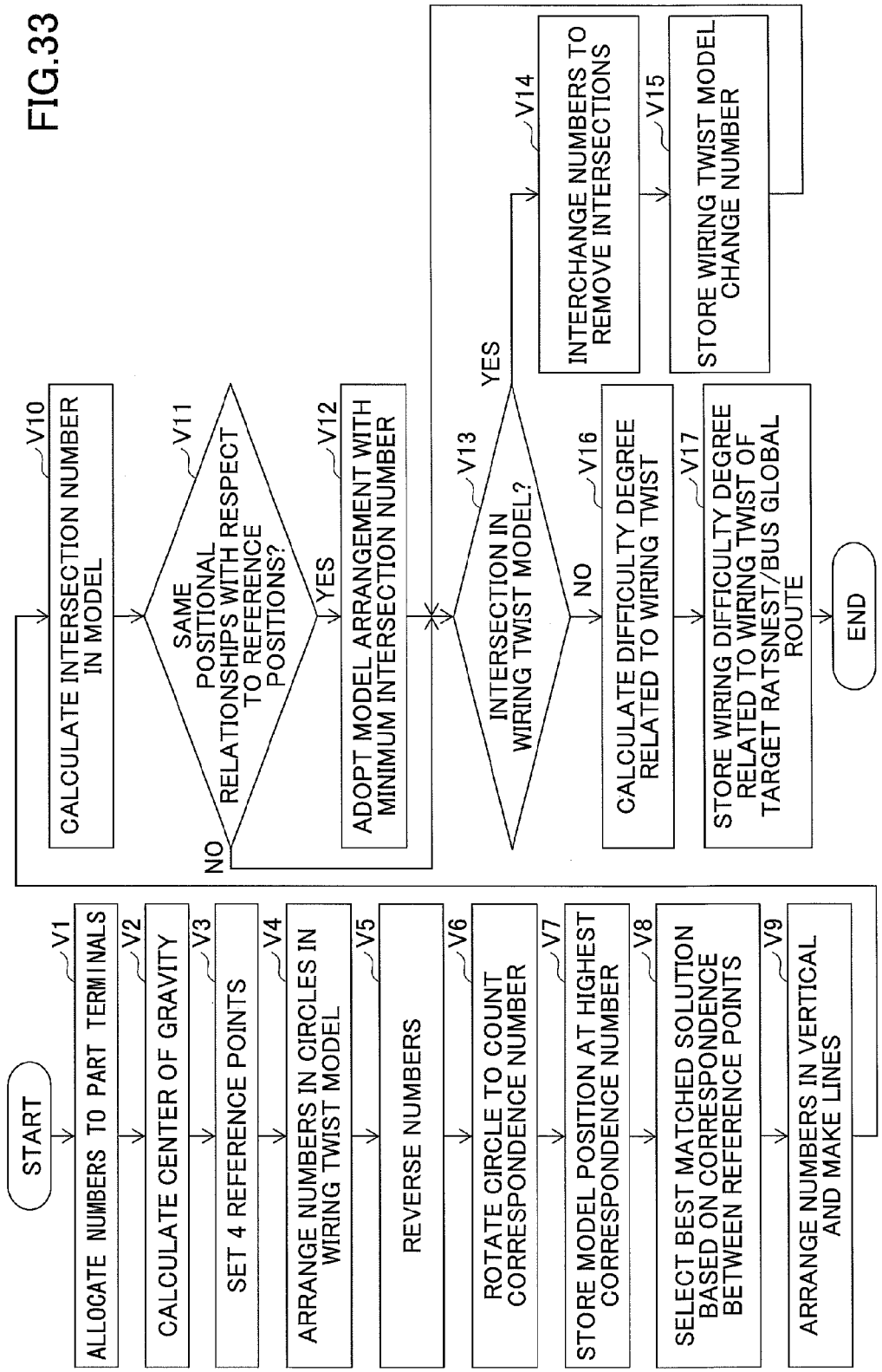
FIG. 33 is a flowchart illustrating an example of a process of a wiring twist difficulty degree calculation process part.

FIG. 33 is a flowchart illustrating an example of the process of the wiring twist difficulty degree calculation process part 80 (the process of step S1-7-5 in FIG. 19).

Figure 34:
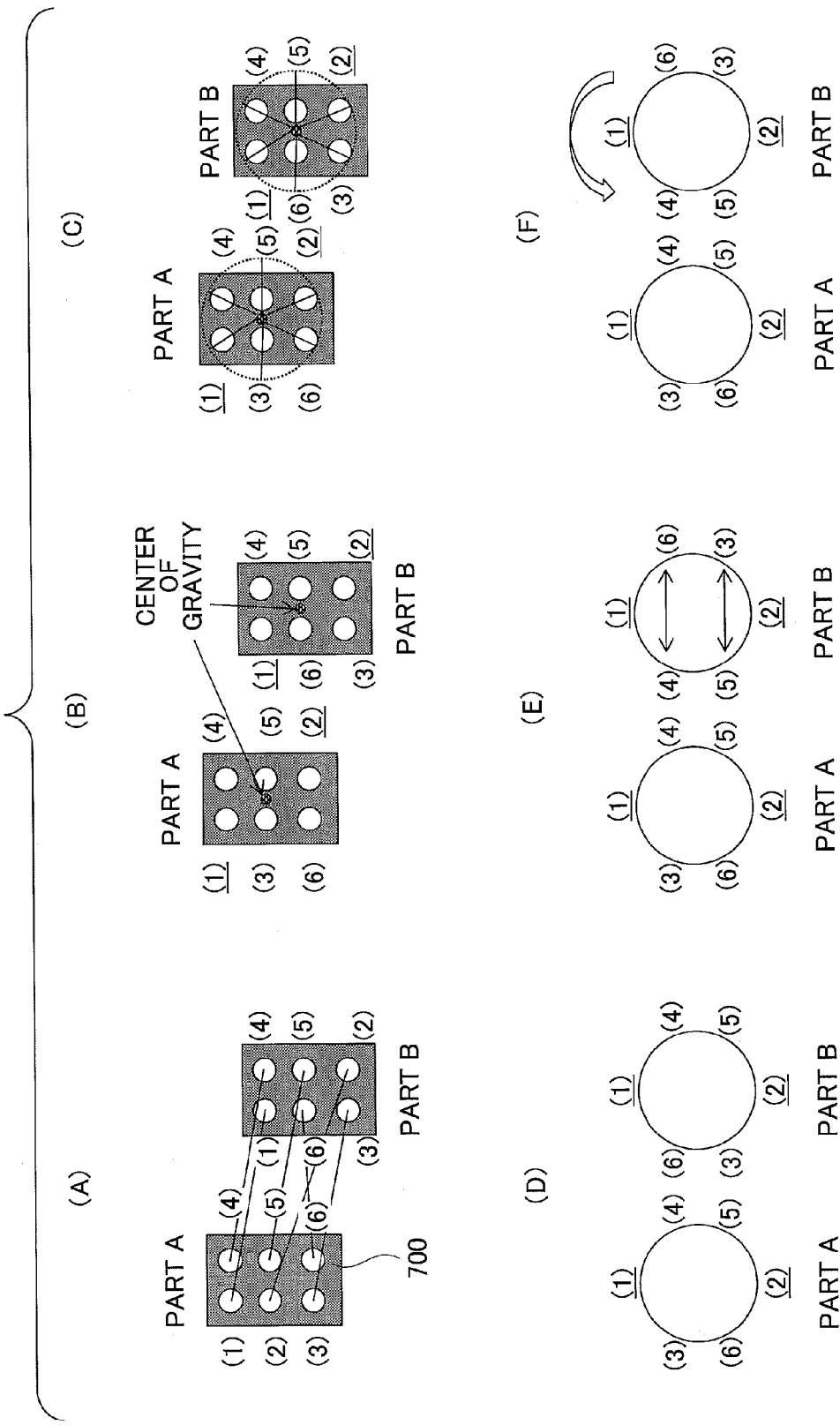
FIG. 34 is a diagram for explaining an example of a way of calculating a difficulty degree related to the wiring twist.

In step V1, the wiring twist process part 81 allocates numbers to the part terminals of the respective parts to be connected. For example, as illustrated in FIG. 34 (A), the wiring twist process part 81 sets the respective numbers for the targets to which the part A and the part B are to be connected. In FIG. 34 (A), etc., the numbers are illustrated in circle marks. In the following, the terminal whose circle mark has the number "1" is also referred to as "a first terminal", the terminal whose circle mark has the number "2" is also referred to as "a second terminal", and so on. It is noted that FIG. 34 (A) illustrates the ratsnests 700 in the target bus global route. Here, as an example, a way of calculating the difficulty degree related to wiring twist with respect to the bus global route that is formed by the six ratsnests 700 is explained.

In step V2, the wiring twist process part 81 calculates the center of gravity of the part terminal group.

In step V3, the wiring twist process part 81 sets four reference points. For example, as illustrated in FIG. 34 (B), the wiring twist process part 81 sets the reference points at corners indicated by underlines of the numbers of the part terminals. In the case of the part A, the farther end of the part terminal (i.e., the first terminal), when viewed from the part B to be connected, is set as the reference point. In the case of the part B, the farther end of the part terminal (i.e., the second terminal), when viewed from the part A to be connected, is set as the reference point. By setting the reference points, the length of the wiring at the time of actually performing the wiring can be made shorter. The wiring twist process part 81 stores the reference points as reference points of a wiring twist model in a buffer area of the wiring twist process part 81.

In step V4, the wiring twist process part 81 extends a line from the centers of gravity to the connection points to form circles and arrange the numbers of the terminals in the wiring twist model. In this case, as illustrated in FIG. 34 (C), the wiring twist process part 81 obtains the numbers in a clockwise distance from the reference point with respect to the part A, and obtains the numbers in a counterclockwise distance from the reference point with respect to the part B. As a result of this, as illustrated in FIG. 34 (D), the numbers of the terminals are arranged around the circles.

In step V5, the wiring twist process part 81 arranges the order of the numbers around the circle in the wiring twist model such that the order is reversed. For example, as schematically illustrated by arrows in FIG. 34 (E), the wiring twist process part 81 changes the order of the numbers around the circle related to the part B such that the order is reversed. In the example illustrated in FIG. 34 (E), the first terminal and the third terminal of the part B are reversed in a left and right direction, and the fifth terminal and the second terminal of the part B are reversed in a left and right direction.

In step V6, the wiring twist process part 81 rotates the circle related to the part B in the wiring twist model in the counterclockwise direction to search for the point where the arrangement of the numbers match between the part A and the part B, as illustrated in FIG. 34 (F). In other words, the wiring twist process part 81 rotates the circle related to the part B to search for the point where the arrangement of the numbers in the wiring twist model match the best between the part A and the part B.

In step V7, the wiring twist process part 81 stores, in the buffer area of the wiring twist process part 81 of the wiring twist difficulty degree process part 42, the rotational position of the circle in the wiring twist model when the number of correspondences is great. Here, as an example, as illustrated in FIG. 35 (A), such a case is assumed where two rotational positions (solution 1 and solution 2) at which the number of correspondences is two are found out.

Figure 35:
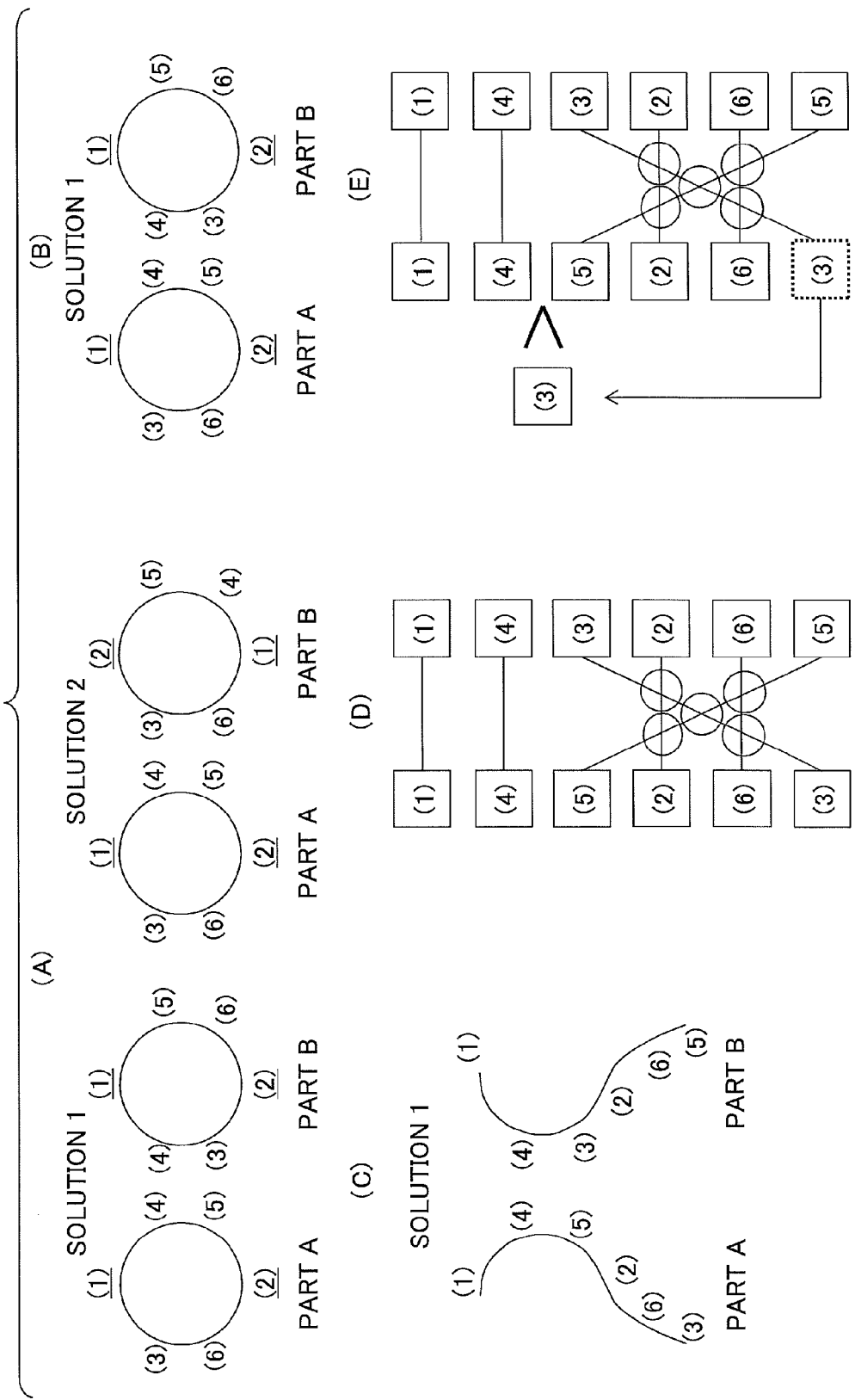
FIG. 35 is a diagram for explaining an example of a way of calculating a difficulty degree related to the wiring twist.

In step V8, the wiring twist process part 81 compares the reference points to adopt the rotational position at which the reference points are closest, as illustrated in FIG. 35 (B). In this case, as illustrated in FIG. 35 (B), the solution 1 is adopted in which the reference points are overlapped.

In step V9, the wiring twist process part 81 releases the circles to arrange the numbers in a vertical direction according to the arrangement that correspond to the actual arrangement, as illustrated in FIG. 35 (C). Then, the wiring twist process part 81 linearly arranges the numbers in the vertical direction and generates lines between the corresponding numbers, as illustrated in FIG. 35 (D). In this state, the wiring becomes difficult at the positions where the lines intersect.

In step V10, the wiring twist process part 81 stores the number of the intersections in the wiring twist model. The number of the intersections in the wiring twist model is the number of the intersections between the lines generated in step V9.

In step V11, the wiring twist process part 81 determines whether there is an arrangement of the wiring twist model at which the positional relationships with respect to the reference points are the same. If there is an arrangement of the wiring twist model at which the positional relationships with respect to the reference points are the same, the process routine goes to step V12, otherwise the routine goes to step V13.

In step V12, the wiring twist process part 81 adopts the arrangement of the wiring twist model at which the number of the intersections is minimum. Here, as schematically illustrated by the circle marks in illustrated in FIG. 35 (E), there are five intersections.

In step V13, the wiring twist process part 81 determines whether there is any intersection in the wiring twist model. If there is any intersection in the wiring twist model, the process routine goes to step V14, otherwise the process routine goes to step V16.

In step V14, the wiring twist process part 81 changes the arrangement of the wiring twist model such that the number at which the intersection occurs is placed above the number at the intersection occurs until the intersections are removed, as illustrated in FIG. 35 (E). In the example illustrated in FIG. 35 (E), the third terminal and the fifth terminal intersect, and the fifth terminal is placed above the third terminal.

Figure 36:
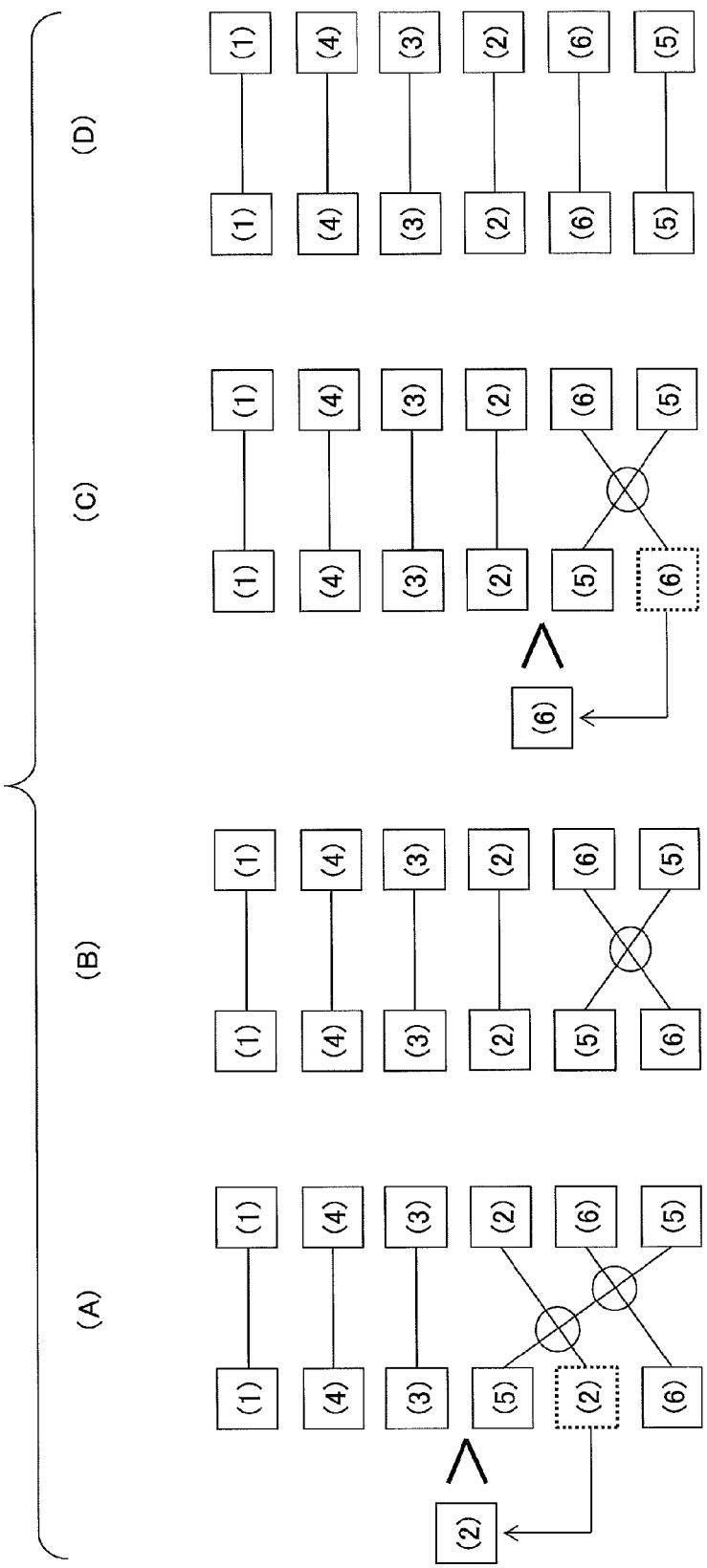
FIG. 36 is a diagram for explaining an example of a way of calculating a difficulty degree related to the wiring twist.

In step V15, the wiring twist process part 81 add, in the wiring twist model change number storage part 82 of the wiring twist difficulty degree process part 42, the number of times of changing the place that is required to remove the intersections. The number of times of change of places corresponds to the times of changing place performed in step V14. Such changing the place is repeated until the intersections are removed, as illustrated in FIG. 36 (A) through FIG. 36 (D). Whenever the intersection is removed, the number of times of changing the place in the wiring twist model change number storage part 82 is incremented.

In step V16, the wiring twist process part 81 calculates the difficulty degree related to the wiring twist. For example, the wiring twist process part 81 calculates the difficulty degree level related to the wiring twist based on a comparison between the total number of the wiring twists and the number of times of changing the place. For example, in the example, the wiring twist is formed in six patterns and the number of times of changing the place is "3". Thus, the percentage is "50" by dividing "3" by "6". The difficulty degree level related to the wiring twist is as illustrated in FIG. 14. In this case, if the number of times of changing the place (i.e., the number of interchanges) is "1", the wiring twist process part 81 determines the difficulty degree related to the wiring twist to be "0". Further, the percentage of the number of times of changing the place with respect to the total wiring twist number is less than or equal to 60%, the wiring twist process part 81 determines the difficulty degree related to the wiring twist to be "1". Further, the percentage of the number of times of changing the place with respect to the total wiring twist number is greater than 60%, the wiring twist process part 81 determines the difficulty degree related to the wiring twist to be "2". It is noted that, in the example, the difficulty degree related to the wiring twist is set in three steps; however, it is not limited to the three steps, and thus it may be set in two steps or more than three steps. Further, the difficulty degree related to the wiring twist is calculated based on the number of the intersections in the wiring twist model; however, other methods may be used.

In step V17, the wiring twist process part 81 stores the calculated difficulty degree related to the wiring twist (the difficulty degree with respect to the ratsnest or the bus global route) in the CAD data storage part 12.

Figure 37:
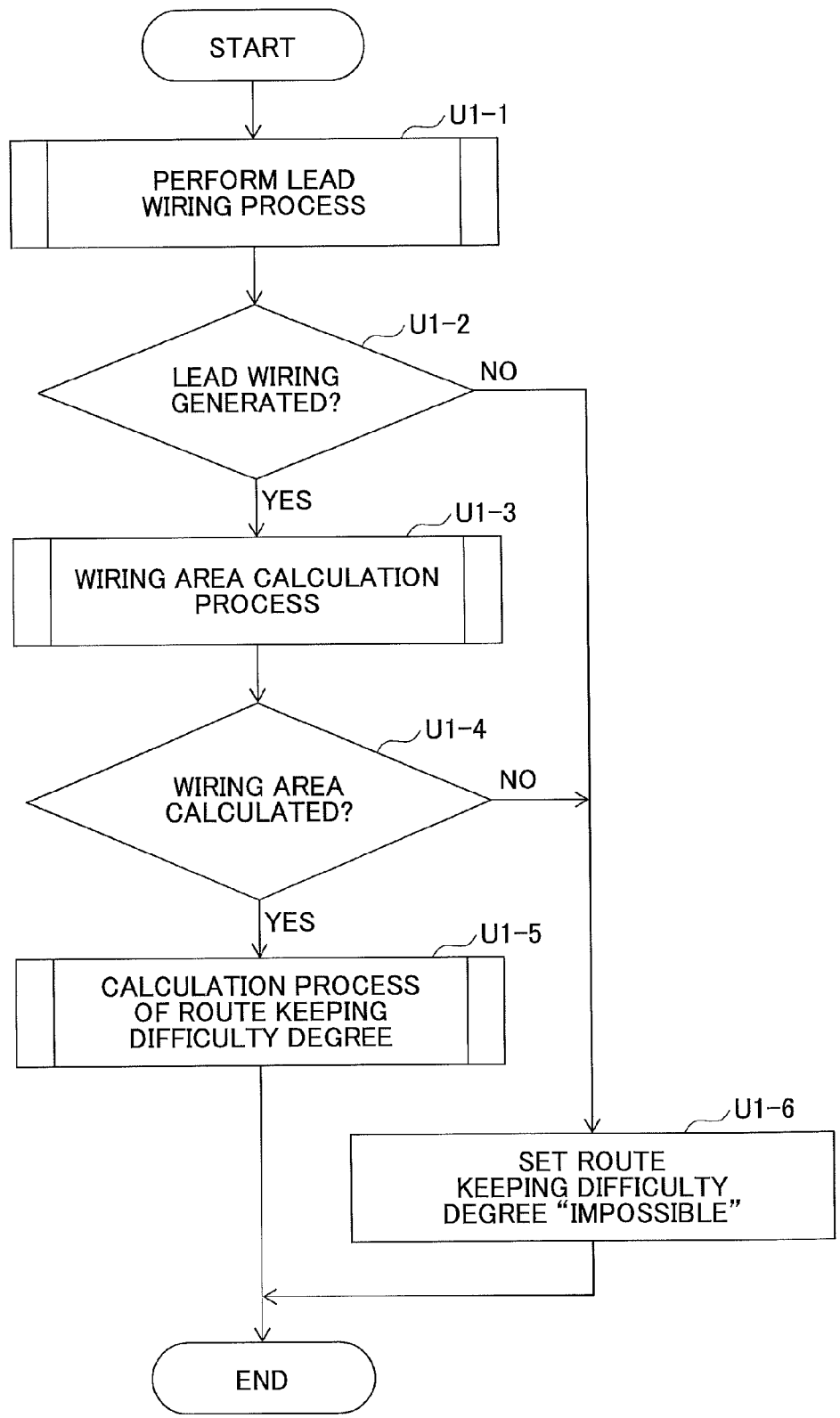
FIG. 37 is a flowchart illustrating an example of a process of a route keeping difficulty degree process part.

FIG. 37 is a flowchart illustrating an example of the process of the route keeping difficulty degree process part 43 (the process of step S1-7-6 in FIG. 19).

In step U1-1, the route keeping difficulty degree process part 43 performs a lead wiring process. This process is described hereinafter. It is noted that "lead wiring" means generating a lead wire outside the part in the case where there is a part terminal within the part. It is noted that, the "lead wiring process" is an internal process for the following determination, and does not mean a process for actually generating the lead wiring as an actual wiring designing.

In step U1-2, the route keeping difficulty degree process part 43 determines whether a lead wire can be generated. If a lead wire can be generated, the process routine goes to step U1-3, otherwise the process routine goes to step U1-6. It is noted that cases where the a lead wire cannot be generated includes a case where there is another adjacent part, etc., outside the target part, etc.

In step U1-3, the route keeping difficulty degree process part 43 performs a wiring available area calculation process. The wiring available area is an area of a region where a possibility that the wiring of the target ratsnest or bus global route can be designed is high. This process is described hereinafter.

In step U1-4, the route keeping difficulty degree process part 43 determines whether the lead available area has been calculated. If the lead available area has been calculated, the process routine goes to step U1-5, otherwise the process routine goes to step U1-6.

In step U1-5, the route keeping difficulty degree process part 43 performs the route keeping difficulty degree calculation process. This process is described hereinafter.

In step U1-6, the route keeping difficulty degree process part 43 determines the route keeping difficulty degree to be "impossible".

Figure 38:
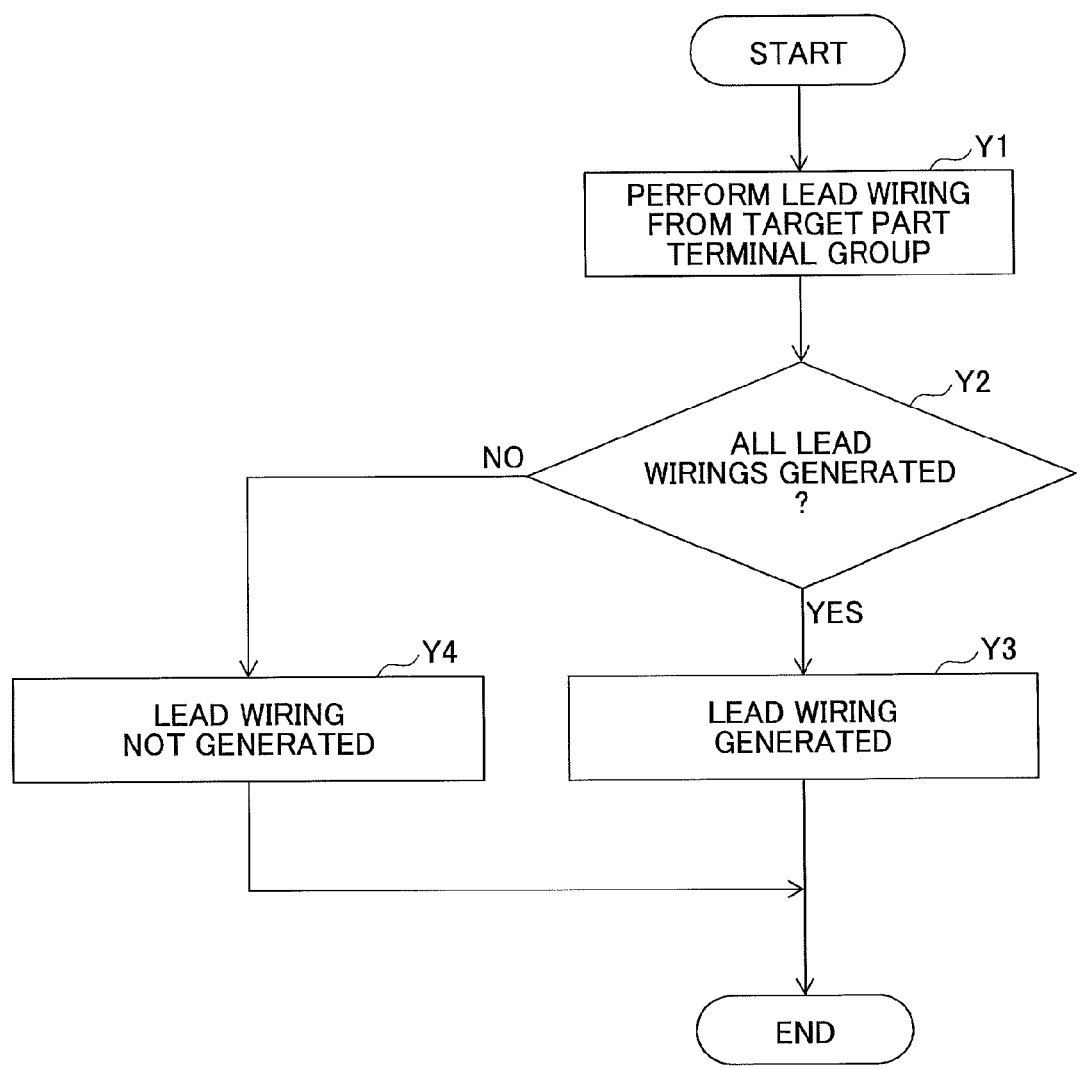
FIG. 38 is a flowchart illustrating an example of a process of step U1-1 in FIG. 37.

FIG. 38 is a flowchart illustrating an example of the process of step U1-1 in FIG. 37.

Figure 39:
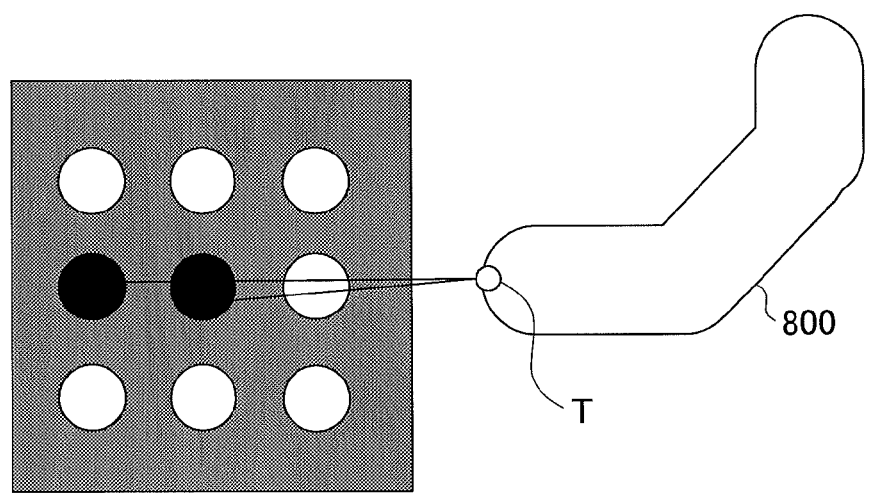
FIG. 39 is a diagram for explaining a target point T.

In step Y1, the route keeping difficulty degree process part 43 generates the lead wires from the target part terminal group. A way of generating the lead wires may be arbitrary. For example, the way disclosed in Japanese Laid-open Patent Publication No. 2010-211753 (Patent Document 2), the entire contents of which are hereby incorporated by reference, may be used. In this case, the route keeping difficulty degree process part 43 draws a graph of the target part to provide nodes "In" and "Out" in a cell. The route keeping difficulty degree process part 43 provides one flow-out node outside the part and provides one target point T (see FIG. 39). The route keeping difficulty degree process part 43 forms respective branches from the respective points. The route keeping difficulty degree process part 43 performs the lead wiring process using a maximum flow algorithm for searching for the route.

In step Y2, the route keeping difficulty degree process part 43 determines whether the lead wires from the target part terminal group have been generated. It is noted that, in the example illustrated in FIG. 39, the target point T is set at the end of the bus global route 800. If the lead wires from the target part terminal group has been generated, the process routine goes to step Y3, otherwise the process routine goes to step Y4.

In step Y3, the route keeping difficulty degree process part 43 generates information that represents that the lead wires have been generated. In this case, the determination result of step U1-2 in FIG. 37 becomes "YES".

In step Y4, the route keeping difficulty degree process part 43 generates information that represents that the lead wires cannot be generated. In this case, the determination result of step U1-2 in FIG. 37 becomes "NO".

Figure 40:
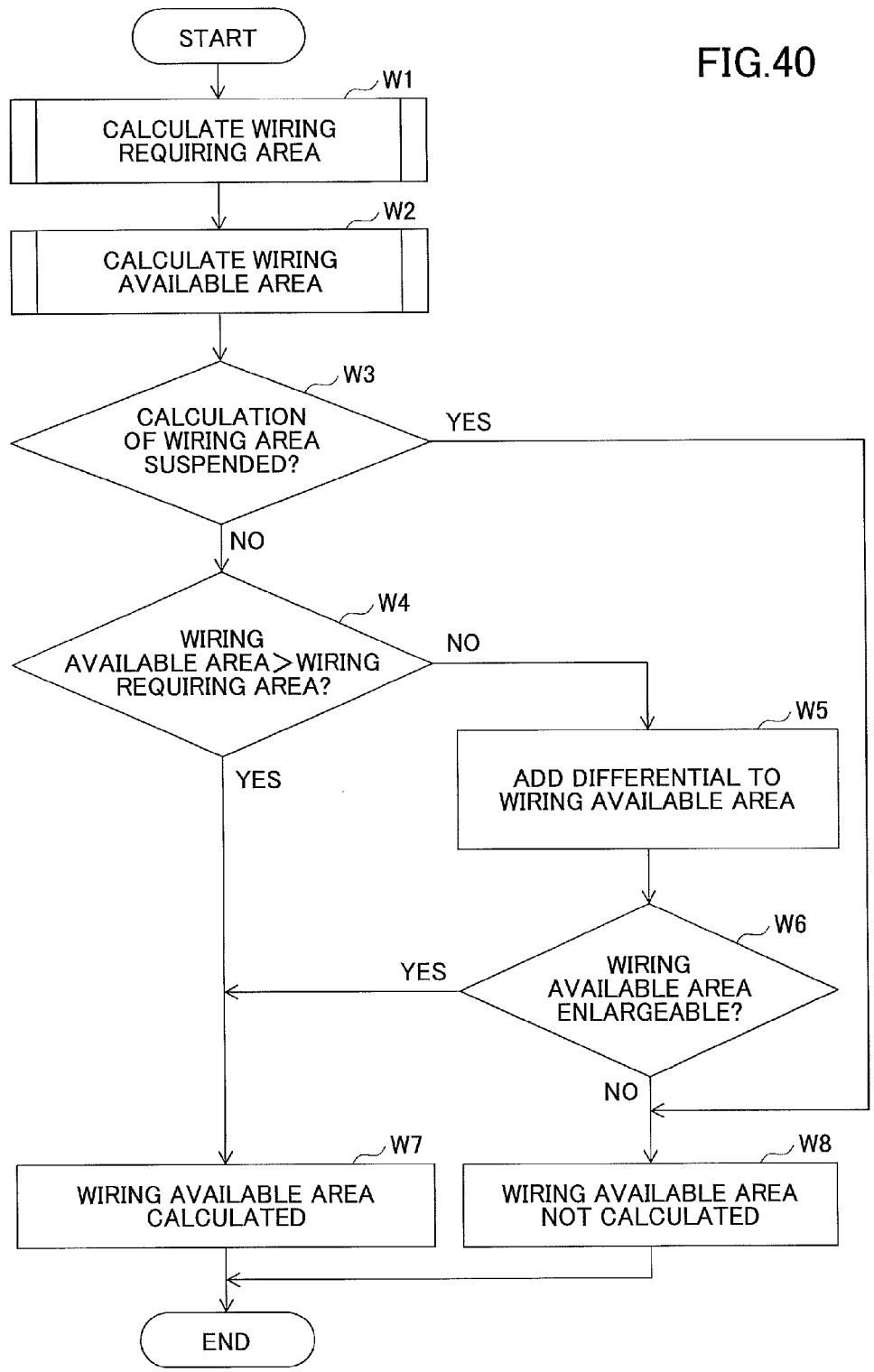
FIG. 40 is a flowchart illustrating an example of a process of step U1-3 in FIG. 37.

FIG. 40 is a flowchart illustrating an example of the process of step U1-3 in FIG. 37.

Figure 41:
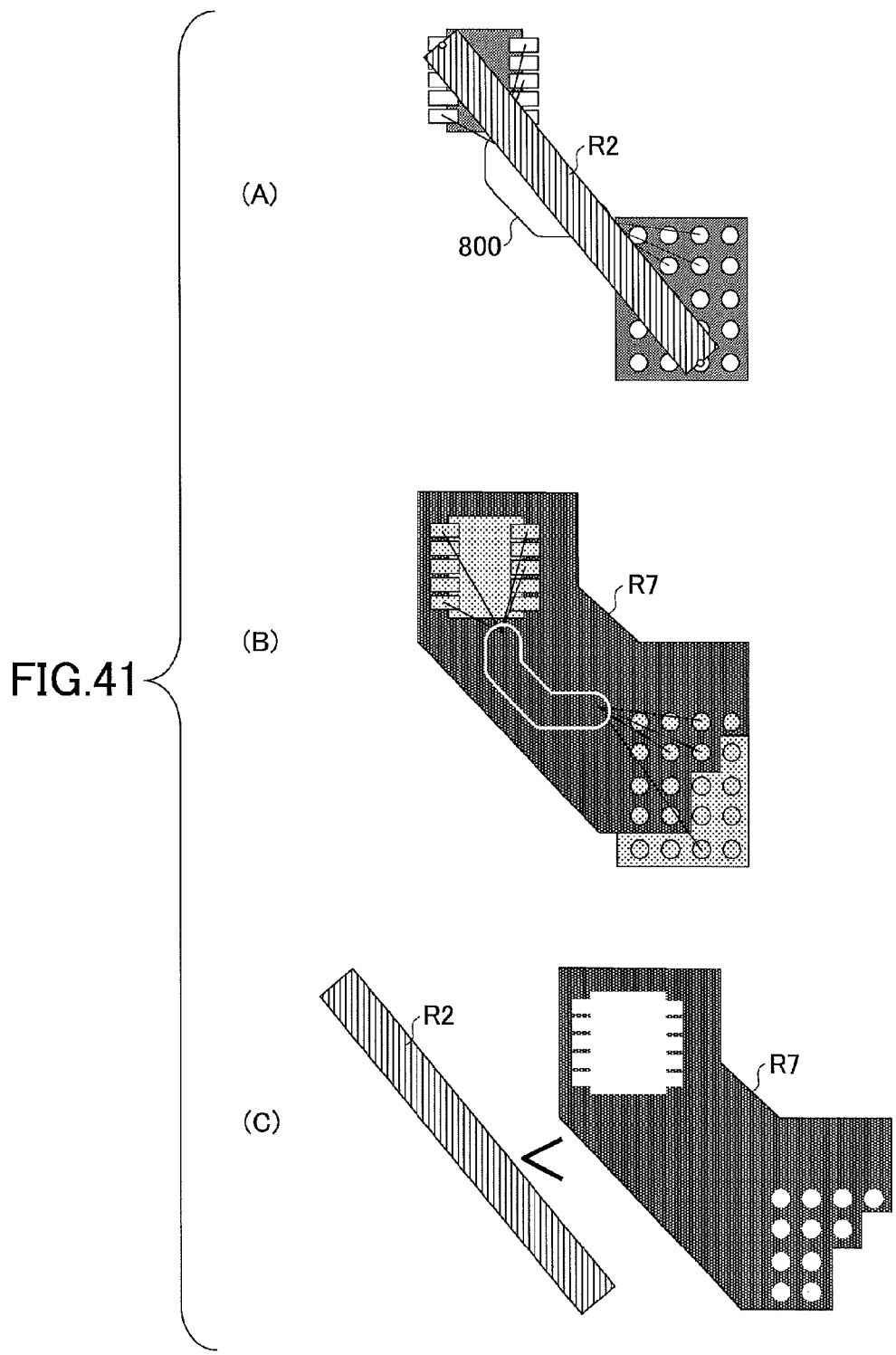
FIG. 41 is a diagram for explaining a wiring available area, etc.

In step W1, the wiring requiring area calculation process part 73 of the route keeping difficulty degree process part 43 calculates the wiring requiring area. The wiring requiring area is an area of a region that is required to design the wiring of the target ratsnest or bus global route. This process is described hereinafter. In the example illustrated in FIG. 41 (A), the wiring requiring area R2 for the bus global route 800 is illustrated.

In step W2, the wiring available area calculation process part 74 calculates the wiring available area. The wiring available area is an area of a region where a possibility that the wiring of the target ratsnest or bus global route can be designed is high. This process is described hereinafter. In the example illustrated in FIG. 41 (B), the wiring available area R7 for the bus global route 800 is illustrated.

In step W3, the wiring available area calculation process part 74 determines whether the calculation of the wiring available area is suspended. If the calculation of the wiring available area is suspended, the process routine goes to step W8, otherwise the process routine goes to step W4.

In step W4, the wiring available area calculation process part 74 determines whether the wiring available area is greater than the wiring requiring area. In the example illustrated in FIG. 41 (C), the wiring available area R7 is greater than the wiring requiring area R2. If the wiring available area is greater than the wiring requiring area, the process routine goes to step W7, otherwise the process routine goes to step W5.

In step W5, the wiring available area calculation process part 74 adds the differential (a shortfall) between the wiring available area and the wiring requiring area to the wiring available area.

In step W6, the wiring available area calculation process part 74 determines whether the wiring available area can be enlarged to the value added in step W5. If the wiring available area can be enlarged, the process routine goes to step W7, otherwise the process routine goes to step W8.

In step W7, the wiring available area calculation process part 74 generates information that represents that the wiring available area can be calculated. In this case, the determination result of step U1-4 in FIG. 37 becomes "YES".

In step W8, the wiring available area calculation process part 74 generates information that represents that the wiring available area cannot be calculated. In this case, the determination result of step U1-4 in FIG. 37 becomes "NO".

Figure 42:
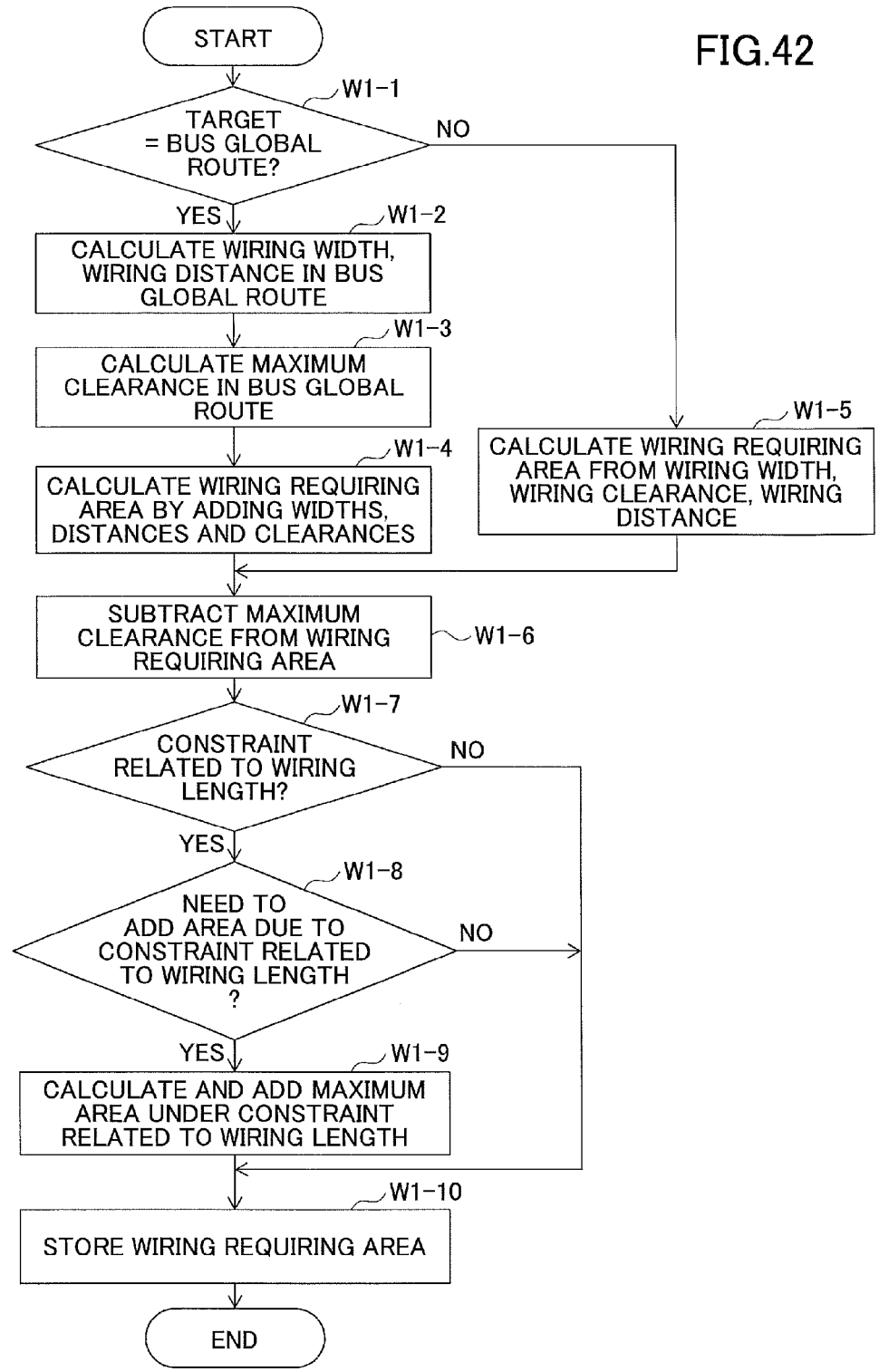
FIG. 42 is a flowchart illustrating an example of a process of step W1 in FIG. 40.

FIG. 42 is a flowchart illustrating an example of the process of step W1 in FIG. 40.

In step W1-1, the wiring requiring area calculation process part 73 determines whether the target for which the wiring requiring area is to be calculated is the bus global route. If the target for which the target for which the wiring requiring area is to be calculated is the bus global route, the process routine goes to step W1-2, otherwise (i.e., if the target is the ratsnest) the process routine goes to step W1-5.

In step W1-2, the wiring requiring area calculation process part 73 calculates the wiring width and the wiring distance with respect to the target bus global route.

In step W1-3, the wiring requiring area calculation process part 73 calculates the maximum clearance with respect to the target bus global route.

Figure 43:
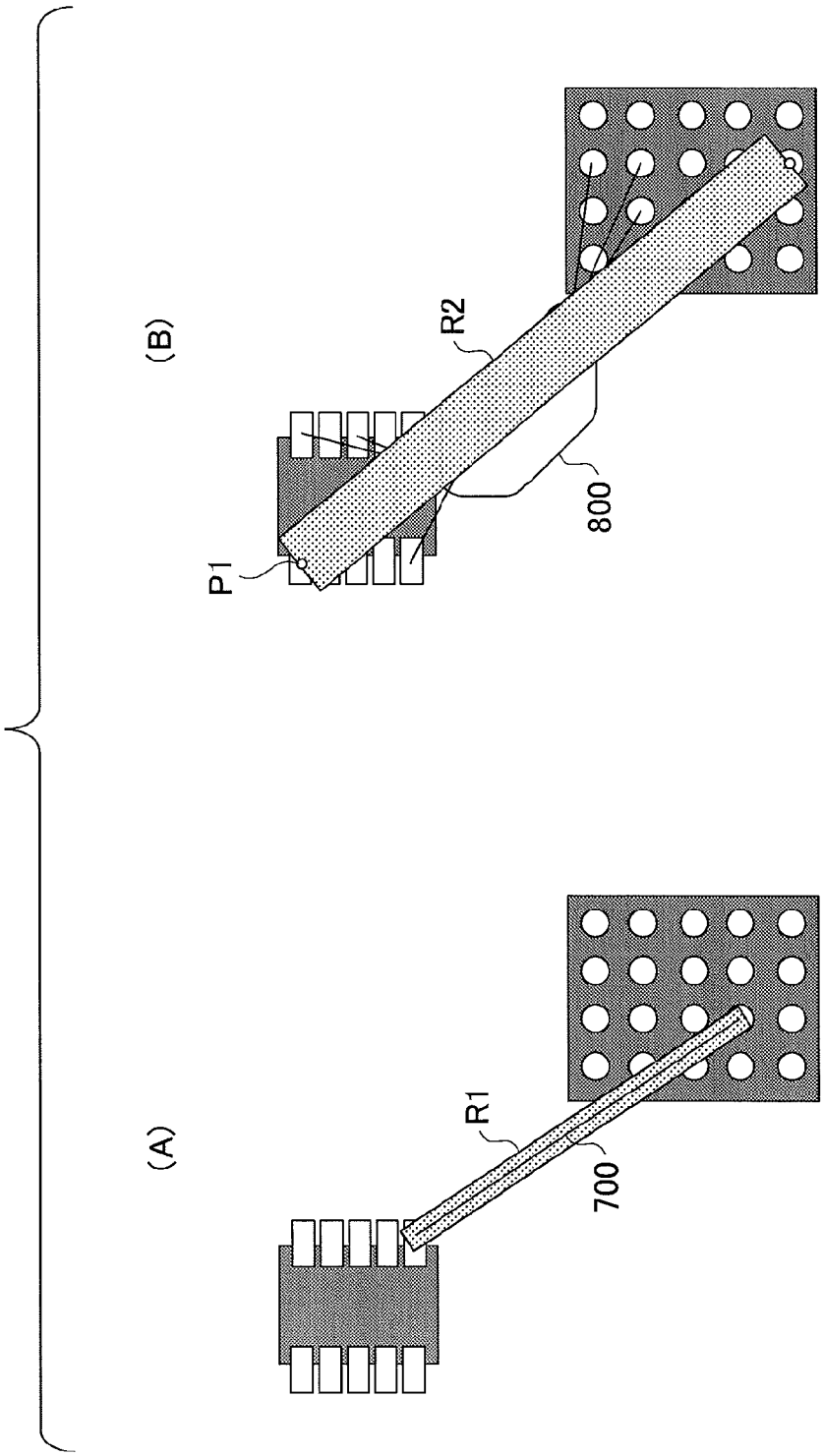
FIG. 43 is a diagram for explaining the wiring requiring area.

In step W1-4, the wiring requiring area calculation process part 73 calculates the wiring requiring area by calculating a value that is obtained by multiplying a farthermost end distance of the relevant net list by a sum of the wiring width and the maximum wiring clearance, and multiplying the calculated value by the number of the wirings, as illustrated in FIG. 43 (B). It is noted that, in FIG. 43 (B), the wiring requiring area R2 related to the bus global route is schematically illustrated, and the farthermost ends of the terminal groups are indicated by reference symbol P1.

In step W1-5, the wiring requiring area calculation process part 73 calculates the wiring requiring area of the ratsnest by multiplying the inter-terminal distance (along straight line) by the wiring width. It is noted that, in FIG. 43 (A), the wiring requiring area R1 related to the ratsnest 700 is schematically illustrated.

In step W1-6, the wiring requiring area calculation process part 73 calculates the wiring requiring area by subtracting a value, that is obtained by multiplying the maximum clearance by 1, from the wiring requiring area calculated in step W1-4.

In step W1-7, the wiring difficulty degree process part 73 determines whether there is a constraint related to the wiring length. If there is a constraint related to the wiring length, the process routine goes to step W1-8, otherwise the process routine goes to step W1-10.

In step W1-8, the wiring difficulty degree process part 73 determines whether there is a necessity to add the area required under the constraint related to the wiring length. If there is a necessity to add the area, the process routine goes to step W1-9, otherwise the process routine goes to step W1-10.

In step W1-9, the wiring difficulty degree process part 73 calculates a maximum area required under the constraint related to the wiring length, and adds the calculated maximum area to the wiring requiring area calculated in step W1-6.

In step W1-10, the wiring difficulty degree process part 73 stores the calculated wiring requiring area in the wiring requiring area storage part 75.

Figure 44:
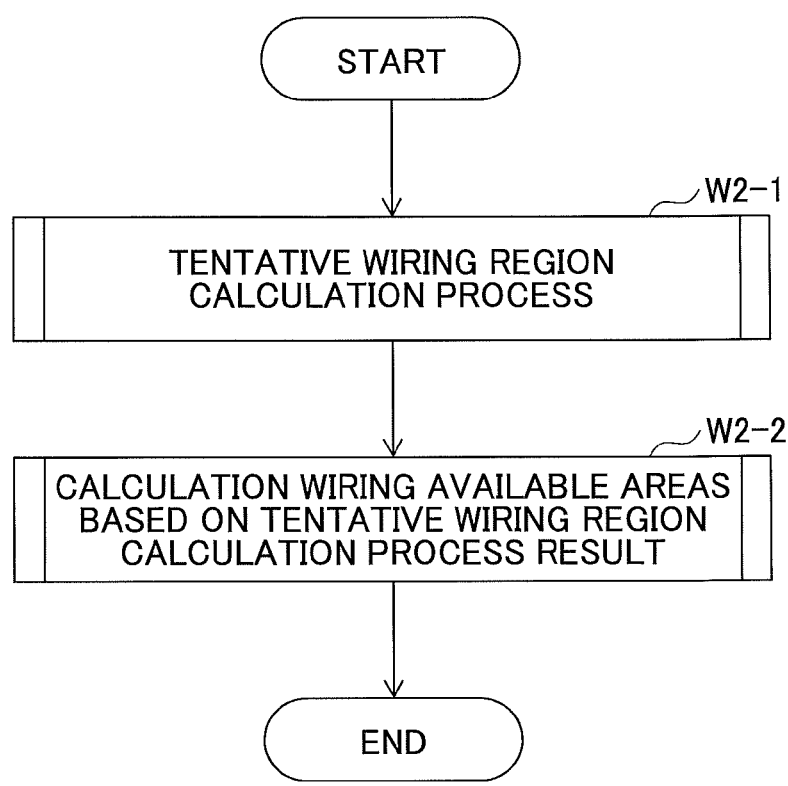
FIG. 44 is a flowchart illustrating an example of a process of step W2 in FIG. 40.

FIG. 44 is a flowchart illustrating an example of the process of step W2 in FIG. 40.

In step W2-1, the wiring available area calculation process part 74 performs the calculation process of a tentative wiring region. This process is described hereinafter.

In step W2-2, the wiring available area calculation process part 74 calculates the wiring available area based on the calculation process result of the tentative wiring region. This process is described hereinafter.

Figure 45:
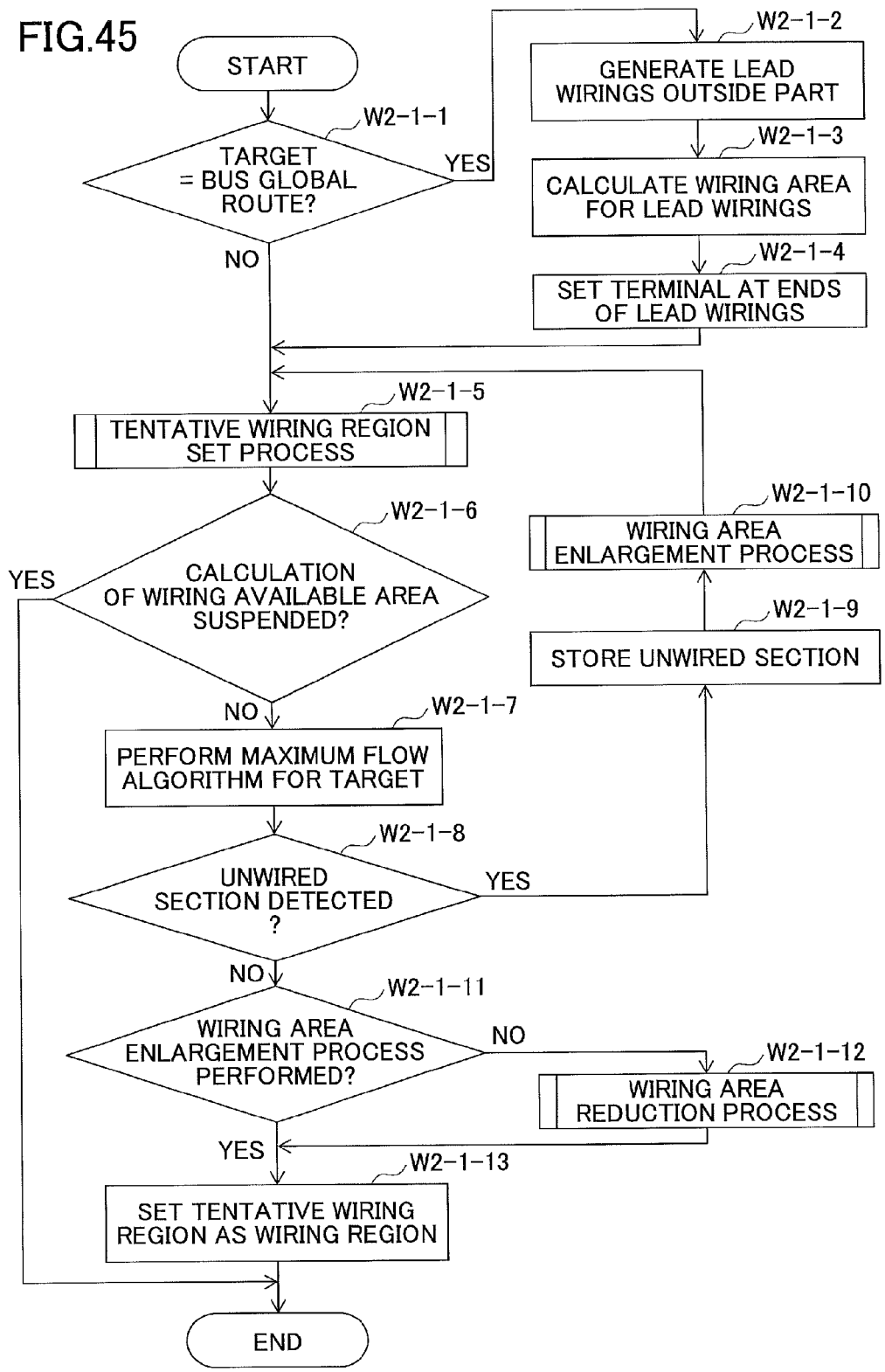
FIG. 45 is a flowchart illustrating an example of a process of step W2-1 in FIG. 44.

FIG. 45 is a flowchart illustrating an example of the process of step W1 in FIG. 44.

In step W2-1-1, the wiring available area calculation process part 74 determines whether the target for which the tentative wiring region is to be calculated is the bus global route. If the target for which the tentative wiring region is to be calculated is the bus global route, the process routine goes to step W2-1-2, otherwise (i.e., if the target is the ratsnest) the process routine goes to step W2-1-5.

Figure 46:
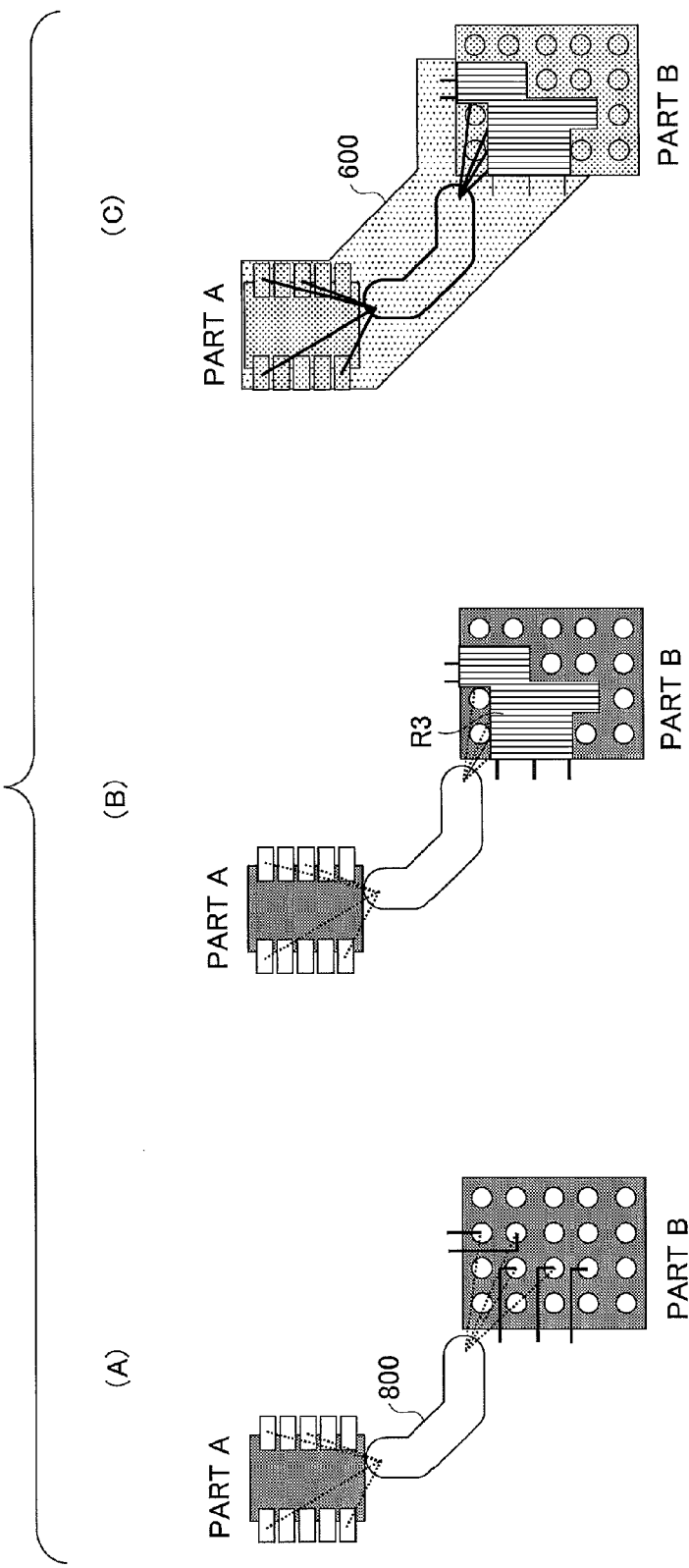
FIG. 46 is a diagram for explaining an example of a way of calculating the wiring available area.

In step W2-1-2, the wiring available area calculation process part 74 generates lead wirings outside the part to generate terminals to be connected. FIG. 46 (A) illustrates a case where the lead wirings have been generated from the part terminals of the part B.

In step W2-1-3, the wiring available area calculation process part 74 calculates a lead wiring area formed when the lead wirings are generated. For example, in the example illustrated in FIG. 46 (B), the wiring available area calculation process part 74 calculates the lead wiring area R3 in the part terminal of the part B that is required to generate the lead wirings after the lead wirings have been generated.

In step W2-1-4, the wiring available area calculation process part 74 regards the ends of the lead wirings as terminals to be connected.

In step W2-1-5, the wiring available area calculation process part 74 performs a tentative wiring region set process. A way of setting the tentative wiring area is arbitrary, and one example is described hereinafter. In the example illustrated in FIG. 46 (C), the tentative wiring area 600 is set.

In step W2-1-6, the wiring available area calculation process part 74 reads data in the wiring available area storage part 76 of the route keeping difficulty degree process part 43 to determine whether the calculation of the wiring available area is suspended. If the calculation of the wiring available area is suspended, the process routine directly ends. On the other hand, if the calculation of the wiring available area is suspended, the process routine goes to step W2-1-7.

In step W2-1-7, the wiring available area calculation process part 74 executes the maximum flow algorithm in the tentative wiring region to determine whether all the wiring designs in the target bus global route can be implemented. The maximum flow algorithm is a process to determine, in terms of space, whether all the wiring designs in the target bus global route can be implemented in the tentative wiring region. Thus, the factors described above, such as a wiring twist, are not considered. It is noted that the same holds true for a case where the target is the ratsnest.

In step W2-1-8, the wiring available area calculation process part 74 determines whether any unwired section is detected. If an unwired section(s) is detected, the process routine goes to step W2-1-9, otherwise the process routine goes to step W2-1-10.

In step W2-1-9, the wiring available area calculation process part 74 stores the unwired section(s) in the unwired section storage part 77 of the route keeping difficulty degree process part 43.

Figure 47:
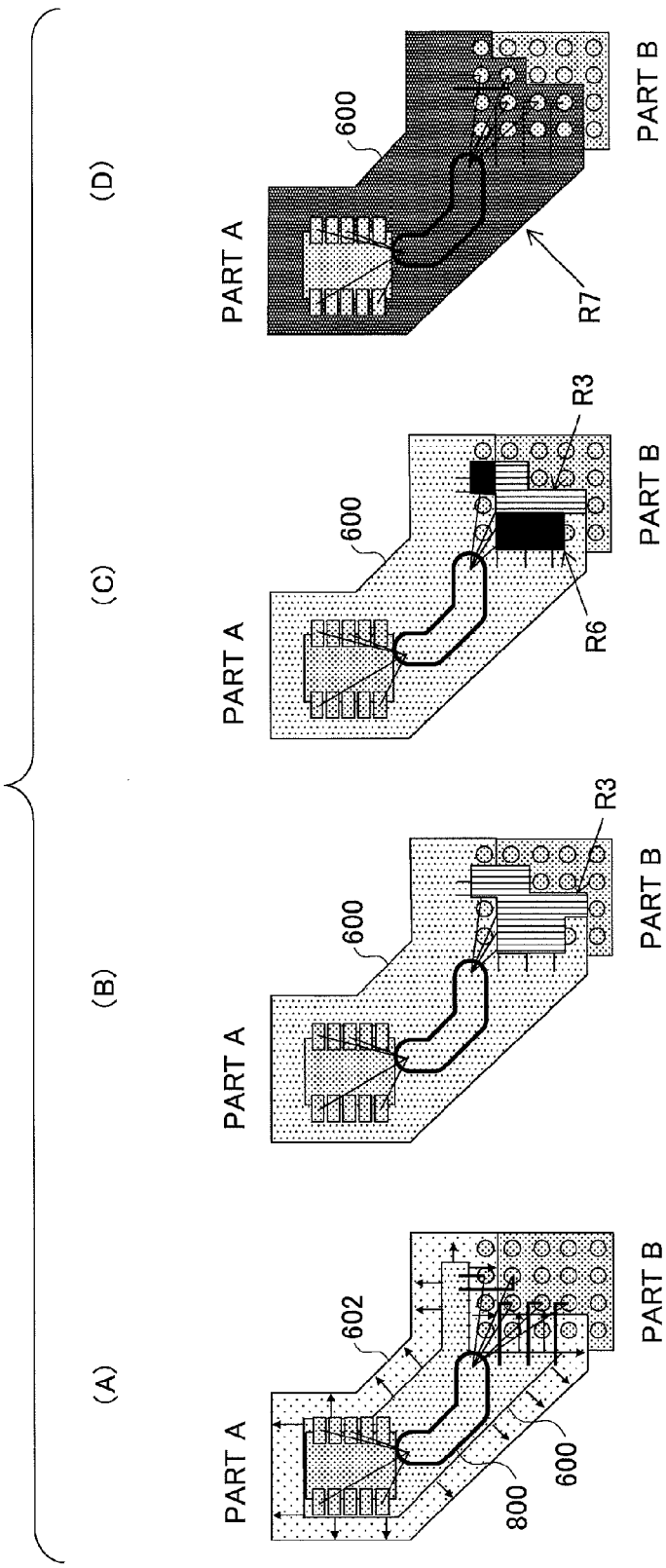
FIG. 47 is a diagram for explaining an example of a way of calculating the wiring available area.

In step W2-1-10, the wiring available area calculation process part 74 performs a wiring area enlargement process. A way of the wiring area enlargement process is arbitrary, and one example is described hereinafter. In FIG. 47 (A), an enlarged region 602 is set. It is noted that, in FIG. 47 (A), arrows schematically illustrate directions of the enlargement. In FIG. 47 (B), a state is illustrated in which the enlargement of the tentative wiring region 600 is completed. It is noted that, the respective processes of steps W2-1-5, W2-1-6, W2-1-7, W2-1-8, W2-1-9 and W2-1-10 may be implemented by the way disclosed in Japanese Laid-open Patent Publication No. 2011-198143 (Patent Document 1), the entire contents of which are hereby incorporated by reference.

In step W2-1-11, the wiring available area calculation process part 74 determines whether the wiring area enlargement process has been performed. If the wiring area enlargement process has been performed, the process routine goes to step W2-1-12, otherwise the process routine goes to step W2-1-13.

In step W2-1-12, the wiring available area calculation process part 74 performs a wiring area reduction process. This process is described hereinafter.

In step W2-1-13, the wiring available area calculation process part 74 determines the tentative wiring region to be a wiring region.

Figure 48:
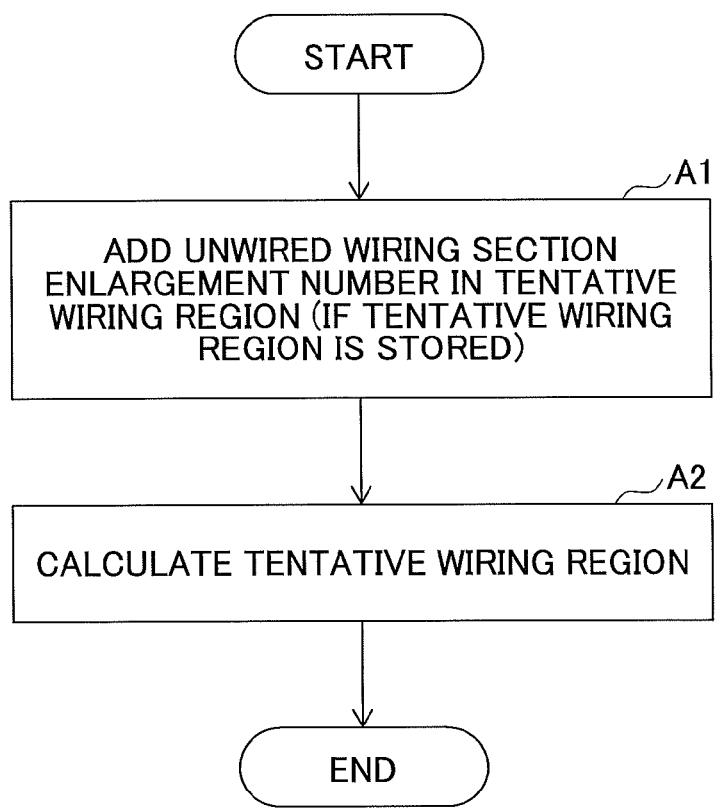
FIG. 48 is a flowchart illustrating an example of a process of step W2-1-5 in FIG. 45.

FIG. 48 is a flowchart illustrating an example of the process of step W2-1-5 in FIG. 45.

In step A1, the wiring available area calculation process part 74 reads an unwired section enlargement wiring number of the wiring difficulty degree included in the ratsnest data 208 or the bus global route data 209 in the CAD data storage part 12. Then, if the unwired section enlargement wiring number is stored, the wiring available area calculation process part 74 increases the unwired section enlargement wiring number related to the tentative wiring region. Thus, if the unwired section enlargement wiring number is stored in step W2-1-10 (step B4), the tentative wiring region determined in next step A2 is enlarged accordingly.

In step A2, the wiring available area calculation process part 74 generates the tentative wiring region based on the route of the bus global route. The wiring available area calculation process part 74 determines the tentative wiring region based on the design information such as a net number, a wiring width, a clearance, a terminal position, etc., of the specified bus global route.

Figure 49:
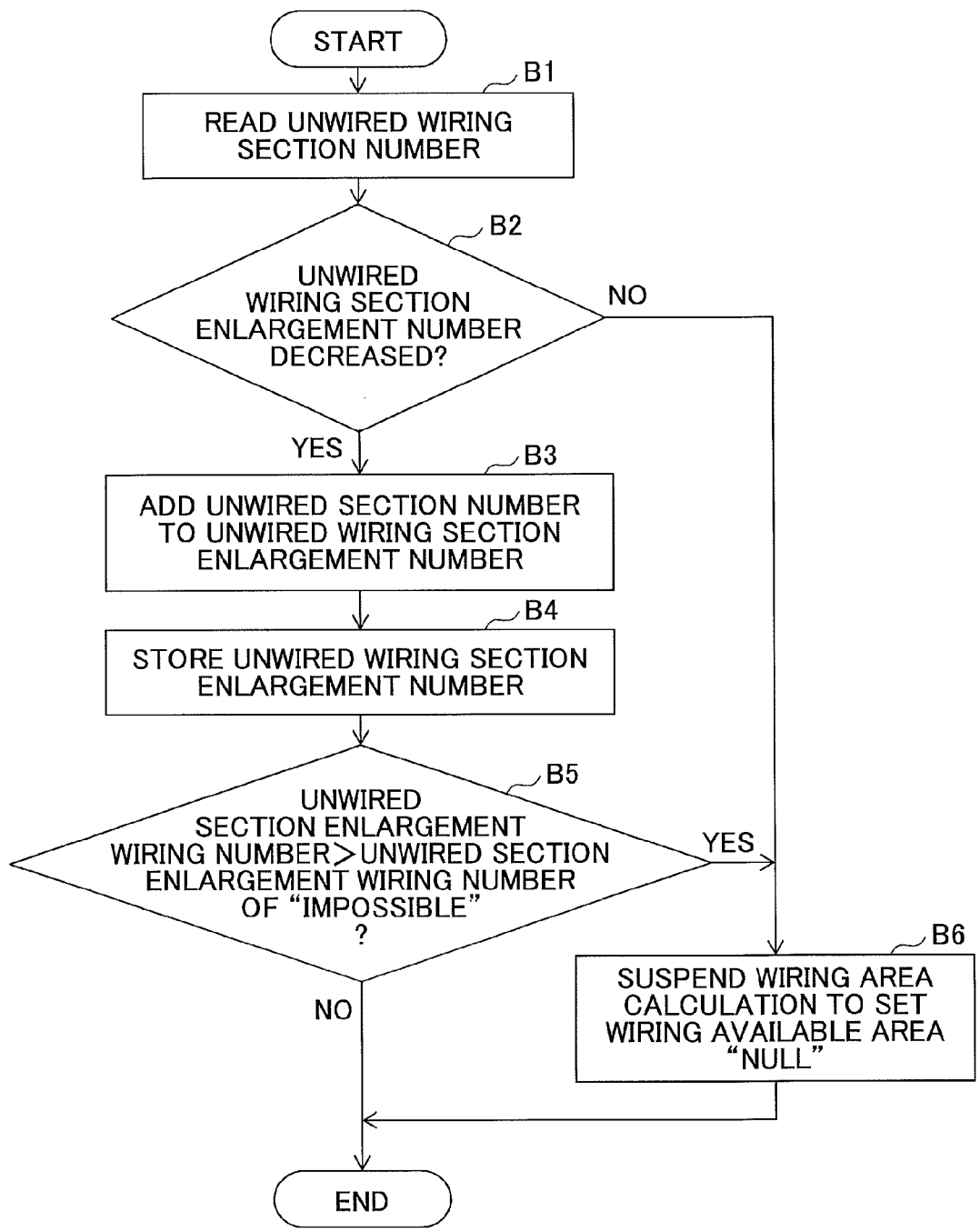
FIG. 49 is a flowchart illustrating an example of a process of step W2-1-10 in FIG. 45.

FIG. 49 is a flowchart illustrating an example of the process of step W2-1-10 in FIG. 45.

In step B1, the wiring available area calculation process part 74 reads the unwired sections from the unwired section storage part 77 of the route keeping difficulty degree process part 43.

In step B2, the wiring available area calculation process part 74 determines whether the number of the read unwired sections is decreased. If the number of the unwired sections is decreased, the process routine goes to step B3, otherwise the process routine goes to step B6.

In step B3, the wiring available area calculation process part 74 adds the number of the unwired sections to the unwired section enlargement wiring number of the wiring difficulty degree.

In step B4, the wiring available area calculation process part 74 stores the value of the unwired section enlargement wiring number of the wiring difficulty degree.

In step B5, the wiring available area calculation process part 74 compares the unwired section enlargement wiring number with the unwired section enlargement wiring number at the which the route keeping difficulty degree is determined to be "impossible". An example of the unwired section enlargement wiring number at the which the route keeping difficulty degree is determined to be "impossible" is as illustrated in FIG. 15. In the example illustrated in FIG. 15, the unwired section enlargement wiring number at the which the route keeping difficulty degree is determined to be "impossible" is "11". The wiring available area calculation process part 74 refers to the difficulty degree level related to the route keeping of the wiring difficulty degree setting data 212 in the CAD data storage part 12 to perform the comparison of the unwired section enlargement wiring numbers.

In step B6, the wiring available area calculation process part 74 suspends the calculation of the wiring available area and sets "NULL" for a value of the wiring available area in the wiring available area storage part 76.

In this way, the wiring available area calculation process part 74 enlarges the tentative wiring region until there is no unwired section of the bus global routes in a loop of step W2-1-9, W2-1-10, W2-1-5, W2-1-6, W2-1-7 and W2-1-8 in FIG. 45. At that time, the wiring available area calculation process part 74 enlarges the region by adding the wiring width and the wiring clearance for the number of the unwired wirings (see FIG. 47 (B)). As a result of this, if the unwired section enlargement wiring number becomes greater than the unwired section enlargement wiring number at the which the route keeping difficulty degree is determined to be "impossible", the calculation of the wiring available area is suspended.

Figure 50:
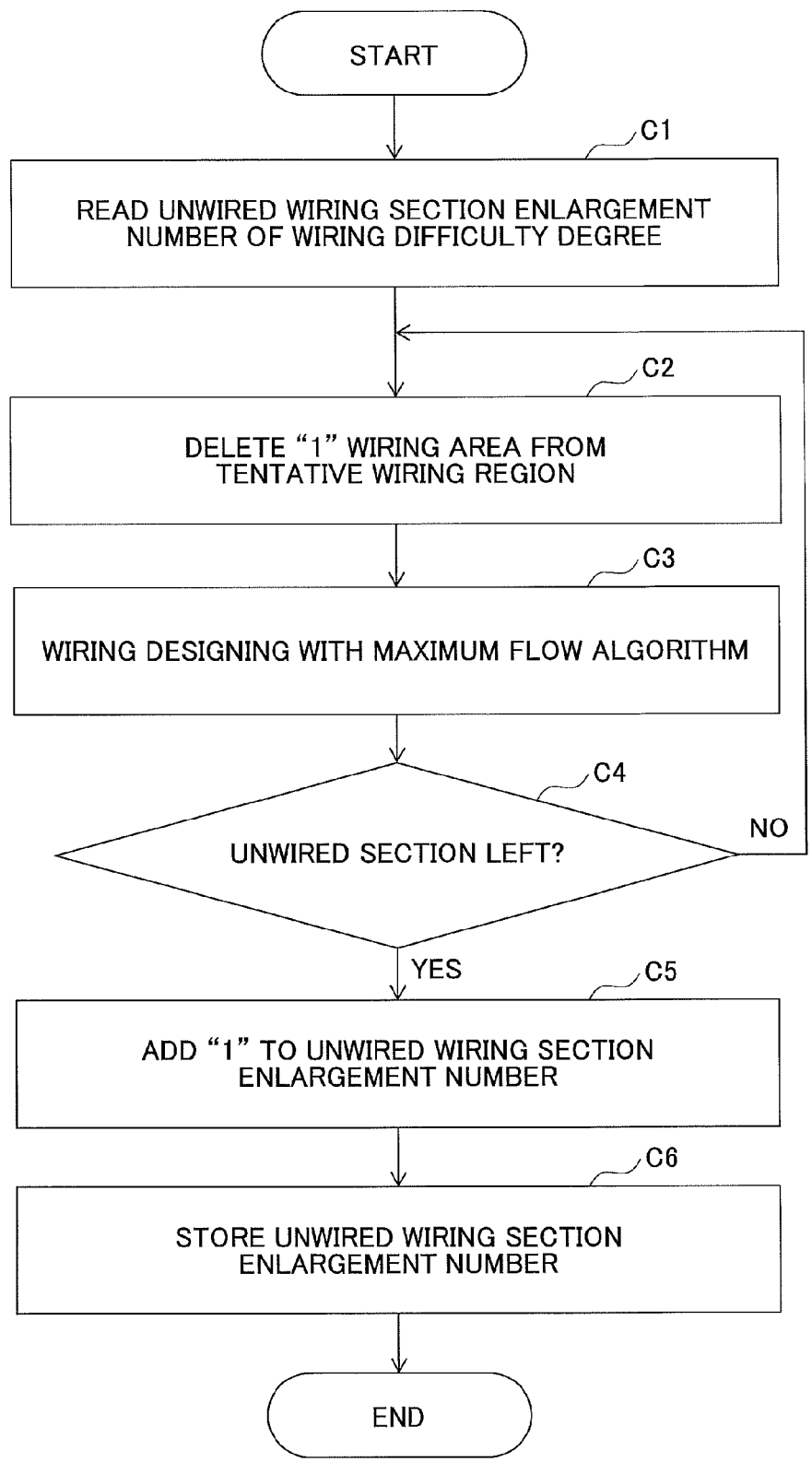
FIG. 50 is a flowchart illustrating an example of a process of step W2-1-12 in FIG. 45.

FIG. 50 is a flowchart illustrating an example of the process of step W2-1-12 in FIG. 45.

In step C1, the wiring available area calculation process part 74 reads the unwired section enlargement number of the difficulty degree in the CAD data storage part 12.

In step C2, the wiring available area calculation process part 74 subtracts "1" from the unwired section enlargement number related to the tentative wiring region.

In step C3, the wiring available area calculation process part 74 performs the wiring designing using the maximum flow algorithm.

In step C4, the wiring available area calculation process part 74 determines whether there is any unwired section. If there is any unwired section, the process routine returns to step C2, otherwise the process routine goes to step C5.

In step C5, the wiring available area calculation process part 74 adds "1" to the insufficient unwired section enlargement number.

In step C6, the wiring available area calculation process part 74 stores the value obtained in step C5 as the unwired section enlargement number of the difficulty degree in the CAD data storage part 12.

Figure 51:
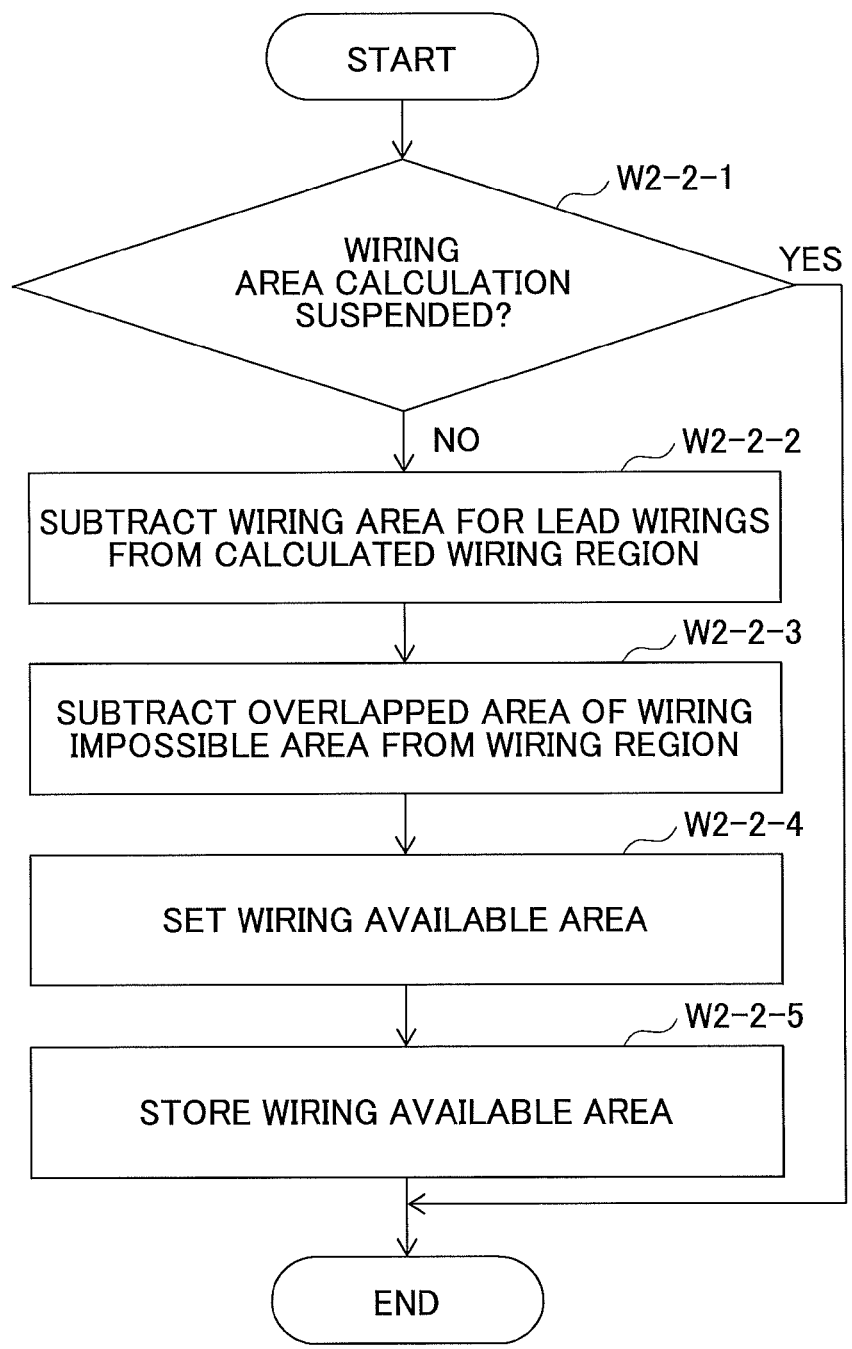
FIG. 51 is a flowchart illustrating an example of a process of step W2-2 in FIG. 44.

FIG. 51 is a flowchart illustrating an example of the process of step W2-2 in FIG. 44.

In step W2-2-1, the wiring available area calculation process part 74 adds the lead wiring area calculated in step W2-1-3 in FIG. 45 to the area of the wiring region obtained in the step W2-1-13 in FIG. 45.

In step W2-2-2, the wiring available area calculation process part 74 subtracts, from the calculation result in step W2-2-1, the overlapped area between the area of the wiring region obtained in the step W2-1-13 in FIG. 45 and the lead wiring area calculated in step W2-1-3 in FIG. 45. For example, in the example illustrated in FIG. 47 (C), the wiring available area calculation process part 74 subtracts the overlapped area R6 between the lead wiring area R3 and the area of the tentative wiring region 600.

In step W2-2-3, the wiring available area calculation process part 74 deletes regions of the wiring region where the wiring is not possible, such as part regions and part terminal regions. For example, in the example illustrated in FIG. 47 (D), the wiring available area calculation process part 74 deletes (subtracts) the regions, such as part regions and part terminal regions where the wiring is not possible.

In step W2-2-4, the wiring available area calculation process part 74 calculates, as the wiring available area (see the wiring available area R7 illustrated in FIG. 47 (D)), the area of the wiring region after the subtraction and the deletion in step W2-2-2 and step W2-2-3.

In step W2-2-5 the wiring available area calculation process part 74 stores, in the wiring available area storage part 76 of the route keeping difficulty degree process part 43, the wiring available area calculated in step W2-2-4.

Figure 52:
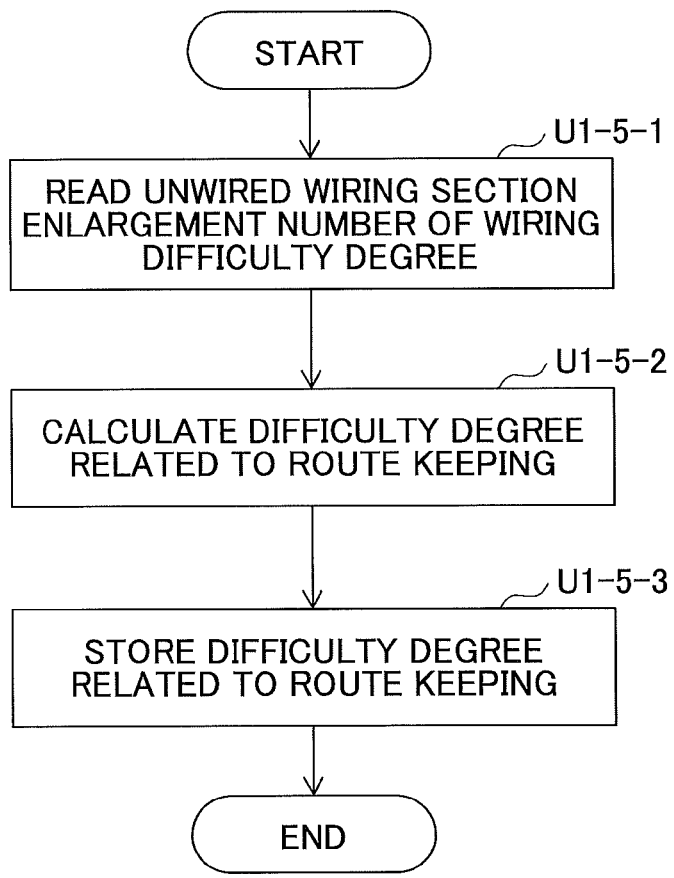
FIG. 52 is a flowchart illustrating an example of a process of step U1-5 in FIG. 37.

FIG. 52 is a flowchart illustrating an example of the process of step U1-5 in FIG. 37.

In step U1-5-1, the route keeping difficulty degree process part 43 reads the unwired section enlargement number of the difficulty degree of the ratsnest data 208 and the bus global route data 209.

In step U1-5-2, the route keeping difficulty degree process part 43 refers to the difficulty degree level related to the route keeping illustrated in FIG. 15 to calculate the difficulty degree level related to the route keeping. In the case of the reference illustrated in FIG. 15, if the unwired section enlargement number is less than 3, the route keeping difficulty degree process part 43 determines the difficulty degree related to the route keeping to be "0". If the unwired section enlargement number is greater than or equal to 3 and less than or equal to 5, the route keeping difficulty degree process part 43 determines the difficulty degree related to the route keeping to be "1". If the unwired section enlargement number is greater than 5 and less than or equal to 10, the route keeping difficulty degree process part 43 determines the difficulty degree related to the route keeping to be "2". If the unwired section enlargement number is greater than 10, the route keeping difficulty degree process part 43 determines the difficulty degree related to the route keeping to be "impossible". It is noted that, in the example, the difficulty degree related to the route keeping is set in four steps; however, it is not limited to the four steps, and thus it may be set in three steps or more than four steps.

In step U1-5-3, the route keeping difficulty degree process part 43 stores the calculated difficulty degree related to the route keeping (the difficulty degree with respect to the ratsnest or the bus global route) in the CAD data storage part 12.

Figure 53:
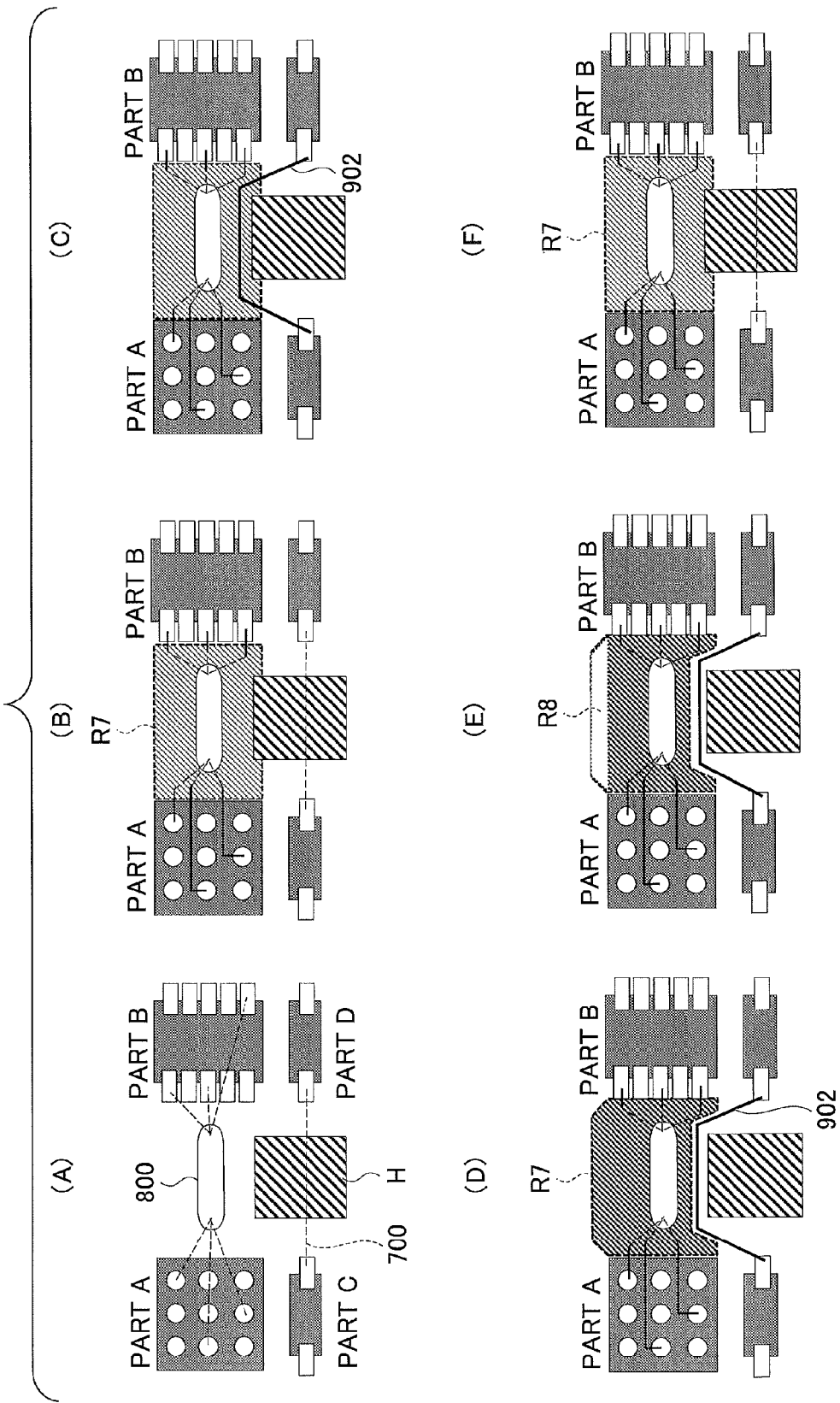
FIG. 53 is a diagram for explaining a way of calculating the difficulty degree related to the route keeping.

FIG. 53 is a diagram for explaining a way of calculating the difficulty degree related to the route keeping.

Here, as illustrated in FIG. 53 (A), such an initial state is assumed, as an example, in which the bus global route 800 is set between the part A and the part B, and the ratsnest 700 is set between the part C and the part D. The wiring prevention region H is provided between the part C and the part D. As illustrated in FIG. 53 (B), the wiring available area R7 is set for the bus global route 800 between the part A and the part B. Here, it is assumed that the designer performs the wiring designing between the part C and the part D, as illustrated in FIG. 53 (C). In this case, as illustrated in FIG. 53 (D), the wiring available area R7 is calculated such that it is enlarged due to the wiring designing between the part C and the part D. In FIG. 53 (E), the enlarged portion is indicated by a reference symbol R8. This is because the region is generated based on the location of the bus global route in calculating the tentative wiring region in step W2-1-5. Here, it is assumed that the designer deletes the wiring design between the part C and the part D, as illustrated in FIG. 53 (F). In this case, the wiring area reduction process in W2-1-12 is performed.

Next, a way of managing the difficulty degree level to calculate the difficulty degree is explained.

Figure 54:
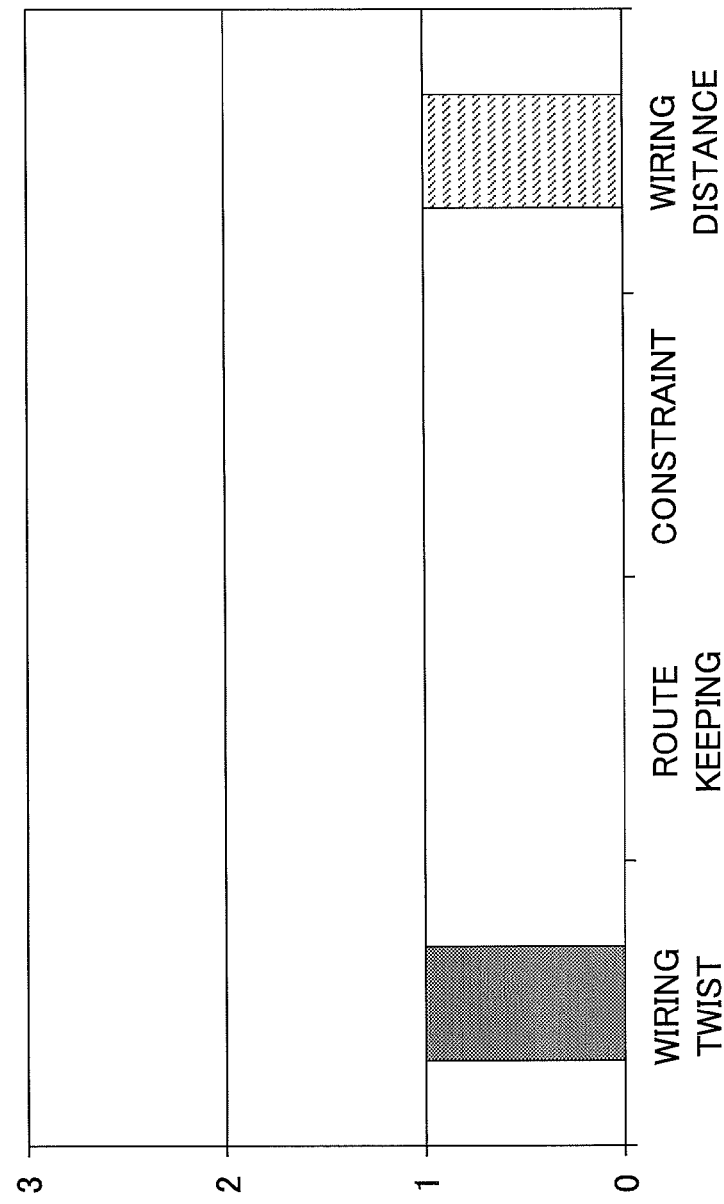
FIG. 54 is a diagram for explaining an example of a way of managing the wiring difficulty degree levels.

FIG. 54 is a diagram for explaining an example of a way of managing the wiring difficulty degree levels. FIG. 54 illustrates a case where the difficulty degree level related to the wiring twist is "1" and the difficulty degree level related to the wiring distance is "1". It is noted that the difficulty degree levels of the respective indexes may be totaled to calculate a total value. It is assumed that the difficulty degree level does not change if it exceeds a certain level. This prevents the total value from being extremely high. An item that the designer puts a premium on can be made selectable. The weight coefficient can be set for the item that the designer puts a premium on such that it is reflected in calculating the difficulty degree.

FIG. 55 is a diagram for explaining an example of a way of managing the wiring difficulty degree levels. In the example illustrated in FIG. 55 (A), the wiring difficulty degrees are managed such that the upper limits thereof are "25" points. FIG. 55 (B) is a diagram in which the points of the respective wiring difficulty degrees are divided on a difficulty degree basis. For example, the difficulty degree level of the wiring distance is set in the three step as illustrated in FIG. 12, and thus the difficulty degree level of the wiring distance is divided into two sections. Whenever the difficulty degree level related to the wiring distance is increased by 1, "12.5" points are added. The wiring difficulty degree process part 14 refers to the wiring difficulty degrees of the ratsnests and the bus global routes in the CAD data storage part 12 to calculate the respective wiring difficulty degrees. In the example illustrated in FIG. 55 (B), with respect to the wiring difficulty degree of a certain bus global route, the difficulty degree related to the wiring distance and the difficulty degree related to the wiring twist are "12.5" points, respectively, and the total is "25" points, as illustrated in FIG. 55 (C).

Figure 56:
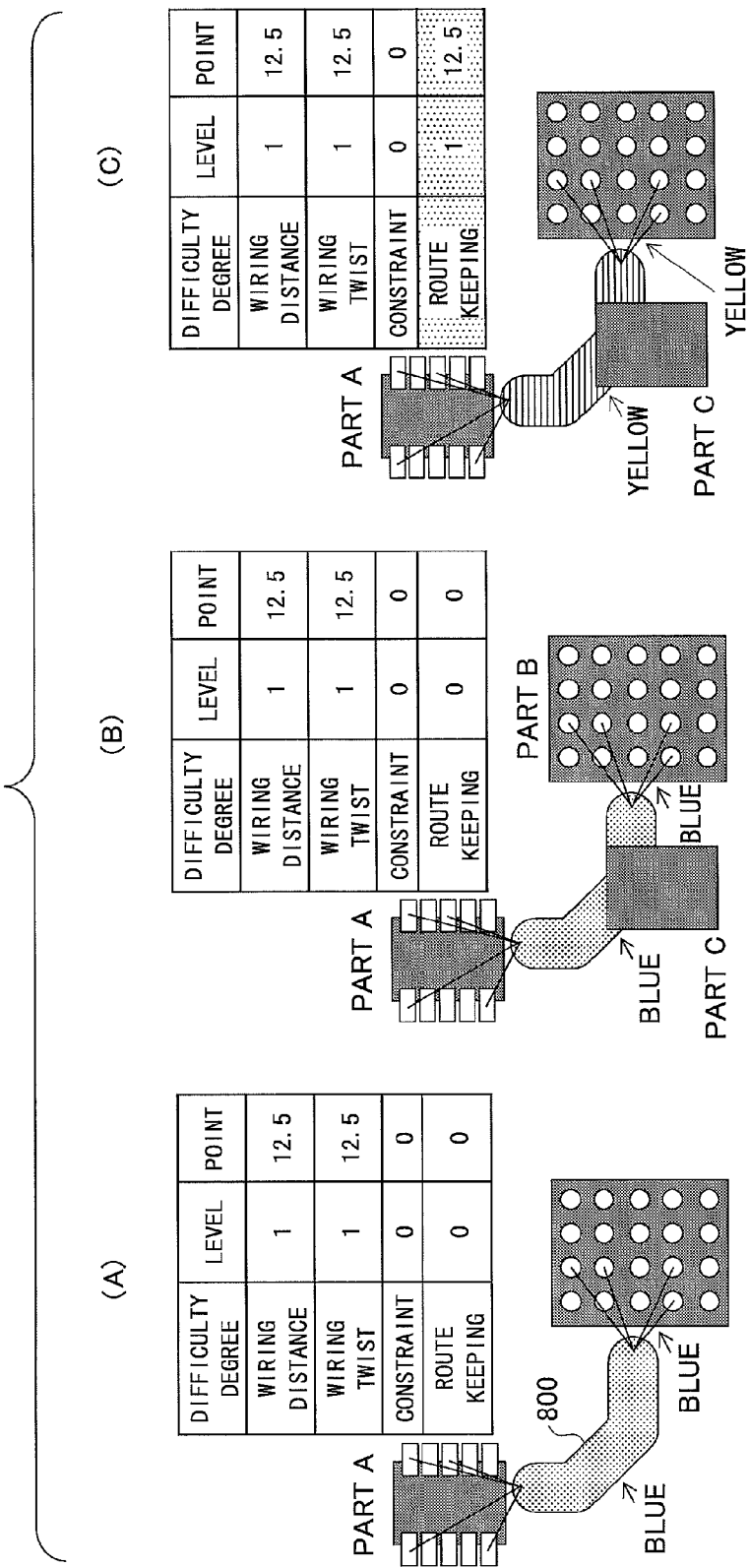
FIG. 56 is a diagram illustrating an example of a way of displaying the total wiring difficulty degree.

FIG. 56 is a diagram illustrating an example of a way of displaying the total wiring difficulty degree. Here, a way of displaying the bus global route with colors according to the total wiring difficulty degree is explained. It is noted that, as illustrated in FIG. 11, the total wiring difficulty degree is set in three steps. In the example illustrated in FIG. 11, the color is blue if the total wiring difficulty degree level is 0 through 30, yellow if the total wiring difficulty degree level is 31 through 70, red if the total wiring difficulty degree level is 71 through 100, and black if the total wiring difficulty degree level is "impossible". In FIG. 56, tables on the right upper side in (A) through (C) are provided for the sake of the explanation, and are not displayed on the actual screen.

In the initial state illustrated in FIG. 56 (A), it is assumed that the difficulty degree level related to the wiring distance is "1", the difficulty degree level related to the wiring twist is "1", the difficulty degree level related to the constraint is "0" and the difficulty degree level related to the route keeping is "0". The total value of the wiring difficulty degree is "25". In this case, the bus global route 800 is displayed with a blue color based on the total wiring difficulty degree level width illustrated in FIG. 11.

In the initial state illustrated in FIG. 56 (A), it is assumed that the designer newly arranges the part C, as illustrated in FIG. 56 (B). In this case, the addition of the part C causes the wiring difficulty degree (changed wiring difficulty degree) to be calculated, as described above. Then, for example, the difficulty degree level related to the route keeping is changed from "0" to "1". When the calculation way of the wiring difficulty degree illustrated in FIG. 55 is applied, the wiring difficulty degree related to the route keeping is increased by "12.5" points, and the total wiring difficulty degree level is changed by "37.5" points. As a result of this, the color of the bus global route 800 is changed, based on the total wiring difficulty degree level width illustrated in FIG. 11, from blue to yellow, as illustrated in FIG. 56 (C). As a result of this, the designer can understand that the addition of the part C affects the wiring difficulty degree when the designer sees the change in the color of the bus global route.

Figure 57:
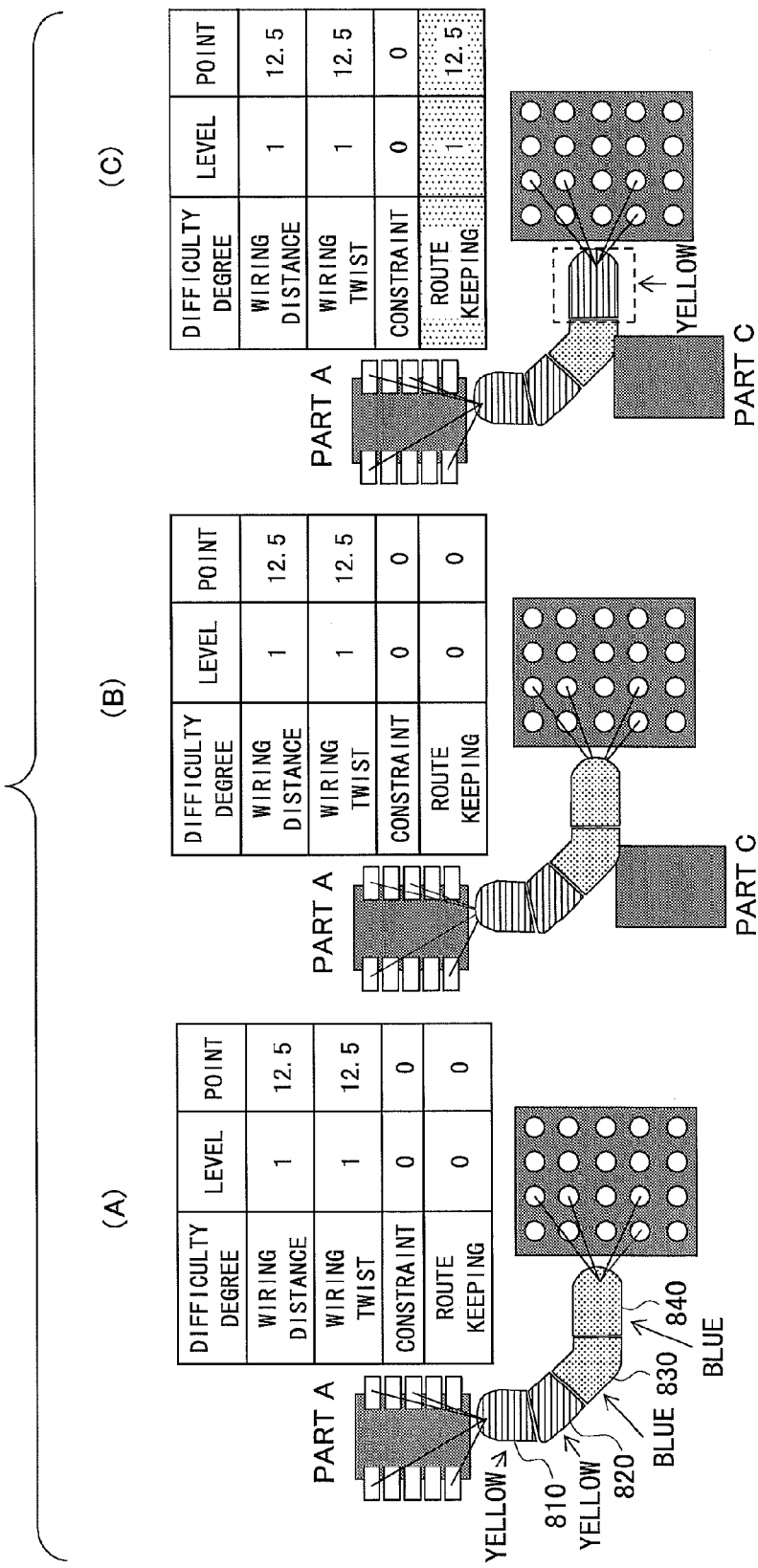
FIG. 57 is a diagram illustrating an example of a way of separately displaying the wiring difficulty degrees.

FIG. 57 is a diagram illustrating an example of a way of separately displaying the wiring difficulty degrees. In FIG. 57, tables on the right upper side in (A) through (C) are provided for the sake of the explanation, and are not displayed on the actual screen. FIG. 58 is a diagram illustrating an example of a separate wiring difficulty degree level width. In the example illustrated in FIG. 58, the separate wiring difficulty degree level is set in three steps, and the color is blue if the wiring difficulty degree level is 0 through 12.4, yellow if the wiring difficulty degree level is 12.5 through 24.9, and red if the wiring difficulty degree level is greater than or equal to 25.

In the initial state illustrated in FIG. 57 (A), it is assumed that the difficulty degree level related to the wiring distance is "1", the difficulty degree level related to the wiring twist is "1", the difficulty degree level related to the constraint is "0" and the difficulty degree level related to the route keeping is "0". The bus global route is divided into four sections 810, 820, 830 and 840. The sections 810, 820, 830 and 840 function as display regions for the difficulty degree level related to the wiring distance, the difficulty degree level related to the wiring twist, the difficulty degree level related to the constraint and the difficulty degree level related to the route keeping, respectively. At that time, the section 810 is displayed with yellow, the section 820 is displayed with yellow, the section 830 is displayed with blue, and the section 840 is displayed with blue based on the separate wiring difficulty degree level width illustrated in FIG. 58.

In the initial state illustrated in FIG. 57 (A), it is assumed that the designer newly arranges the part C, as illustrated in FIG. 57 (B). In this case, the addition of the part C causes the wiring difficulty degree (changed wiring difficulty degree) to be calculated, as described above. Then, for example, the difficulty degree level related to the route keeping is changed from "0" to "1". Accordingly, the color of the section 840 is changed from blue to yellow, as illustrated in FIG. 57 (C). As a result of this, the designer can understand that the addition of the part C affects the wiring difficulty degree when the designer sees the change in the color of the section 840 of the bus global route. In this way, in the case of separately displaying the difficulty degrees, the designer can easily understand which difficulty degree is affected.

Figure 59:
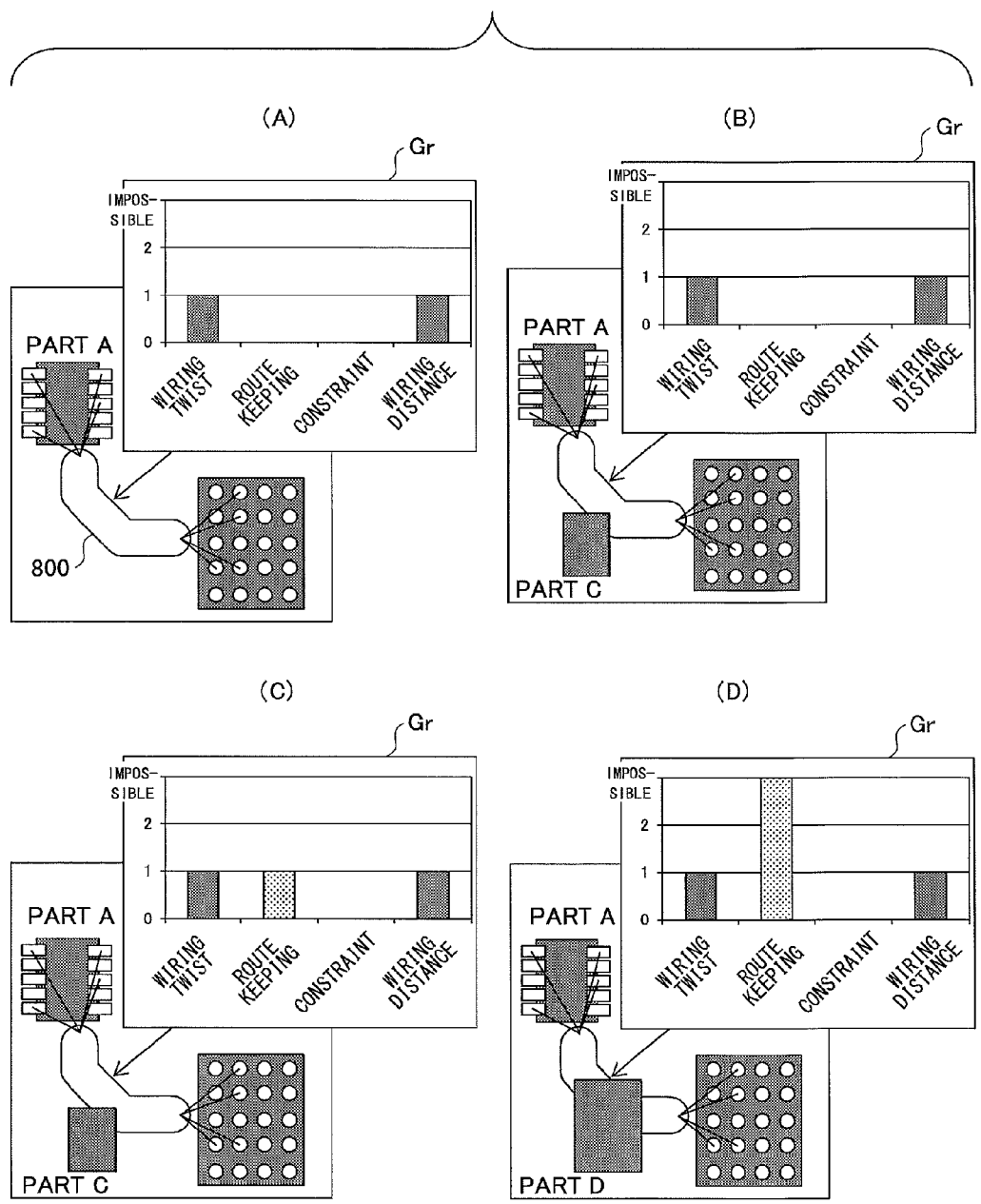
FIG. 59 is a diagram illustrating another example of a way of separately displaying the wiring difficulty degrees.

FIG. 59 is a diagram illustrating another example of a way of separately displaying the wiring difficulty degrees. In the example illustrated in FIG. 59, the wiring difficulty degrees of the bus global route are displayed in graphs.

The respective graphs Gr illustrated in FIG. 59 are not displayed in a normal state, and may be displayed when the target bus global route 800 is selected, for example. The graphs Gr may be displayed in a markup balloon form, as schematically illustrated in FIG. 59, or may be displayed by transition of the display. The graphs Gr separately display the difficulty degree levels of the respective indexes, as illustrated in FIG. 59.

In the initial state illustrated in FIG. 59 (A), it is assumed that the difficulty degree level related to the wiring distance is "1", the difficulty degree level related to the wiring twist is "1", the difficulty degree level related to the constraint is "0" and the difficulty degree level related to the route keeping is "0". In this case, as illustrated in FIG. 59 (A), a bar display of the difficulty degree level related to the wiring distance and a bar display of the difficulty degree level related to the wiring twist are displayed with a height "1".

In the initial state illustrated in FIG. 59 (A), it is assumed that the designer newly arranges the part C, as illustrated in FIG. 59 (B). In this case, the addition of the part C causes the wiring difficulty degree (changed wiring difficulty degree) to be calculated, as described above. Then, for example, the difficulty degree level related to the route keeping is changed from "0" to "1". Then, a bar display of the difficulty degree level related to the route keeping is changed from the height corresponding to the level "0" to the height corresponding to the level "1", as illustrated in FIG. 59 (C). As a result of this, the designer can understand that the addition of the part C affects the wiring difficulty degree related to the route keeping when the designer sees the change in the height of the bar display of the difficulty degree level related to the route keeping. In this way, in the case of separately displaying the difficulty degrees, the designer can easily understand which difficulty degree is affected. It is noted, if the difficulty degree related to the route keeping becomes "impossible", a bar display of the difficulty degree level related to the route keeping is changed from the height corresponding to the level "0" to the height corresponding to the level "impossible", as illustrated in FIG. 59 (D).

It is noted that ways of displaying the wiring difficulty degree are not limited to the examples described above. For example, such a way of featuring the ratsnest and the bus global route with a flashing or a dotted line may be used.

Figure 60:
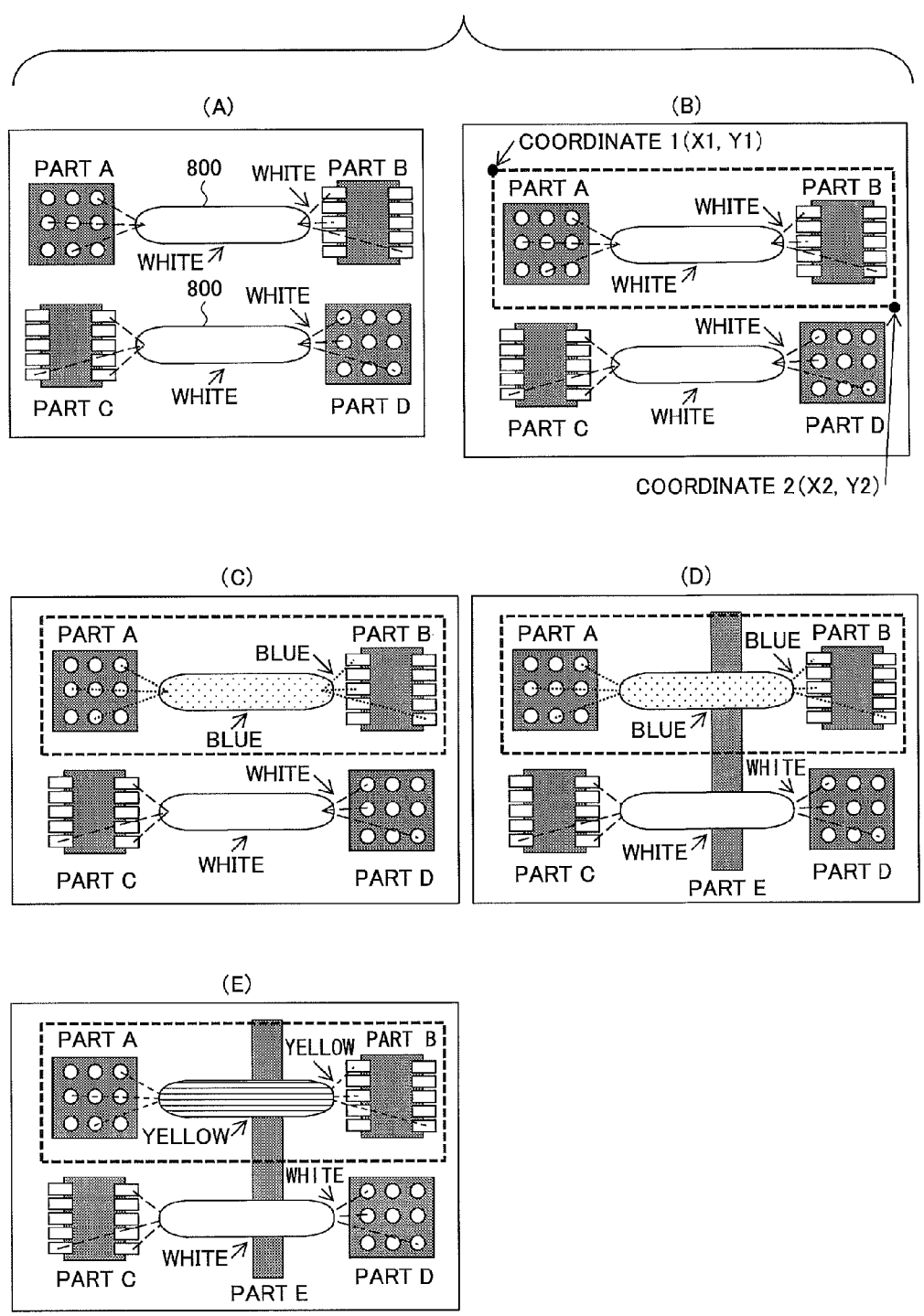
FIG. 60 is a diagram for explaining an example of a way of instructing a calculation region for the wiring difficulty degrees.

Next, a way of instructing the calculation region for the wiring difficulty degree is described. FIG. 60 is a diagram for explaining an example of a way of instructing the calculation region for the wiring difficulty degrees. It is noted that the instruction of the calculation region may be performed prior to the process illustrated in FIG. 10 (see step S1-1).

FIG. 60 (A) illustrates the initial state. Here, an example is assumed in which the wiring designing between the part A and the part B is performed, and the wiring designing between the part C and the part D is performed. At first, the designer sets the bus global routes 800 between the part A and the part B and between the part C and the part D. At that time, the wiring difficulty degree is not set yet, and thus the bus global routes are displayed with a white color, as described above.

FIG. 60 (B) illustrates an example in which the calculation region for the wiring difficulty degree is instructed. In the example illustrated in FIG. 60 (B), the designer instructs a region indicated by a dotted line, which includes the bus global routes 800 between the part A and the part B and between the part C and the part D, as the wiring difficulty degree calculation region. The instruction of the wiring difficulty degree calculation region may be implemented by the designer via an input device 103 using a device such as a mouse, etc. Such an instruction causes a left upper coordinate 1 and a right lower coordinate 2 of the wiring difficulty degree calculation region illustrated in FIG. 60 (B) to be stored in the wiring difficulty degree setting data 212 in the CAD data storage part 12. In this case, it is determined whether there is the instruction to calculate the wiring difficulty degree in step S1-1. Then, the calculation set process of the wiring difficulty degree in step S1-2 is performed. In this example, the calculation region for the wiring difficulty degree is instructed. Thus, it is determined that there is the instruction with respect to the calculation region for the wiring difficulty degree in step S1-2-1. In step S1-2-2, the wiring difficulty degree process part 14 refers to the calculation area (the coordinate 1 and the coordinate 2) for the wiring difficulty degree of the wiring difficulty degree setting data 212 in the CAD data storage part 12 to obtain the calculation area for the wiring difficulty degree. In step S1-2-3, the wiring difficulty degree process part 14 refers to the obtained calculation area for the wiring difficulty degree, the coordinate 1 and the coordinate 2 of the ratsnest, and the bus global route coordinate group (coordinate 1, coordinate 2, . . . coordinate N) in the CAD data storage part 12 to determine the ratsnests and the bus global route included in the wiring difficulty degree calculation region. In step S1-2-4, the wiring difficulty degree process part 14 stores, in the setting data list of the wiring difficulty degree, the targets of the ratsnest and the bus global route included in the wiring difficulty degree calculation area. In this example, the wiring difficulty degree of the bus global route 800 between the part A and the part B is calculated. The wiring difficulty degree of the bus global route 800 set between the part A and the part B is calculated, and the color of the display of the bus global route 800 is changed from white to blue, in this example (FIG. 60 (C)). On the other hand, it is determined that the bus global route 800 set between the part C and the part D is not included in the wiring difficulty degree calculation region, and thus the wiring difficulty degree is not changed such that the color of the bus global route remains white.

In the state illustrated in FIG. 60 (C), it is assumed that it becomes necessary to arrange the part E between the part A and the part B and between the part C and the part D, and thus the designer arrange the part E, as illustrated in FIG. 60 (D). This change in the layout design ("YES" in step S2) causes the wiring difficulty degree to be calculated in step S1. The wiring difficulty degree process part 14 calculates the wiring difficulty degrees of the ratsnest and the bus global route included in the obtained wiring difficulty degree calculation region. In this example, the wiring difficulty degree of the bus global route 800 between the part A and the part B is calculated. As a result of this, in the example, the wiring difficulty degree is changed due to the arrangement design of the part E. Thus, the color of the bus global route between the part A and the part B is changed from blue to yellow, as illustrated in FIG. 60 (E), for example. As a result of this, the designer understands that the arrangement design of the part E affects the bus global route between the part A and the part B. On the other hand, it is determined that the bus global route set between the part C and the part D is not included in the wiring difficulty degree calculation region, and thus the wiring difficulty degree is not changed such that the color of the bus global route remains white. If the calculation region for the wiring difficulty degree is instructed, the layout designing is performed while the wiring difficulty degree is calculated as described above.

Figure 61:
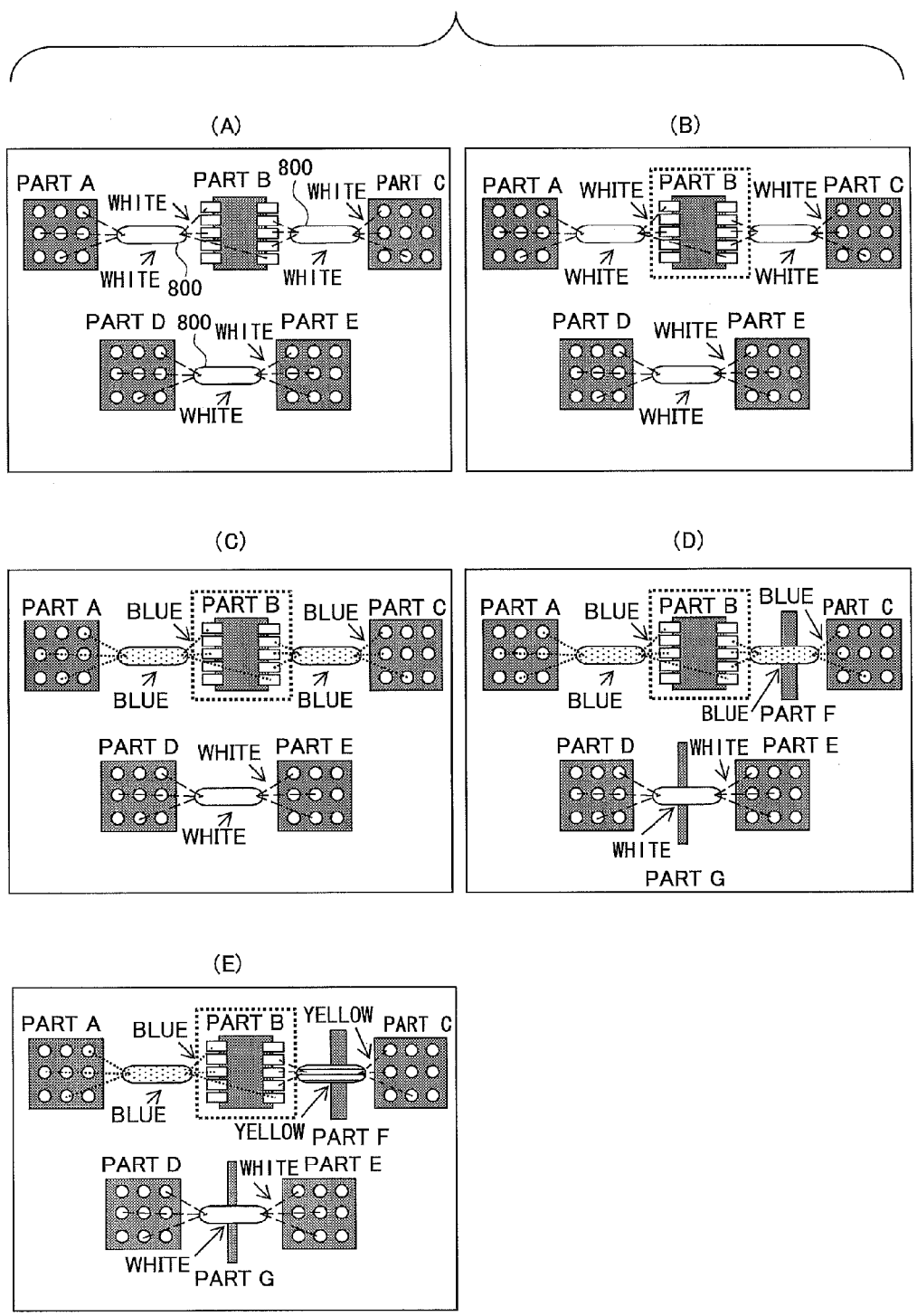
FIG. 61 is a diagram for explaining an example of a way of instructing a calculation target of the wiring difficulty degrees.

FIG. 61 is a diagram for explaining an example of a way of instructing the calculation target of the wiring difficulty degrees.

FIG. 61 (A) illustrates the initial state. Here, an example is assumed in which the wiring designing between the part A and the part B is performed, the wiring designing between the part C and the part D is performed, and the wiring designing between the part D and the part E is performed. The designer sets the bus global routes 800 between the part A and the part B, between the part C and the part D, and between the part D and the part E, respectively.

FIG. 61 (B) illustrates an example in which the calculation target for the wiring difficulty degree is instructed. In the example illustrated in FIG. 61 (B), the part B indicated by the dotted line is instructed by the designer as the calculation target for the wiring difficulty degree. The instruction of the wiring difficulty degree calculation target may be implemented by the designer via an input device 103 using a device such as a mouse, etc. The calculation target is instructed by the ratsnest name, the bus global route name or the part name. Such an instruction causes the part name, which is instructed by the designer as the calculation target for the wiring difficulty degree, to be obtained and stored in the wiring difficulty degree setting data 212 in the CAD data storage part 12. In this case, it is determined whether there is the instruction to calculate the wiring difficulty degree in step S1-1. Then, the calculation set process of the wiring difficulty degree in step S1-2 is performed. In step S1-2-1, it is determined that there is no instruction to specify the target region for the wiring difficulty degree. In this example, the calculation target for the wiring difficulty degree is specified, the target ratsnest and bus global route are stored in the setting data list of the wiring difficulty degree in step S1-2-4. In this example, the wiring difficulty degree of the bus global route between the part A and the part B and the wiring difficulty degree of the bus global route between the part B and the part C are calculated. The wiring difficulty degrees of the bus global route set between the part A and the part B and the wiring difficulty degrees of the bus global route set between the part B and the part C are calculated, and the colors of the bus global routes are changed from white to blue in this example (FIG. 61 (C)). On the other hand, it is determined that the bus global route 800 set between the part D and the part E is not included in the wiring difficulty degree calculation target, and thus the wiring difficulty degree is not changed such that the color of the bus global route remains white.

In the state illustrated in FIG. 61 (C), it is assumed that the designer arranges the part F between the part B and the part C, and arranges the part G between the part D and the part E, as illustrated in FIG. 61 (D). This change in the layout design ("YES" in step S2) causes the wiring difficulty degree to be automatically calculated in step S1. The wiring difficulty degree process part 14 refers to the setting data list of the wiring difficulty degree with respect to the target ratsnest and the bus global route to calculate the wiring difficulty degrees. In this example, the wiring difficulty degree of the bus global route between the part A and the part B and the wiring difficulty degree of the bus global route between the part B and the part C are calculated. The arrangement designing of the part F causes the wiring difficulty degree of the bus global route set between the part B and the part C to be calculated, and the wiring difficulty degree is changed. Thus, the color of the bus global route between the part B and the part C is changed from blue to yellow, as illustrated in FIG. 61 (E), for example. As a result of this, the designer understands that the arrangement design of the part F affects the bus global route between the part B and the part C. On the other hand, it is determined that the bus global route 800 set between the part D and the part E is not included in the wiring difficulty degree calculation target, and thus the wiring difficulty degree is not changed such that the color of the bus global route remains white. If the calculation target for the wiring difficulty degree is instructed, the layout designing is performed while the wiring difficulty degree is calculated as described above.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention. Further, all or part of the components of the embodiments described above can be combined.

For example, according to the embodiments, the four indexes (the route keeping, the wiring twist, the constraint and the wiring distance) are used to calculate the wiring difficulty degrees; however, the calculation related to any one of or any two of the four indexes may be omitted. Further, another new index other than the four indexes (the route keeping, the wiring twist, the constraint and the wiring distance) may be introduced.

What is claimed is:

1. A non-transitory computer-readable recording medium having stored therein a program for causing a computer to execute a process, the process comprising:

calculating and outputting, on a display, difficulty degrees on an index basis when a change instruction to change an arrangement of a first target part on a substrate in a design diagram is received, the difficulty degrees being related to a wiring between first parts on the substrate in the design diagram after the change according to the change instruction, the first parts being other than the first target part; and calculating and outputting, on a display, difficulty degrees on an index basis when the change instruction to change a wiring between second target parts on the substrate in the design diagram is received, the difficulty degrees being related to a wiring between second parts on the substrate in the design diagram after the change according to the change instruction, the wiring between the second parts being other than the wiring between the second target parts, the wiring between the first or second parts includes a bus global route that collectively includes a plurality of wirings connecting between terminals of two of the parts, the difficulty degrees on an index basis include a second difficulty degree that represents a difficulty degree in a case of implementing the wirings related to the bus global route, the second difficulty degree is calculated based on a number of intersections between the wirings, the number being counted in a state in which respective terminals of the parts are arranged in a predetermined order and in straight lines, and the second difficulty degree is calculated based on a relationship between the number of intersections and a number of changes in an arrangement order required to eliminate the intersections.

2. The non-transitory computer-readable recording medium of claim 1, wherein the difficulty degrees on an index basis include a first difficulty degree that represents, with respect to the wiring between the first or second parts, a difficulty degree in a case of performing a wiring design that keeps a route before a reception of the change instruction.

3. The non-transitory computer-readable recording medium of claim 1, wherein the difficulty degrees on an index basis include a third difficulty degree that represents, with respect to the wiring between the first or second parts, a difficulty degree according to a wiring distance between terminals of two of the parts.

4. The non-transitory computer-readable recording medium of claim 1, wherein the difficulty degrees on an index basis include a fourth difficulty degree that represents, with respect to the wiring between the first or second parts, a difficulty degree in a case of performing a wiring design that meets a constraint.

5. The non-transitory computer-readable recording medium of claim 2, wherein the first difficulty degree is calculated based on a manner of an enlargement of a tentative wiring region to be required in the case of performing the wiring design that keeps the route before the reception of the change instruction.

6. The non-transitory computer-readable recording medium of claim 1, wherein the process further comprises calculating, when a change instruction to change a setting related to a way of calculating or displaying the difficulty degrees is received, the difficulty degrees according to the setting after the change according to the change instruction.

7. The non-transitory computer-readable recording medium of claim 1, wherein outputting the difficulty degrees includes outputting the calculated difficulty degrees associated with displays of the corresponding wiring between the first or second parts.

8. The non-transitory computer-readable recording medium of claim 1, wherein outputting the difficulty degrees includes outputting the calculated difficulty degrees with different colors according to the calculated difficulty degrees.

9. The non-transitory computer-readable recording medium of claim 7, wherein the difficulty degrees on an index basis include
a first difficulty degree that represents, with respect to the wiring between first or second the parts, a difficulty degree in a case of performing a wiring design that keeps a route before a reception of the change instruction;
a second difficulty degree that represents, with respect to a bus global route that collectively includes a plurality of wirings connecting between terminals of two of the parts, a difficulty degree in a case of implementing the wirings related to the bus global route;
a third difficulty degree that represents, with respect to the wiring between the first or second parts, a difficulty degree according to a wiring distance between terminals of two of the parts; and
a fourth difficulty degree that represents, with respect to the wiring between first or second the parts, a difficulty degree in a case of performing a wiring design that meets a constraint, and wherein
outputting the calculated difficulty degrees includes separately outputting the first difficulty degree, the second difficulty degree, the third difficulty degree and the fourth difficulty degree, or outputting the first difficulty degree, the second difficulty degree, the third difficulty degree and the fourth difficulty degree in a combined manner.

10. The non-transitory computer-readable recording medium of claim 1, wherein the difficulty degree includes information that represents whether the wiring is possible or not.

11. The non-transitory computer-readable recording medium of claim 1, wherein the wiring between the first or second parts includes the wiring between the first or second parts within a specified region or the wiring between the specified parts that are the first or second parts.

12. A method of supporting a design, the method comprising:
using a processor to calculate and output, on a display, difficulty degrees on an index basis when a change instruction to change an arrangement of a first target part on a substrate in a design diagram is received, the difficulty degrees being related to a wiring between first parts on the substrate in the design diagram after the change according to the change instruction, the first parts being other than the first target part; and
using the processor to calculate and output, on a display, difficulty degrees on an index basis when change instruction to change a wiring between second target parts on the substrate in the design diagram is received, the difficulty degrees being related to a wiring between second parts on the substrate in the design diagram after the change according to the change instruction, the wiring between the second parts being other than the wiring between the second target parts, wherein
the wiring between the first or second parts includes a bus global route that collectively includes a plurality of wirings connecting between terminals of two of the parts,
the difficulty degrees on an index basis include a second difficulty degree that represents a difficulty degree in a case of implementing the wirings related to the bus global route,
the second difficulty degree is calculated based on a number of intersections between the wirings, the number being counted in a state in which respective terminals of the parts are arranged in a predetermined order and in straight lines, and
the second difficulty degree is calculated based on a relationship between the number of intersections and a number of changes in an arrangement order required to eliminate the intersections.

13. A design support apparatus, comprising a processor that executes a process, the process comprising:
calculating and outputting, on a display, difficulty degrees on an index basis when a change instruction to change an arrangement of a first target part on a substrate in a design diagram is received, the difficulty degrees being related to a wiring between first parts on the substrate in the design diagram after the change according to the change instruction, the first parts being other than the first target part; and
calculating and outputting, on a display, difficulty degrees on an index basis when a change instruction to change a wiring between second target parts on the substrate in the design diagram is received, the difficulty degrees being related to a wiring between second parts on the substrate in the design diagram after the change according to the change instruction, the wiring between the second parts being other than the wiring between the second target parts, wherein
the wiring between the first or second parts includes a bus global route that collectively includes a plurality of wirings connecting between terminals of two of the parts,
the difficulty degrees on an index basis include a second difficulty degree that represents a difficulty degree in a case of implementing the wirings related to the bus global route,
the second difficulty degree is calculated based on a number of intersections between the wirings, the number being counted in a state in which respective terminals of the parts are arranged in a predetermined order and in straight lines, and
the second difficulty degree is calculated based on a relationship between the number of intersections and a number of changes in an arrangement order required to eliminate the intersections.

* * * * *